United States Patent
Rana et al.

(10) Patent No.: US 9,214,585 B2
(45) Date of Patent: Dec. 15, 2015

(54) ANNEALING FOR DAMAGE FREE LASER PROCESSING FOR HIGH EFFICIENCY SOLAR CELLS

(71) Applicant: Solexel, Inc., Milpitas, CA (US)

(72) Inventors: Virendra V. Rana, Milpitas, CA (US); Mehrdad M. Moslehi, Milpitas, CA (US); Pawan Kapur, Milpitas, CA (US); Benjamin Rattle, Milpitas, CA (US); Heather Deshazer, Milpitas, CA (US); Solene Coutant, Milpitas, CA (US)

(73) Assignee: Solexel, Inc., Milpitas, CA (US)

( * ) Notice: Subject to any disclaimer, the term of this patent is extended or adjusted under 35 U.S.C. 154(b) by 0 days.

(21) Appl. No.: 14/265,331

(22) Filed: Apr. 29, 2014

(65) Prior Publication Data

US 2015/0056742 A1 Feb. 26, 2015

Related U.S. Application Data

(60) Provisional application No. 61/816,830, filed on Apr. 29, 2013, provisional application No. 61/827,252, filed on May 24, 2013, provisional application No. 61/859,166, filed on Jul. 26, 2013.

(51) Int. Cl.
| | |
|---|---|
| *H01L 31/18* | (2006.01) |
| *H01L 31/0445* | (2014.01) |
| *H01L 31/049* | (2014.01) |
| *H01L 33/00* | (2010.01) |
| *H01L 31/0216* | (2014.01) |
| *H01L 31/0224* | (2006.01) |
| *H01L 31/0236* | (2006.01) |
| *H01L 31/0352* | (2006.01) |
| *H01L 31/068* | (2012.01) |
| *H01L 31/056* | (2014.01) |

(52) U.S. Cl.
CPC ...... *H01L 31/0445* (2014.12); *H01L 31/02167* (2013.01); *H01L 31/02363* (2013.01); *H01L 31/022441* (2013.01); *H01L 31/035281* (2013.01); *H01L 31/049* (2014.12); *H01L 31/056* (2014.12); *H01L 31/068* (2013.01); *H01L 31/0682* (2013.01); *H01L 31/18* (2013.01); *H01L 31/1804* (2013.01); *H01L 31/186* (2013.01); *H01L 31/1864* (2013.01); *H01L 31/1868* (2013.01); *H01L 31/1896* (2013.01); *H01L 33/0095* (2013.01); *Y02E 10/547* (2013.01)

(58) Field of Classification Search
CPC .............. Y02E 10/547; H01L 31/0682; H01L 31/022441; H01L 31/0445; H01L 31/1864; H01L 31/02167; H01L 31/049; H01L 31/186; H01L 31/1868; H01L 33/0095
See application file for complete search history.

(56) References Cited

U.S. PATENT DOCUMENTS

| | | | | |
|---|---|---|---|---|
| 5,569,399 A | * | 10/1996 | Penney et al. | 219/121.69 |
| 2010/0059109 A1 | * | 3/2010 | Nakayashiki et al. | 136/255 |
| 2012/0028399 A1 | * | 2/2012 | Moslehi et al. | 438/72 |
| 2012/0122272 A1 | * | 5/2012 | Rana et al. | 438/98 |
| 2012/0171804 A1 | * | 7/2012 | Moslehi et al. | 438/71 |

(Continued)

*Primary Examiner* — Marvin Payen
*Assistant Examiner* — Jeremy Joy
(74) *Attorney, Agent, or Firm* — John Wood

(57) ABSTRACT

Annealing solutions providing damage-free laser patterning utilizing auxiliary heating to anneal laser damaged ablation regions are provided herein. Ablation spots on an underlying semiconductor substrate are annealed during or after pulsed laser ablation patterning of overlying transparent passivation layers.

9 Claims, 76 Drawing Sheets

(56) References Cited

U.S. PATENT DOCUMENTS

| | | | |
|---|---|---|---|
| 2012/0178203 A1* | 7/2012 | Moslehi et al. | 438/71 |
| 2012/0225515 A1* | 9/2012 | Moslehi et al. | 438/69 |
| 2013/0130430 A1* | 5/2013 | Moslehi et al. | 438/89 |
| 2013/0164883 A1* | 6/2013 | Moslehi et al. | 438/89 |
| 2013/0171767 A1* | 7/2013 | Moslehi et al. | 438/89 |
| 2013/0213469 A1* | 8/2013 | Kramer et al. | 136/256 |
| 2013/0228221 A1* | 9/2013 | Moslehi et al. | 136/256 |
| 2014/0318611 A1* | 10/2014 | Moslehi et al. | 136/256 |

* cited by examiner

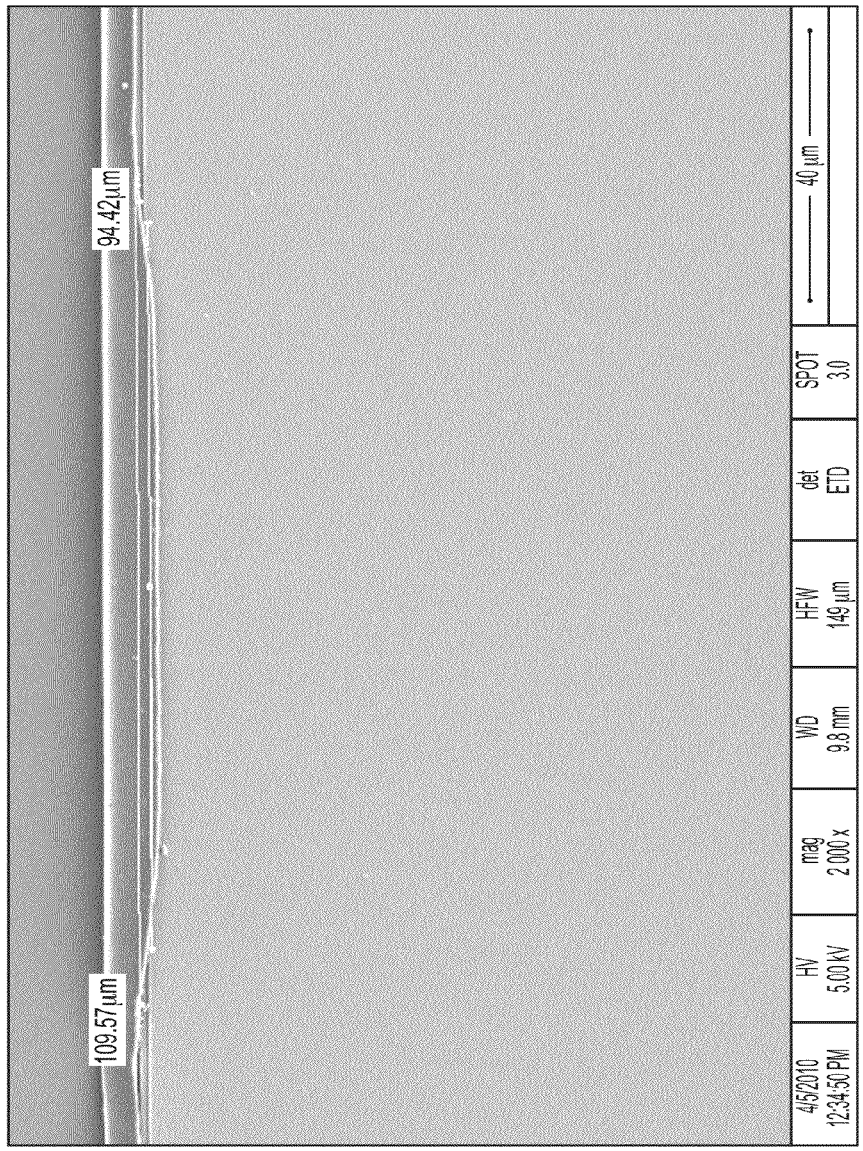
FIG. 1 (photograph)

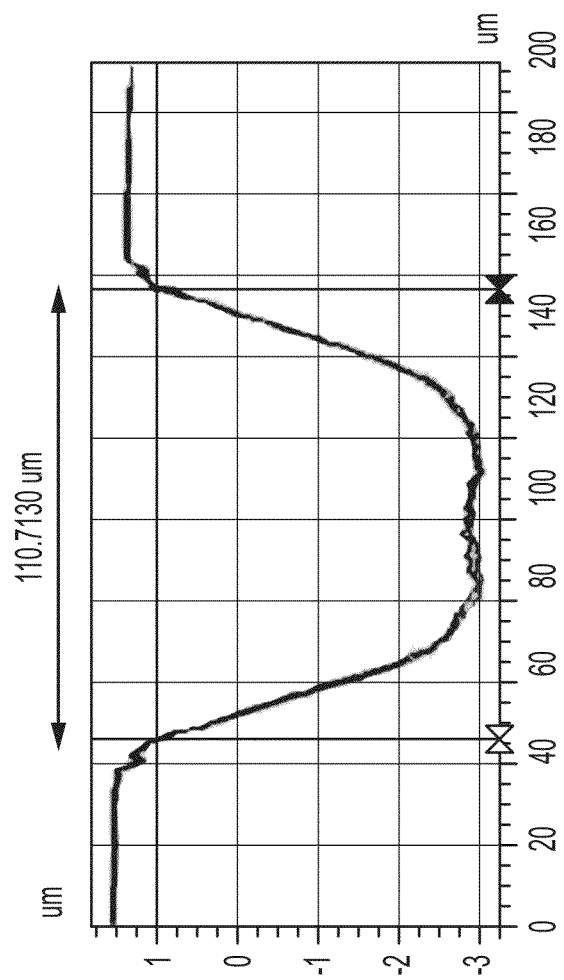
FIG. 2 (screenshot)

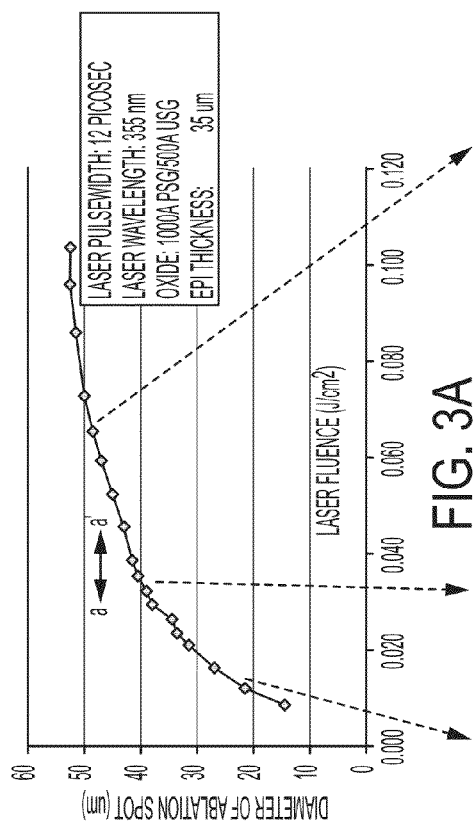
FIG. 3A
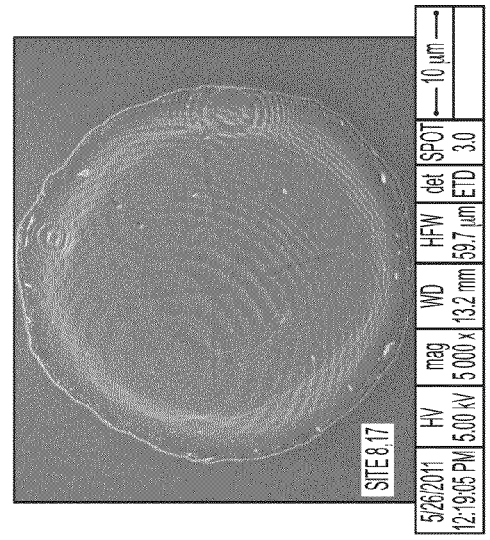
FIG. 3D (photograph)
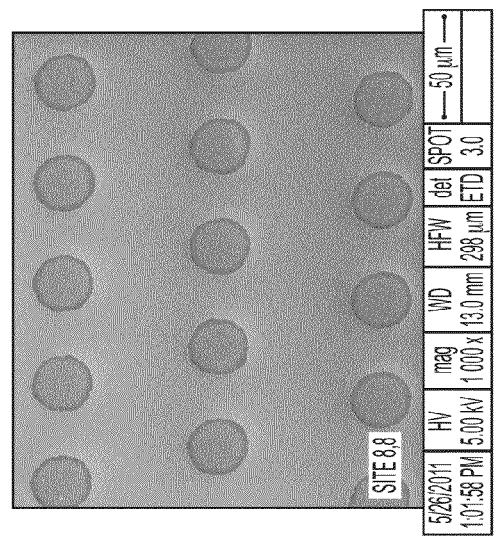
FIG. 3C (photograph)
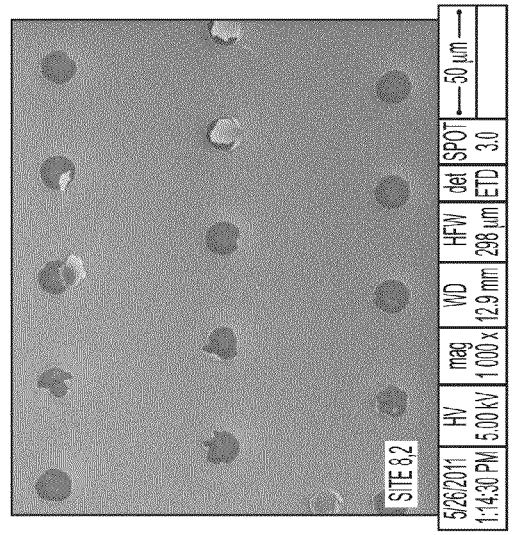
FIG. 3B (photograph)

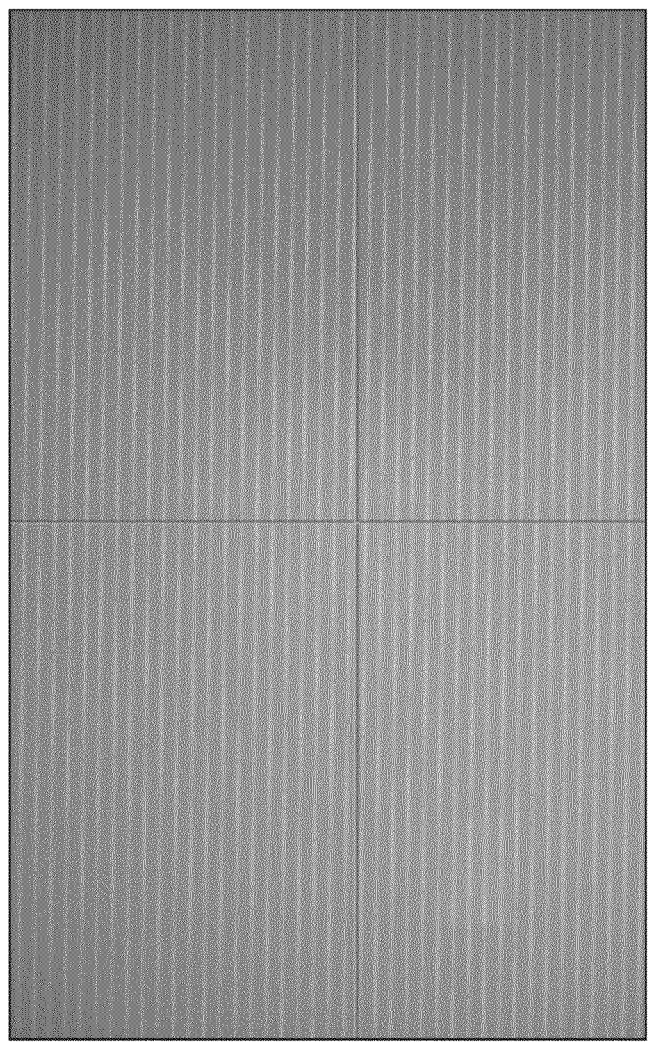
FIG. 4 (photograph)

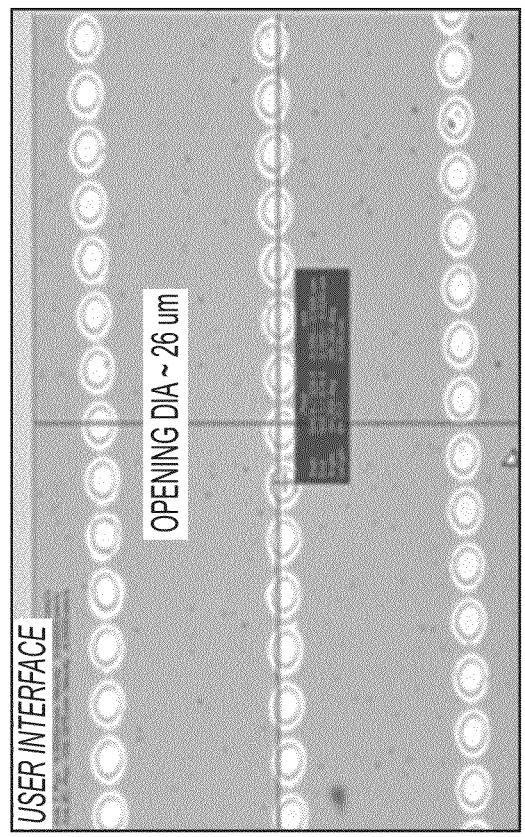
FIG. 5 (screenshot)

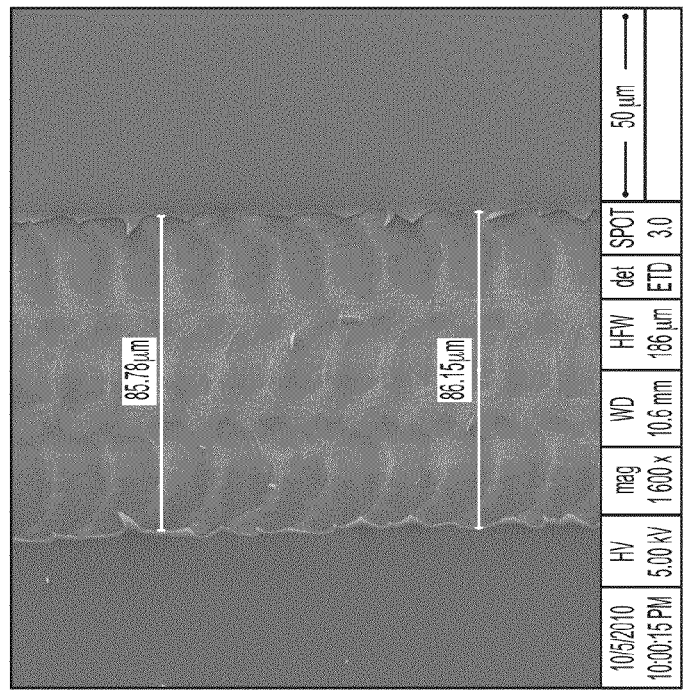
FIG. 6B (photograph)
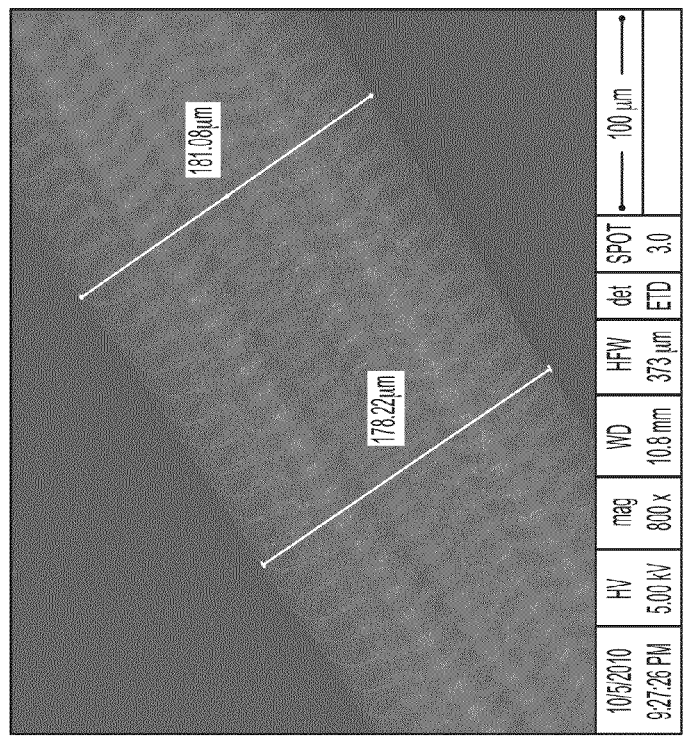
FIG. 6A (photograph)

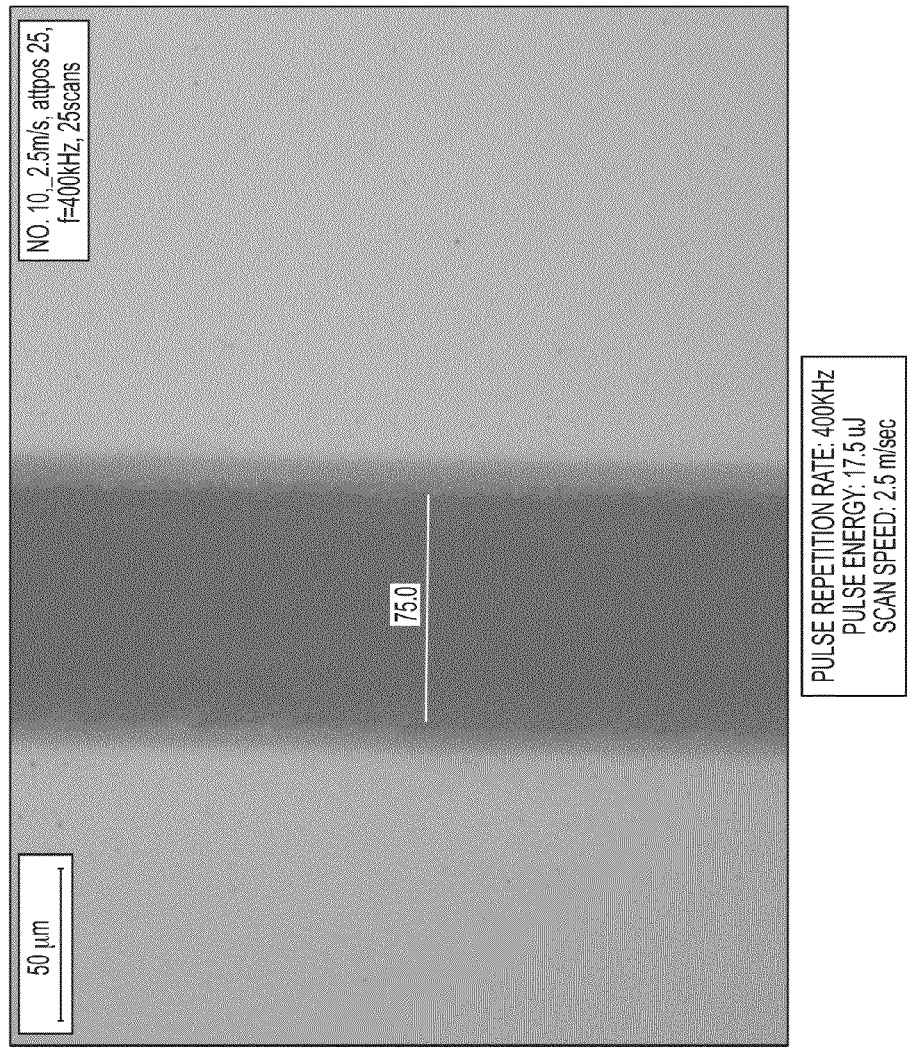
FIG. 7C (photograph)

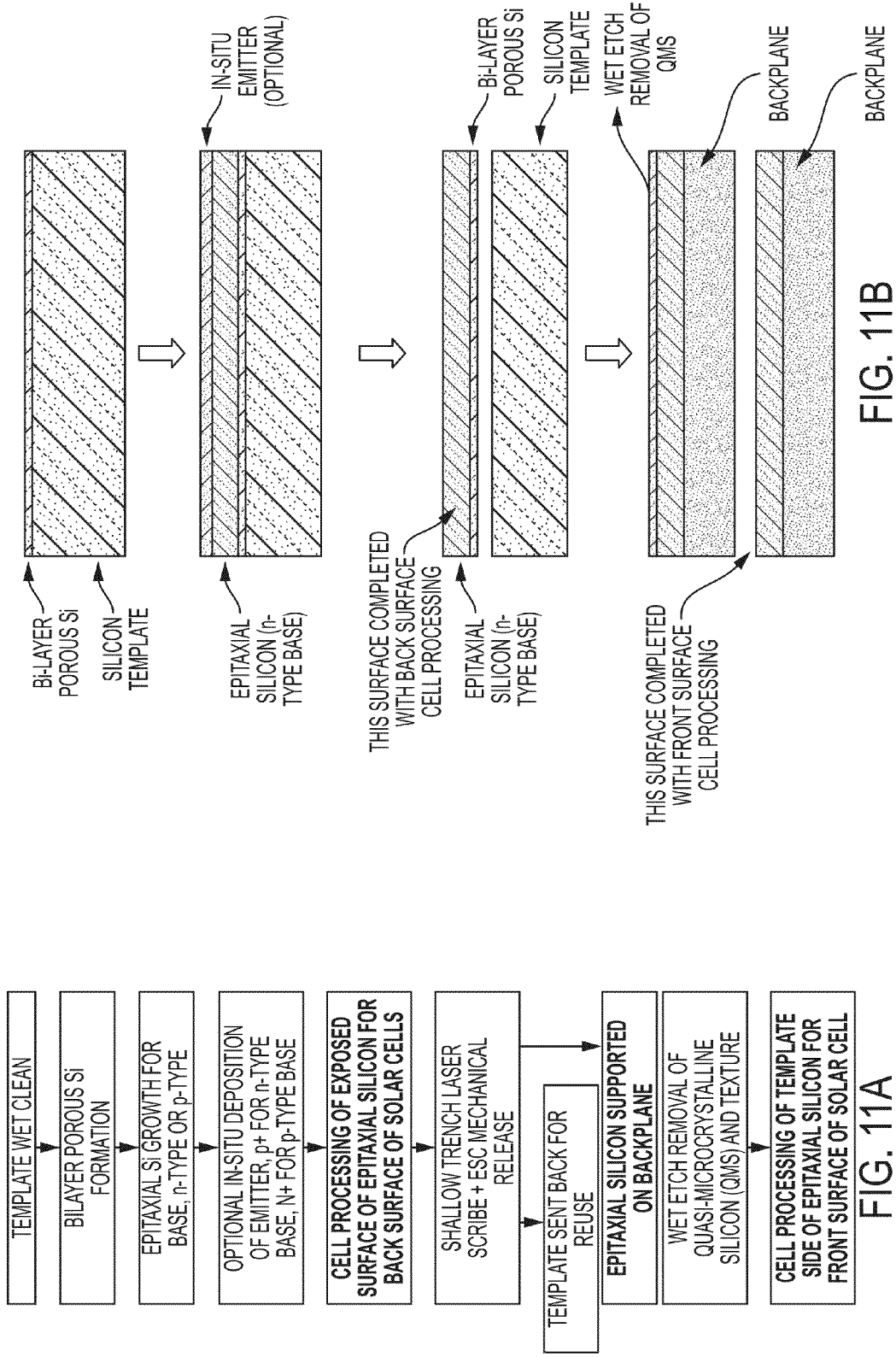

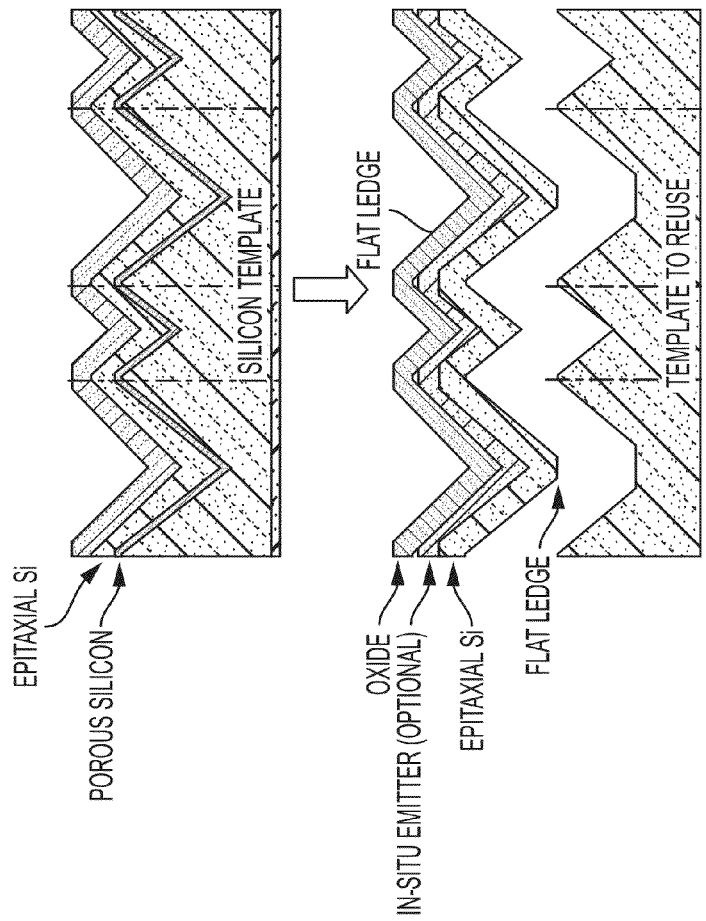
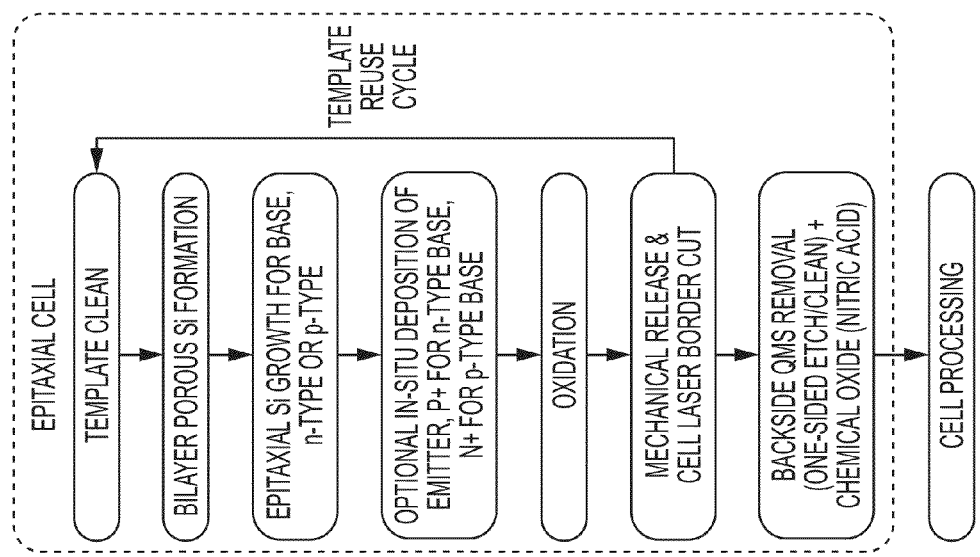
FIG. 12D
FIG. 12C

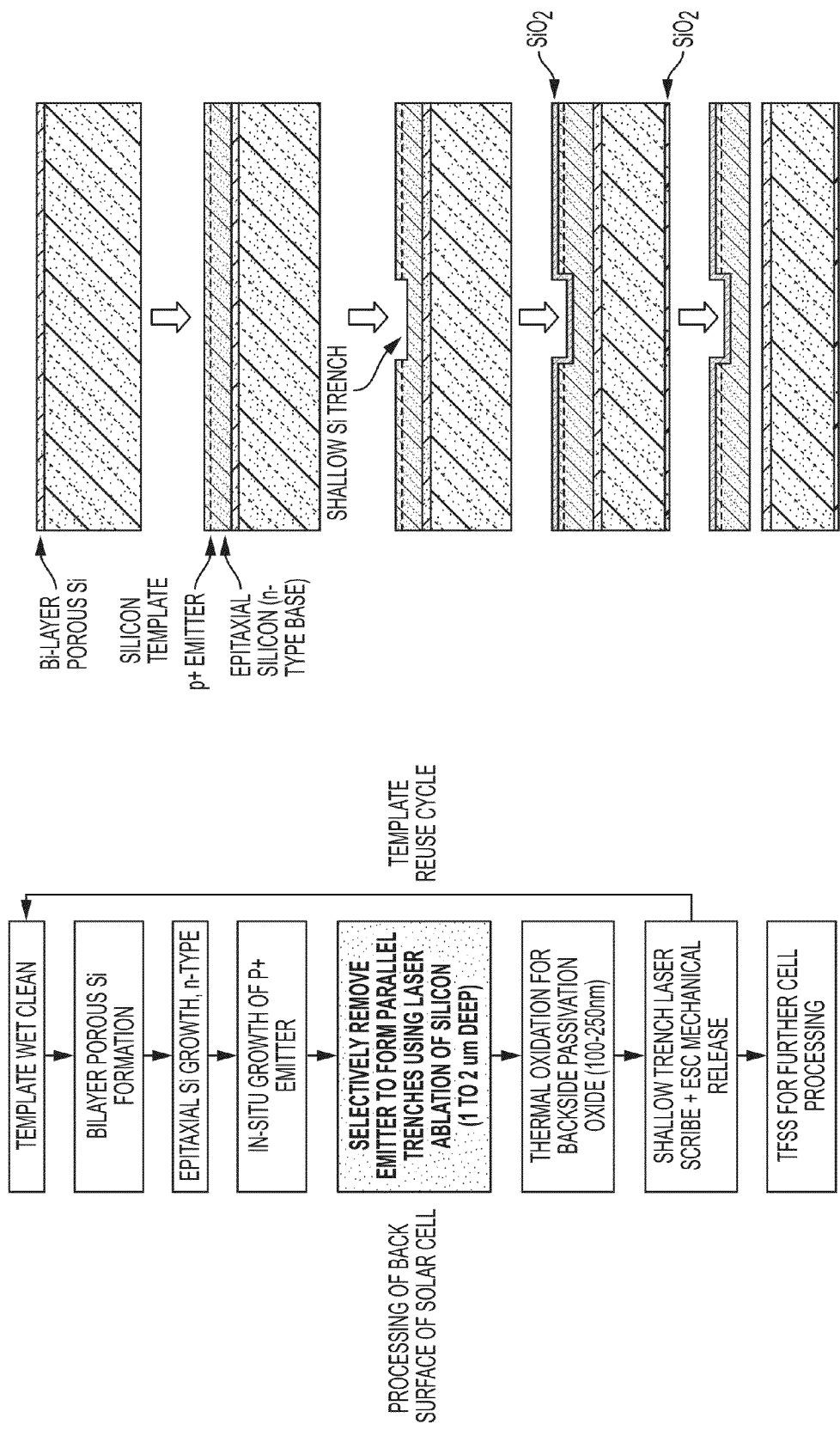

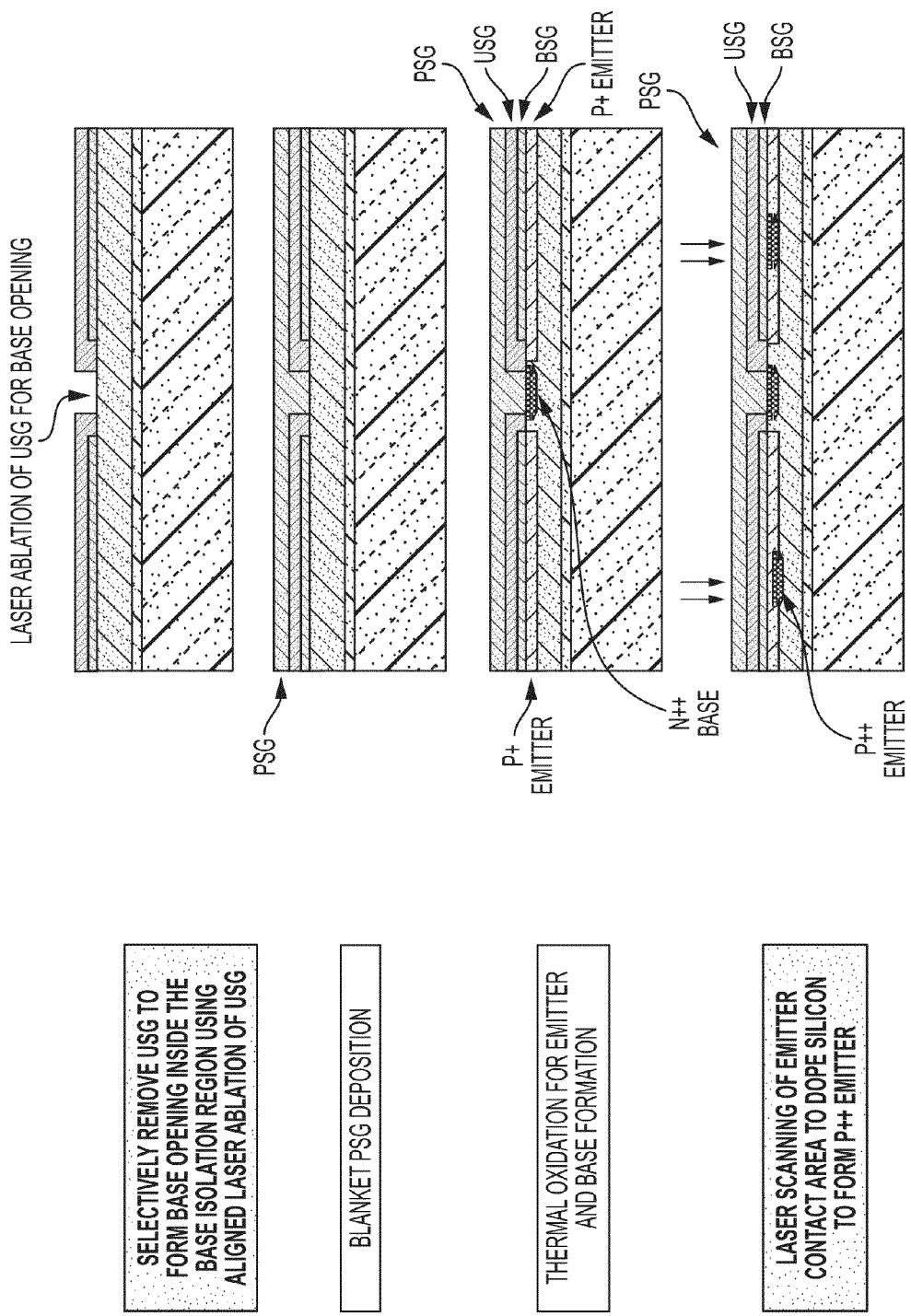

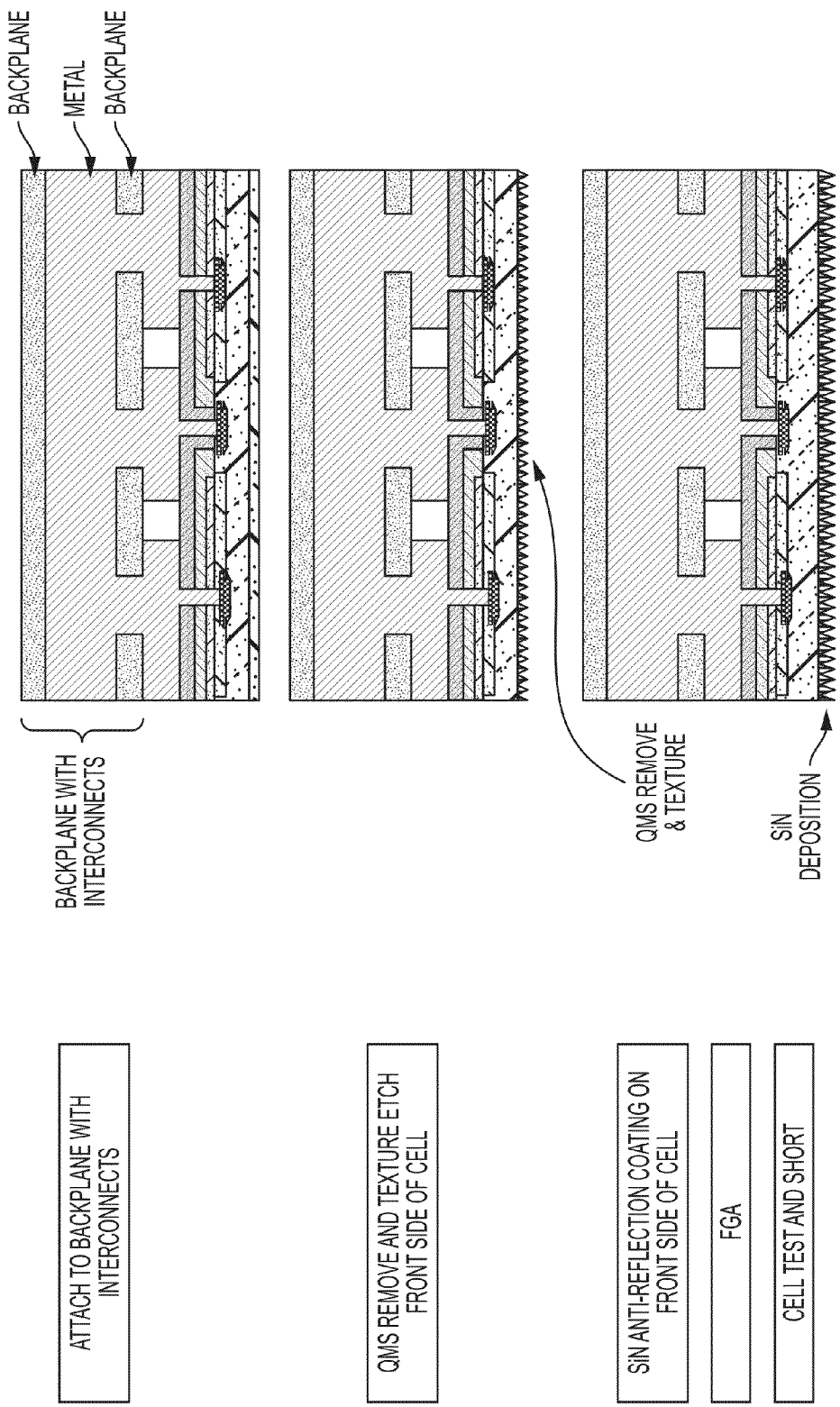

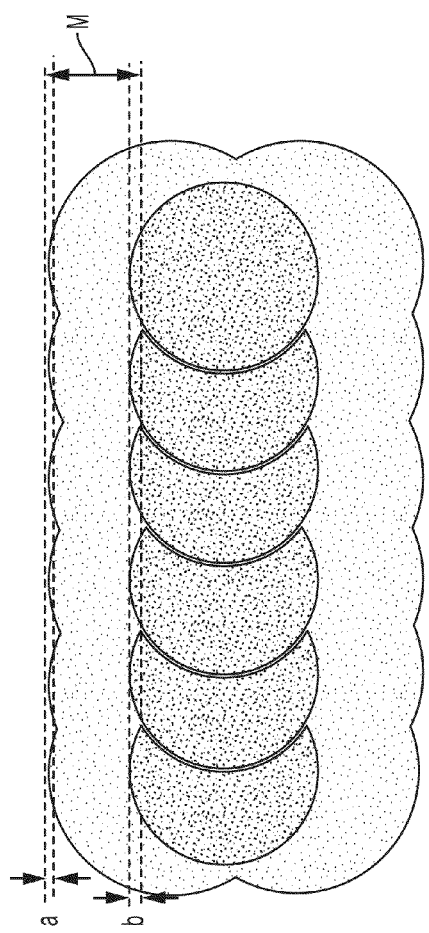
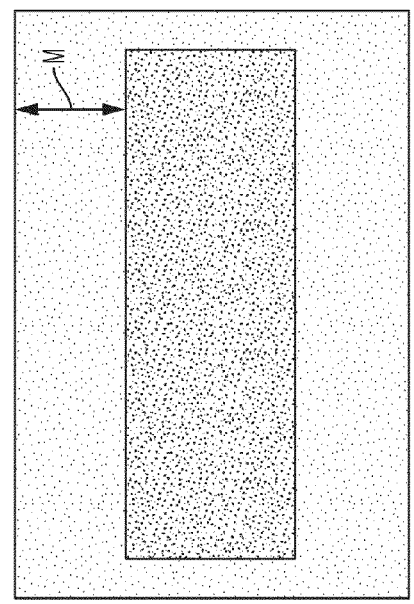
FIG. 29A
FIG. 29B

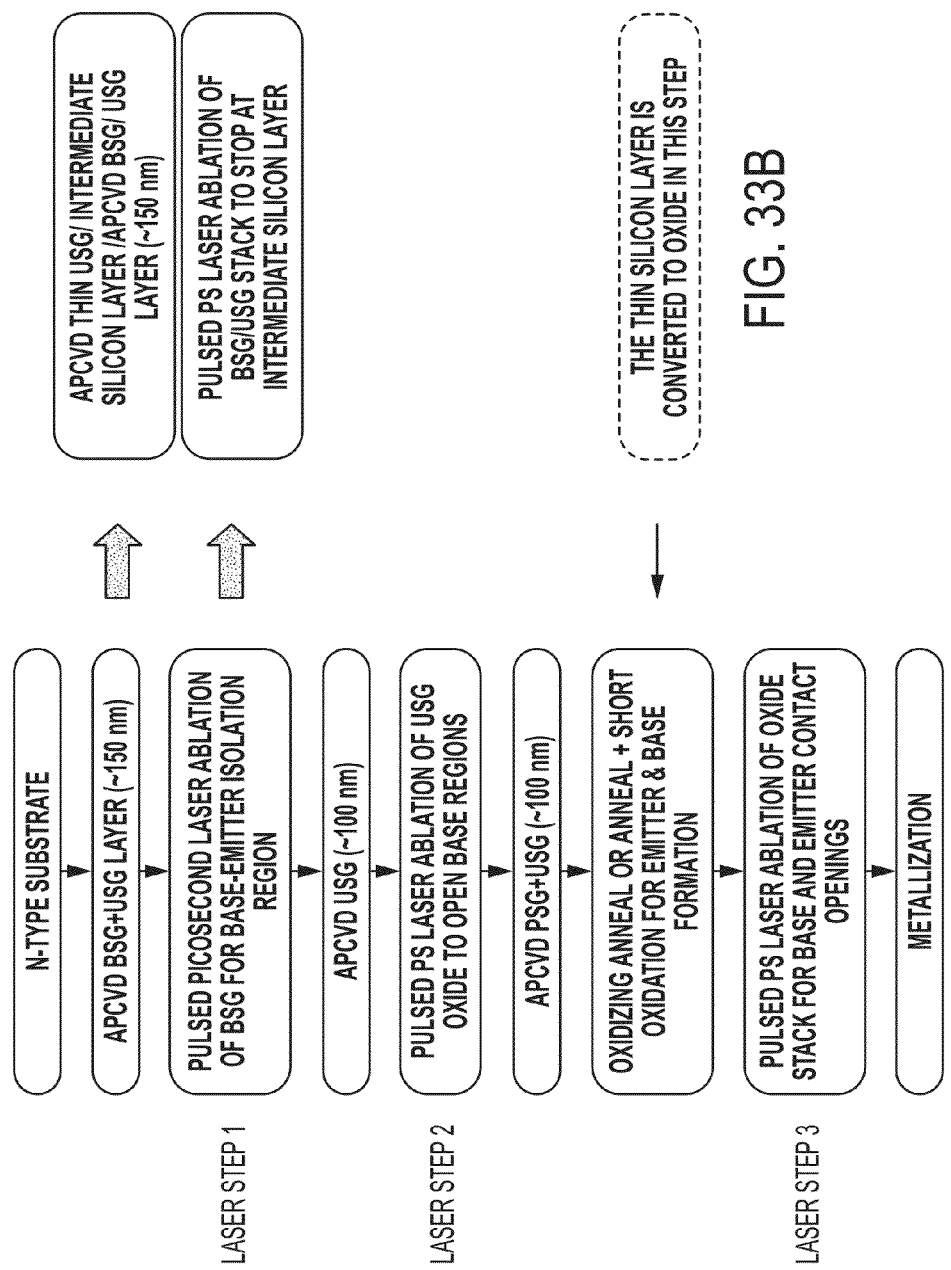

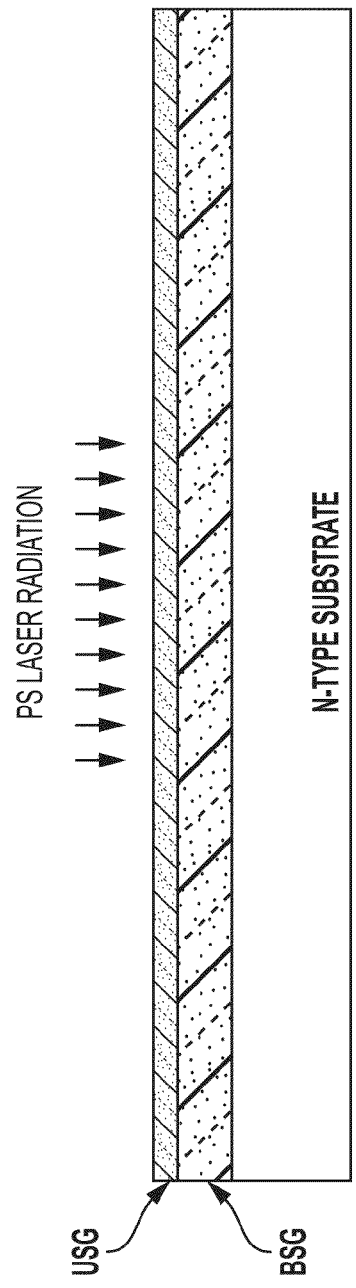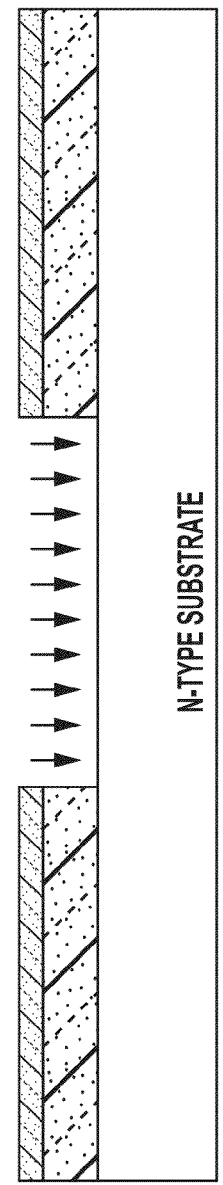
FIG. 34A
FIG. 34B

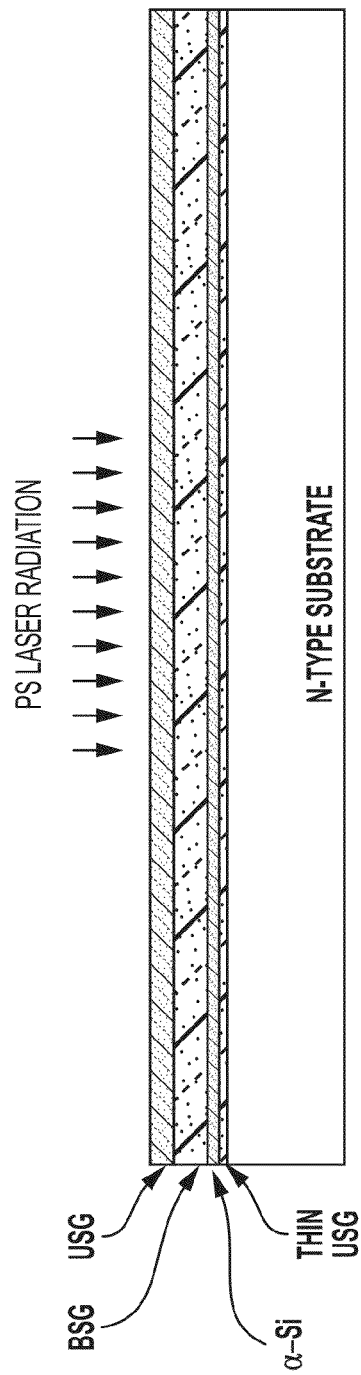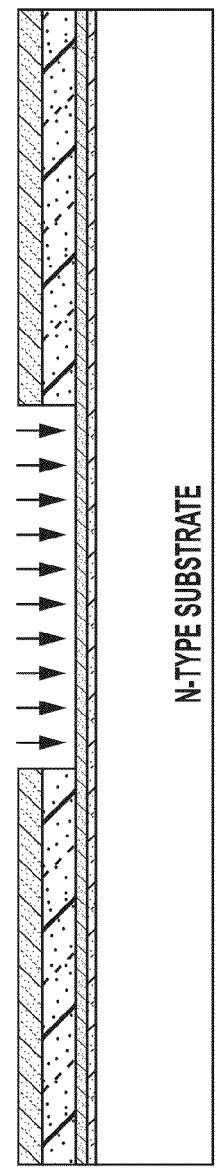
FIG. 35A
FIG. 35B

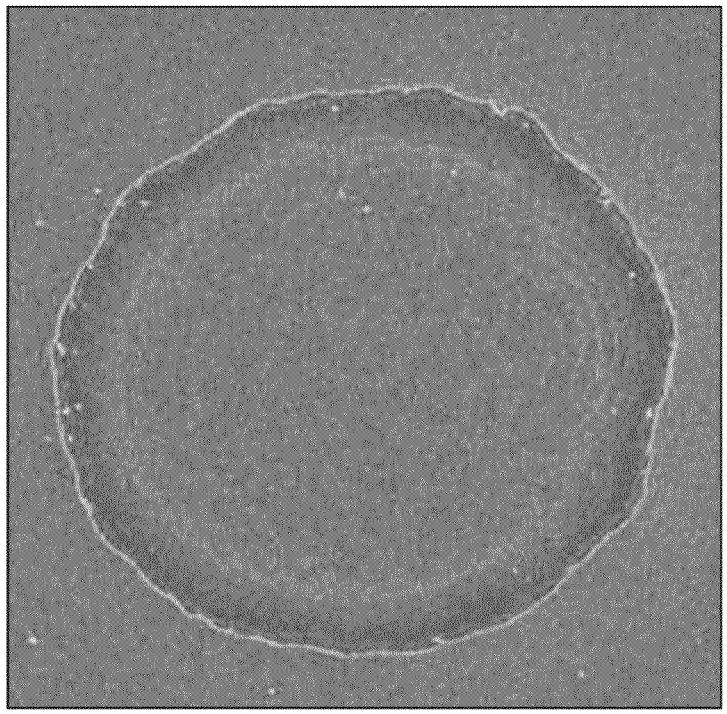
FIG. 38B (photograph)
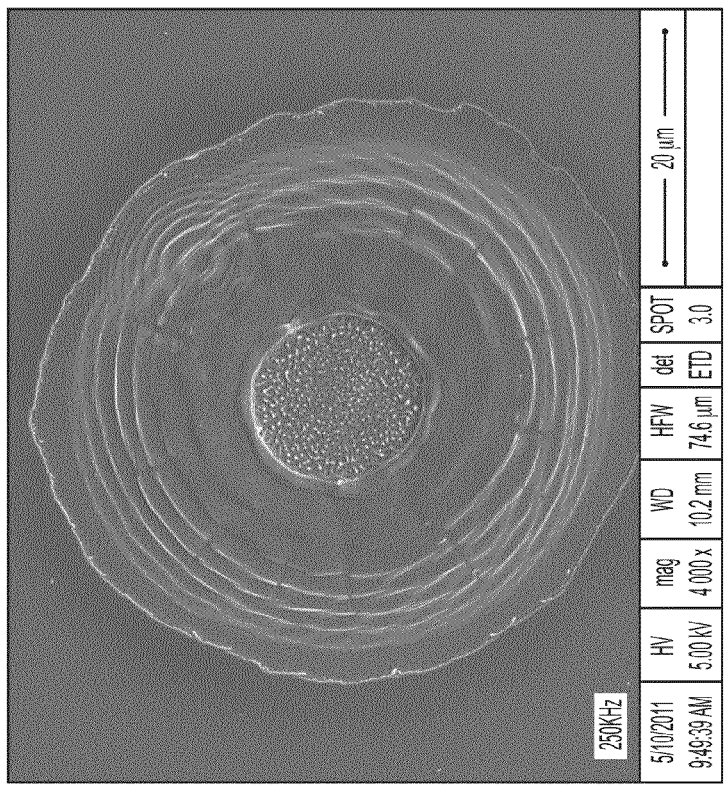
FIG. 38A (photograph)

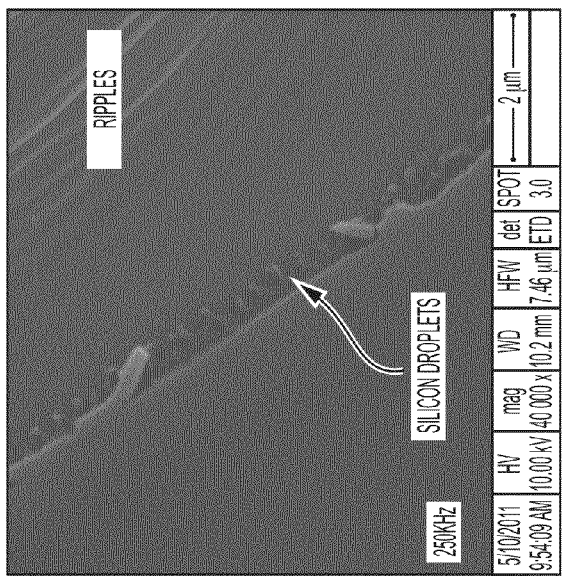
FIG. 38D (photograph)
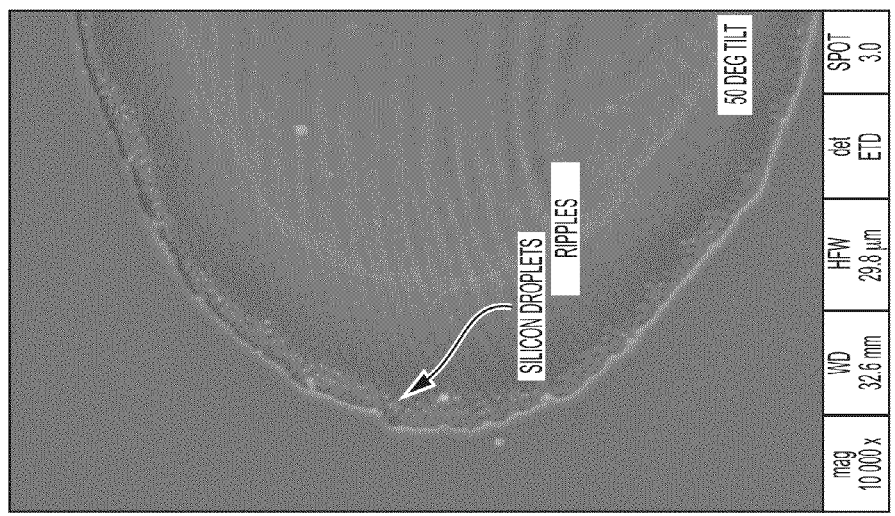
FIG. 38C (photograph)

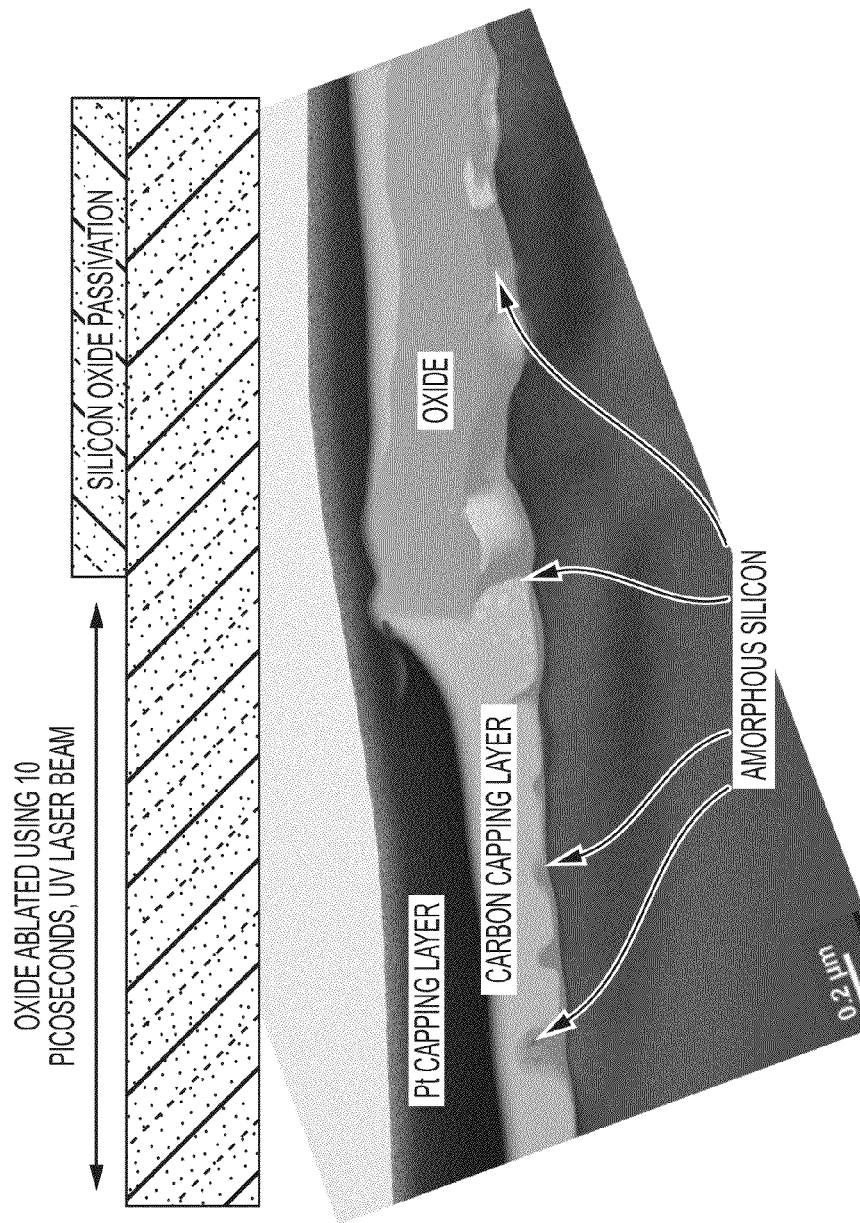
FIG. 38E (photograph)

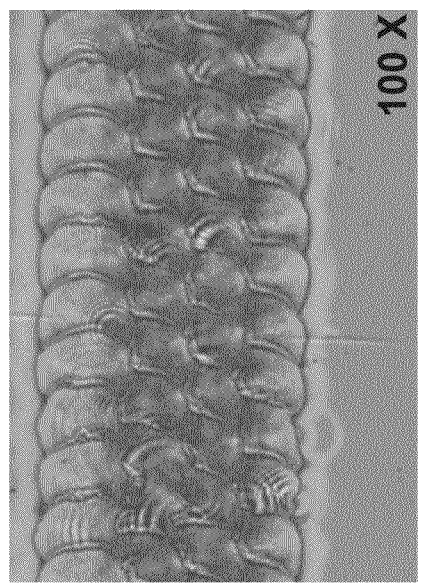
FIG. 39B (photograph)
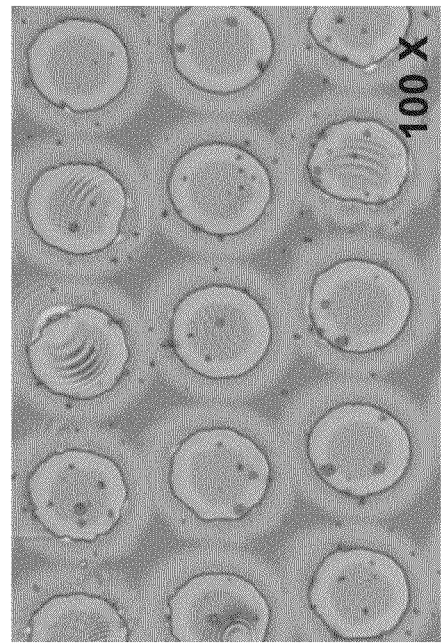
FIG. 39D (photograph)
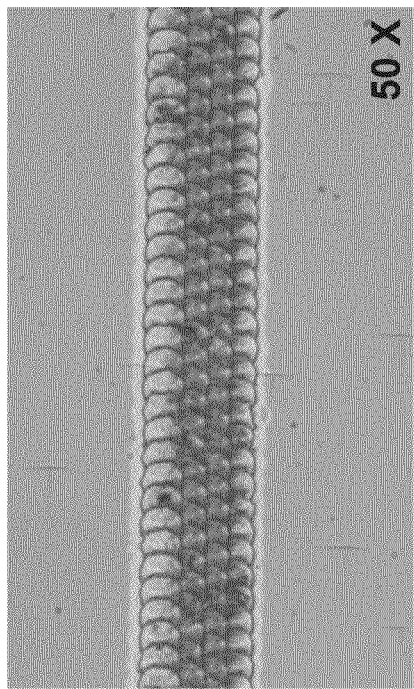
FIG. 39A (photograph)
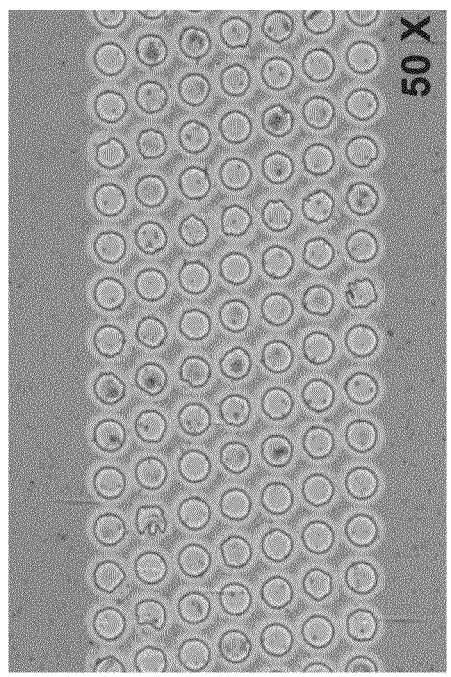
FIG. 39C (photograph)

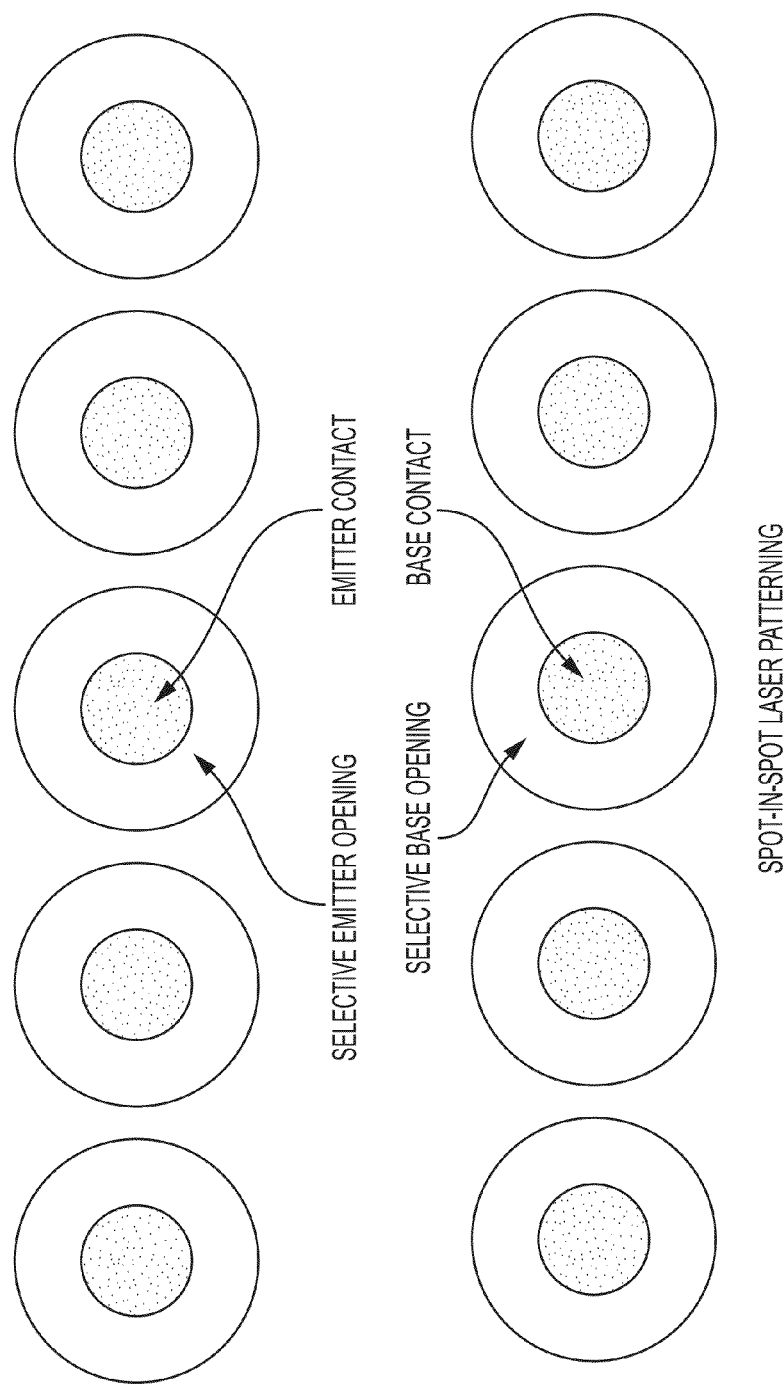

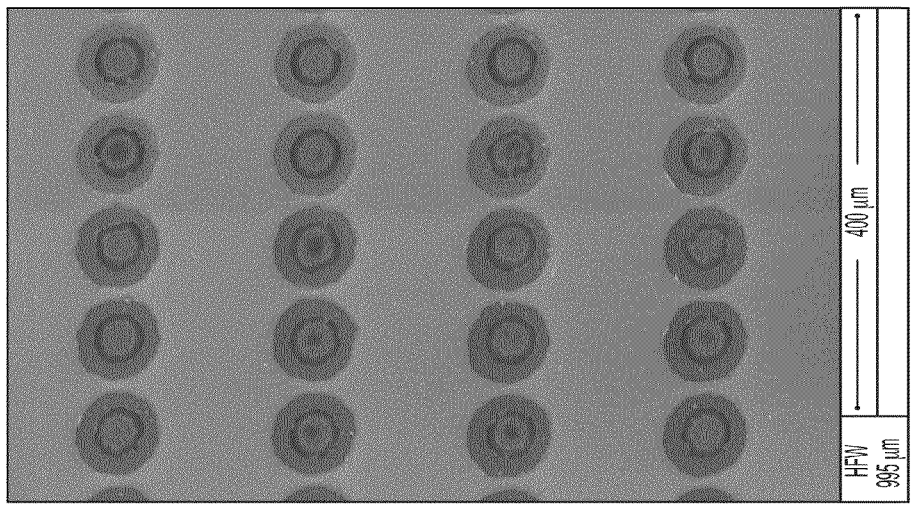
FIG. 41B (photograph)
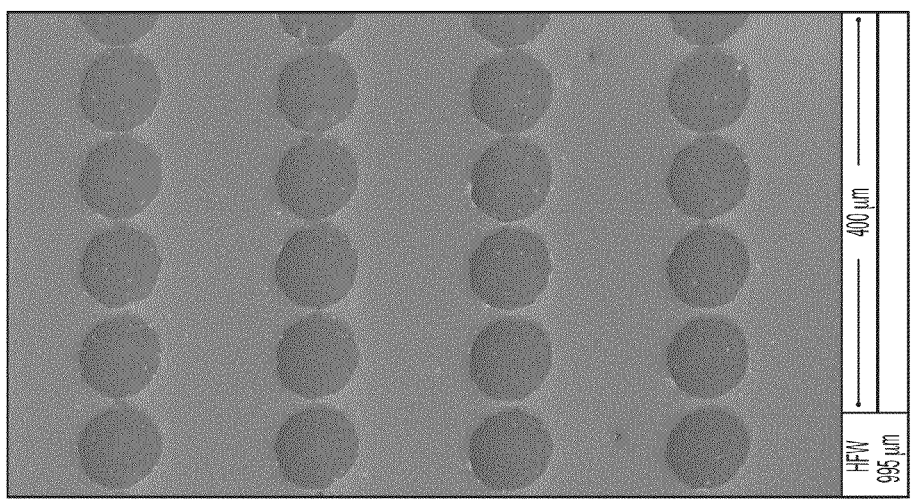
FIG. 41A (photograph)

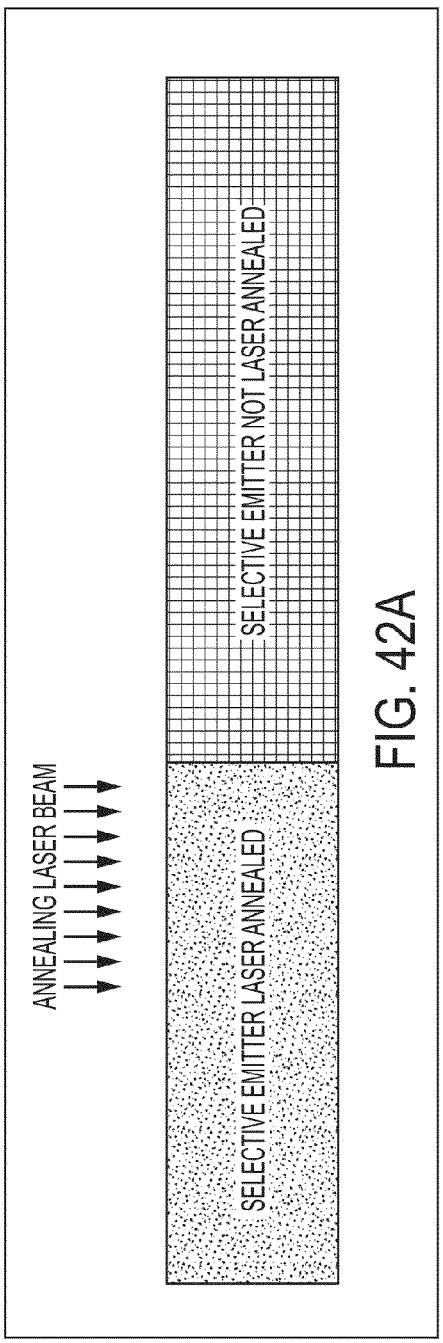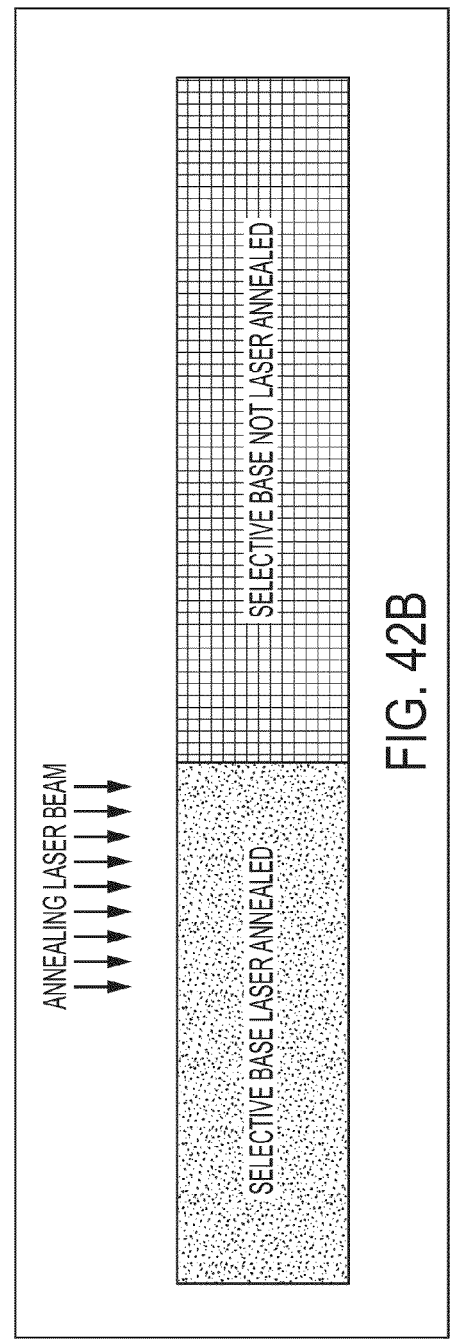

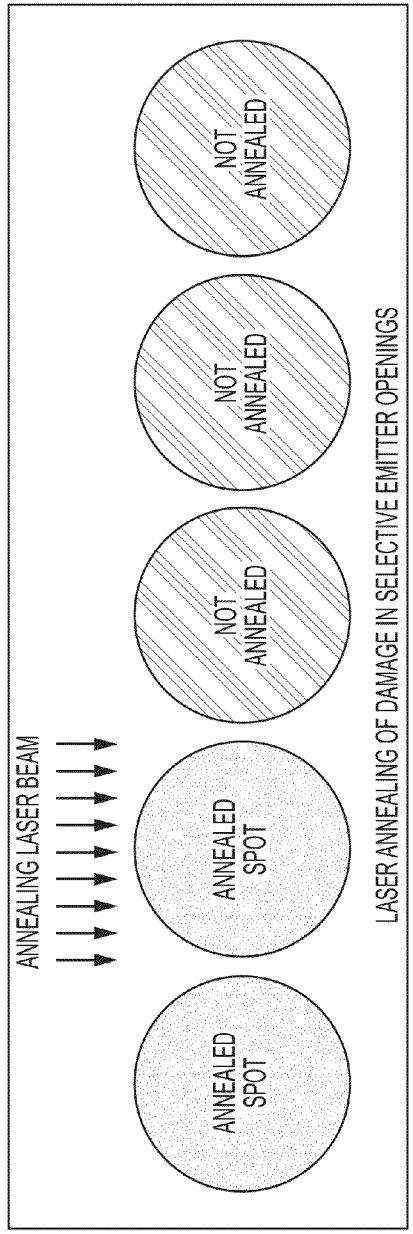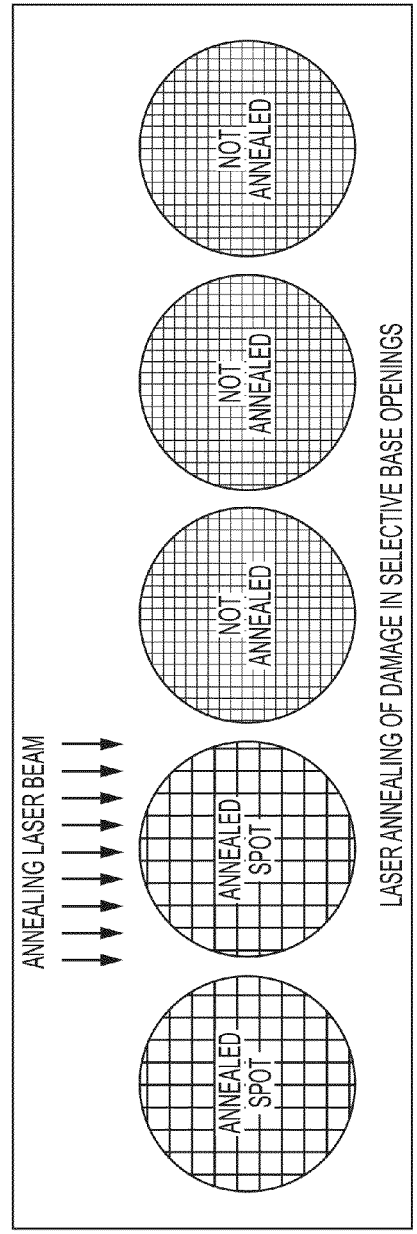

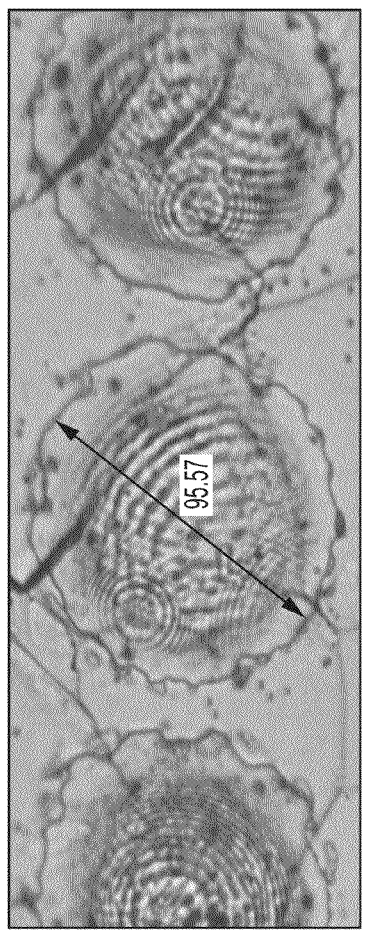
FIG. 44A (photograph)
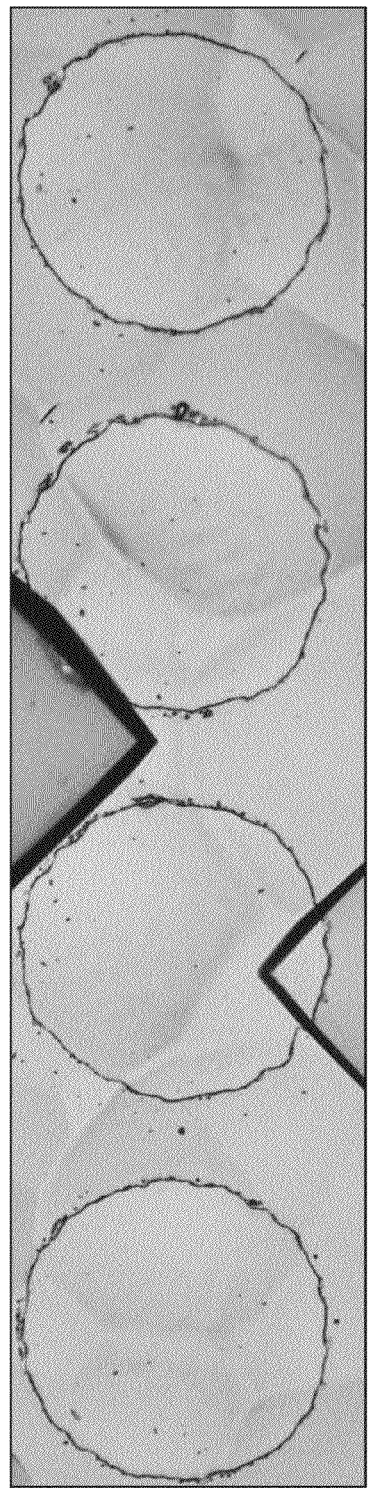
FIG. 44B (photograph)

ANNEALING FOR DAMAGE FREE LASER PROCESSING FOR HIGH EFFICIENCY SOLAR CELLS

CROSS-REFERENCE TO RELATED APPLICATIONS

This application claims the benefit of U.S. provisional patent applications 61/816,830 filed on Apr. 29, 2013, 61/827,252 filed May 24, 2013, and 61/859,166 filed Jul. 26, 2013, which are all hereby incorporated by reference in their entirety. U.S. patent application Ser. No. 13/90115 filed May 29, 2013 and Ser. No. 14/137,172 filed Dec. 20, 2013 are hereby incorporated by reference in their entirety.

FIELD

The present disclosure relates in general to the fields of solar photovoltaic (PV) cells, and more particularly to laser processing of photovoltaic solar cell substrates.

BACKGROUND

Laser processing offers several advantages in terms of efficiency enhancement and manufacturing cost reduction for high-performance, high-efficiency solar cell processing. Firstly, advanced crystalline silicon solar cells may benefit from having the dimensions of the critical features such as electrical contacts be much smaller than the current industrial practice. For front contacted solar cells the contact area of the front metallization to the emitter as well as the contact area of the back metal to the base needs to be low (or the contact area ratios should be fairly small, preferably much below 10%). For an all back-contact, back-junction solar cell, where the emitter and base regions forming the p/n junction and the metallization are on the same side (the cell backside opposite the sunny side), the dimensions of the various features are typically small for high efficiency. In these cells where typically the emitter and base regions form alternate stripes, the width of these regions (in particular the width of the base contact) tends to be small. Also, the dimensions of the metal contacts to these regions tend to be proportionally small. The metallization connecting to the emitter and base regions then needs to be patterned to a correspondingly finer scale. Generally, lithography and laser processing are the technologies that have the relatively fine resolution capability to provide the small dimensions and the control required. Of these techniques, only laser processing offers the low cost advantage required in solar cell making. While lithography requires consumables such as photoresist and subsequent resist developer and stripper (which add to the process cost and complexity), laser processing is a non-contact, dry, direct write method and does not require any material consumables, making it a simpler and lower cost process for solar cell fabrication. Moreover, laser processing is an excellent choice for environmentally benign manufacturing since it is an all-dry process which does not use any consumables such as chemicals.

Further, to reduce the cost of solar cells there is a push to reduce the thickness of the crystalline silicon used and also at the same time increase the cell area for more power per cell and lower manufacturing cost per watt. Laser processing is suitable for these thin wafers and thin-film cell substrates as it is a completely non-contact, dry process and can be easily scaled to larger cell sizes.

Laser processing is also attractive as it is generally a "green" and environmentally benign process, not requiring or using poisonous chemicals or gases. With suitable selection of the laser and the processing system, laser processing presents the possibility of very high productivity with a very low cost of ownership.

Despite these advantages, the use of laser processing in crystalline silicon solar cell making has been limited because laser processes that provide high performance cells have not been developed. Disclosed here are laser processes using schemes that are tailored for each key application to produce solar cells with high efficiency. Specific embodiments are also disclosed for applications of laser processing in manufacturing thin-film crystalline silicon solar cells, such as those manufactured using sub-50-micron silicon substrates formed by epitaxial silicon growth.

SUMMARY

Various laser processing schemes are disclosed herein for producing hetero junction and homo-junction solar cells. The methods include base and emitter contact opening, front and back surface field formation, selective doping, metal ablation, annealing, and passivation. In particular, annealing solutions providing damage-free laser patterning utilizing auxiliary heating to anneal laser damaged ablation regions are provided herein. Also, laser processing schemes are disclosed that are suitable for selective amorphous silicon ablation and selective doping for hetero junction solar cells. These laser processing techniques may be applied to semiconductor substrates, including crystalline silicon substrates, and further including crystalline silicon substrates which are manufactured either through wire saw wafering methods or via epitaxial deposition processes, that are either planar or textured/three-dimensional. These techniques are highly suited to thin crystalline semiconductor, including thin crystalline silicon films.

Laser processing schemes are disclosed that meet the requirements of base to emitter isolation (including but not limited to shallow trench isolation) for all back-contact homo-junction emitter solar cells (such as high-efficiency back-contact crystalline silicon solar cells), opening for base doping, and base and emitter contact opening (with controlled small contact area ratios, for instance substantially below 10% contact area ratio, for reduced contact recombination losses and increased cell efficiency), selective doping (such as for base and/or emitter contact doping), and metal ablation (formation of patterned metallization layers such as creating the patterned metallization seed layer on a thin-film monocrystalline silicon solar cell prior to subsequent attachment of a backplane to the cell and its release from a reusable host template) for both front-contact and all back-contact/back-junction homo-junction emitter solar cells. Also, laser processing schemes are disclosed that are suitable for selective amorphous silicon ablation and oxide (such as a transparent conductive oxide (TCO)) ablation, and metal ablation for metal patterning for hetero junction solar cells (such as back-contact solar cells comprising hetero junction amorphous silicon emitter on monocrystalline silicon base). These laser processing techniques may be applied to semiconductor substrates, including crystalline silicon substrates, and further including crystalline silicon substrates which are manufactured either through wire saw wafering methods or using epitaxial deposition processes, which may be either planar or textured/three-dimensional, where the three-dimensional substrates may be obtained using epitaxial silicon lift-off techniques using porous silicon seed/release layers or other types of sacrificial release layers. These techniques are highly suited to thin crystalline semiconductor, including thin crystalline silicon films obtained using epitaxial silicon deposition on a template comprising a porous silicon release layer or other techniques known in the industry.

An all back-contact homo-junction solar cell may be formed in the crystalline silicon substrate, wherein laser processing is used to perform one or a combination of the following: micromachine or pattern the emitter and base regions including base to emitter isolation as well as openings for base, provide selective doping of emitter and base, make openings to base and emitter for metal contacts, provide metal patterning, provide annealing, and provide passivation. A front contacted homo-junction (emitter) solar cell may be made using laser processing for selective doping of emitter and making openings for metal contacts for both frontside and backside metallization. A hetero junction all back-contact back-contact solar cell may be made using laser processing for defining the base region and conductive oxide isolation.

BRIEF DESCRIPTION OF THE DRAWINGS

The features, nature, and advantages of the disclosed subject matter will become more apparent from the detailed description set forth below when taken in conjunction with the drawings, in which like reference numerals indicate like features and wherein:

FIG. 1 shows a scanning electron microscope (SEM) image of a shallow trench made in silicon for application in an all back contact back-junction solar cell, in accordance with the present disclosure;

FIG. 2 shows a profile of a shallow trench in silicon for application in all back contact back junction solar cells;

FIGS. 3A-3D show the procedure for selecting the laser fluence to obtain reduced damage silicon dioxide (or oxide) ablation. FIG. 3A shows the dependence of the size of the ablation spot on the laser fluence; FIG. 3B shows irregular delamination of oxide; FIG. 3C shows a damage-free spot; and FIG. 3D shows highly damaged silicon in the spot opening;

FIG. 4 shows substantially parallel rows of contacts opened in oxide using pulsed laser ablation in accordance with the present disclosure;

FIG. 5 shows a screenshot with oxide ablation spots for metal contacts;

FIGS. 6A and 6B show the laser-ablated area formed by making ablation spots that are overlapped in both the x and y-direction; FIG. 6A shows a 180 micron wide strip opened in 1000 A BSG (boron-doped oxide)/500 A USG (undoped oxide) for base isolation region; and FIG. 6B shows a ~90 micron wide stripe opened in 1000 A USG (undoped oxide) for base region;

FIG. 7C shows an optical micrograph of the trench formed in this metal stack;

FIGS. 11A and 11B show a process flow for planar epitaxial thin film silicon solar cell substrate in case the TFSS is too thin to be free standing or self-supporting;

FIGS. 12C and 12D show a process flow for 3-D TFSS creation using the reusable micromold template;

FIGS. 16A-16D show a process flow for making an interdigitated back contact back-junction solar cell where the TFSS is thick enough to be self supporting, in accordance with the present disclosure;

FIGS. 19A-19H show a process flow for making an interdigitated back-contact back-junction solar cell where the TFSS is not thick enough to be self supporting, and where instead of in-situ emitter BSG (boron-doped oxide) deposition and selective laser etchback is used to form the base isolation opening, in accordance with the present disclosure;

FIGS. 22 through 30 are not found in U.S. patent application Ser. No. 13/118,295 "LASER PROCESSING FOR HIGH-EFFICIENCY THIN CRYSTALLINE SILICON SOLAR CELL FABRICATION" by Virendra V. Rana and filed on May 27, 2011;

FIGS. 22A and 22B are schematics showing the profile of a Gaussian beam and a flat top beam, respectively;

FIG. 23 is a cross-sectional diagram of a back-contact/back junction cell;

FIG. 25 is a rear/backside view of the back contact solar cell of FIG. 24A with alternating metal lines contacting the emitter and base regions;

FIGS. 29A and 29B are diagrams illustrating a beam alignment window of a Gaussian beam and flat top beam, respectively;

FIG. 30 shows a process flow for an NBLAC cell;

FIGS. 33A and 33B show process flows for all back contact solar cells with oxide ablation;

FIGS. 34A and 34B show an oxide ablation process;

FIGS. 35A and 35B show an oxide ablation process using an amorphous silicon layer;

FIGS. 38A through 38E are scanning electron microscope (SEMS) images highlighting damage to an underlying silicon substrate during oxide ablation;

FIG. 39A is a scanning electron microscope (SEMS) image of overlapping ablation spots;

FIG. 39B is an expanded view of the image of FIG. 39A;

FIG. 39C is a scanning electron microscope (SEMS) image of nonoverlapping ablation spots;

FIG. 39D is an expanded view of the image of FIG. 39C;

FIGS. 40A and 40B are schematic diagrams showing two laser patterning opening and contact schemes;

FIGS. 41A and 41B are scanning electron micrographs of a spot-in-spot laser pattern;

FIGS. 42A and 42B are schematic diagrams showing laser annealing of damaged silicon in selective emitter and selective base ablations, respectively;

FIGS. 43A and 43B are schematic diagrams showing laser annealing of damaged silicon by spot in selective emitter and selective base ablations, respectively;

FIGS. 44A and 44B are optical micrographs showing laser ablation spots before laser anneal and the same ablation spots after annealing;

DETAILED DESCRIPTION

Figure 7A:
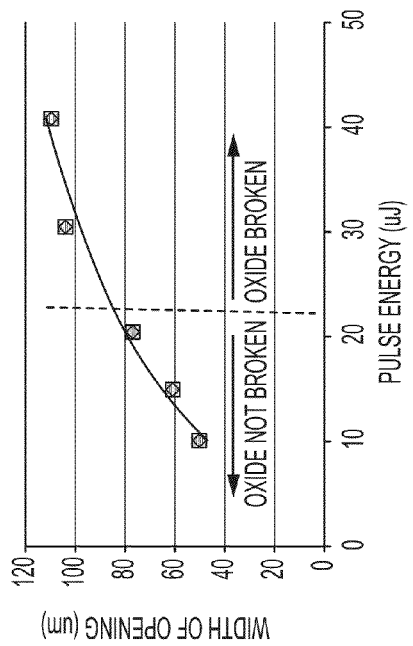
FIG. 7A shows the threshold for oxide damage, below which metal can be removed without metal penetration of the oxide layer.

Although the present disclosure is described with reference to specific embodiments, one skilled in the art could apply the principles discussed herein to other areas and/or embodiments without undue experimentation.

We disclose here laser processing, more specifically pulsed laser processing, schemes that have been developed to address the varying requirements of different processes.

The disclosed methods may be useful in the area of semiconductor device ablation, particularly crystalline silicon ablation. Typically removal of silicon with a laser involves silicon melting and evaporation that leaves undesirable residual damage in the silicon substrate. This damage causes minority carrier lifetime degradation and increased surface recombination velocity (SRV) that reduces the solar cell efficiency. Hence, wet cleaning of the silicon substrate is typically used to remove this damage layer. We present a scheme to reduce this damage to a level acceptable for high efficiency solar cell manufacturing that does not require post-laser-processing wet cleaning, hence simplifying the process flow and reducing the manufacturing cost.

The damage remaining in the silicon substrate upon ablating a certain thickness of it using a laser is related to the amount of laser energy absorbed in the substrate that is not used by the ablated material. If it can be managed that most of the laser energy is used in removing the material then the fraction of the incident energy that seeps into the silicon substrate is minimized, thus minimizing the laser-induced substrate damage and SRV degradation. The penetration of laser energy into silicon depends on the laser pulse length (also called pulse width) and wavelength. The infrared (IR) laser beam, wavelength 1.06 microns, has a long penetration depth in silicon, up to about 1000 microns, while a green laser beam, with a wavelength of 532 nm, penetrates only to a depth of approximately 3 to 4 microns. The penetration of UV laser beam, with a wavelength of 355 nm, is even shorter, only about 10 nm. It is clear that using ultra-short pulses of UV or EUV wavelength limits the penetration of the laser energy into silicon. Additionally, shorter laser pulse length results in shorter diffusion of heat into silicon. While a nanoseconds pulse can lead to heat diffusion in silicon to approximately 3 to 4 microns range, the picoseconds pulse reduces it to about 80 to 100 nm, while a femtoseconds pulse is so short that typically there is no heat diffusion into silicon during the laser ablation process. Hence going to shorter pulses with a shorter wavelength lead to diminishing damage to the laser-ablated substrate. For higher production throughput, green or IR wavelengths can be used depending on the extent of laser damage acceptable. Since even under ideal conditions a certain fraction of the energy would still seep into the substrate, this absorption and its undesirable side effects can be further reduced by reducing the laser power. However, this results in a smaller thickness of silicon being ablated (or a lower silicon ablation rate or lower throughput). It has been found that reducing the pulse energy but causing the silicon removal by increasing the overlap of the laser pulses makes the silicon shallow isolation trench smoother. This is an indication of low silicon surface damage. At very low pulse energies the thickness of silicon removed may be small. The desired depth may then be obtained by using multiple overlapped scans of the pulsed laser beam.

A pulsed laser beam with pulse length in the picoseconds range and a wavelength of approximately 355 nm or below is suitable for silicon ablation with low damage enabling low surface recombination velocity (SRV) for passivated ablated surfaces. FIG. 1 shows a 2.25 micron deep and nearly 100 micron wide trench made in a silicon substrate using a picoseconds UV laser beam of Gaussian profile ($M^2 \leq 1.3$), nearly 110 microns in diameter with 4 microjoule pulse energy, with the laser spots overlapped nearly 15 times. This depth of ablation was obtained using twenty overlapped scans of the laser with each scan removing about 112 nm of silicon. FIG. 2 shows the smooth profile of a 4 micron deep and 110 micron wide trench in silicon obtained using the same picoseconds laser beam with the UV wavelength. The smoothness of the profile should be noted. Such an ablation of silicon is used in all back-contact back-junction solar cells to form regions that isolate base regions from emitter regions. Use of a femtoseconds laser may provide further reduction of laser damage during silicon ablation.

The embodiments of this disclosure are also applicable to the ablation of amorphous silicon. A similar scheme may be used to ablate a desired thickness of amorphous silicon using a pulsed laser beam with femtoseconds pulse length and in some embodiments a UV or green wavelength. Since ablation of amorphous silicon requires much lower energy than crystalline silicon, such a scheme may effectively be used to selectively ablate amorphous silicon films from the crystalline silicon surface for application to hetero junction solar cells.

This disclosure is also applicable to oxide ablation selective to the underlying substrate, which may be crystalline or amorphous silicon. The oxide film is transparent to laser beams of wavelength down to UV. If a nanoseconds pulse length laser is used to remove the overlying oxide, the removal of oxide takes place by heating and melting of silicon underneath. Because of the pressure from the ablated silicon underneath, the overlying oxide is cracked and removed. This however, creates heavy damage in the silicon substrate so that a wet cleaning treatment is typically used to remove this damaged layer for use in high efficiency cells.

We present here a scheme where the oxide layer is selectively removed from the silicon surface without any appreciable damage to the silicon surface. During the laser ablation, besides heating the material to melt or evaporate it, other effects such as plasma formation take place. Sometimes complex processes can take place at an interface. Using a laser with picoseconds pulse length, the oxide to silicon interface is affected. Using a picoseconds laser with a UV wavelength, the interface effects are enhanced so that separation and delamination of the oxide film takes place from the silicon surface. The silicon surface left behind is virtually free of damage. Picoseconds laser radiation with green or infra-red (IR) wavelength can also be used depending on how much penetration damage of silicon substrate is acceptable. This disclosure will outline the procedure to obtain damage free selective ablation of oxide from the silicon surface.

FIGS. 3A-3D disclose the procedure for obtaining damage-free ablation of oxide. FIG. 3A shows the variation of laser spot opening in a 1000 A PSG (phosphorus-doped oxide)/500 A USG (undoped oxide) stack on a 35 micron thick epitaxial silicon film on a template, using a picoseconds UV laser beam. The oxide layers were deposited using APCVD (atmospheric-pressure CVD) technique. For a given thickness of oxide the spot size depends on the laser fluence ($J/cm^2$). The laser fluence is the laser pulse energy divided by the area of the laser beam. In this case, the laser beam was about 100 microns in diameter with a Gaussian profile ($M^2<1.3$). At very low fluence, the spots are irregular and there is irregular delamination of oxide from the silicon surface as shown in FIG. 3B, while at very high fluence there is extensive damage of silicon as shown in FIG. 3D. The range of fluence shown by line a-a' indicates the optimum range where the damage to the silicon substrate is minimal as seen in FIG. 3C.

FIG. 4 shows rows of cell contact openings that are selectively opened in the oxide for application in all back-contact (and back-junction) solar cells. FIG. 5 is a close-up of these contacts. The laser ablation spots can be overlapped in both x and y direction to open up an area of any desired length and width on the wafer as shown in FIGS. 6A and 6B. FIG. 6A shows a 180 micron wide opening made by selectively removing the BSG (boron-doped oxide) for base isolation region using picoseconds UV laser beam with ablation spots overlapping in both x and y-direction. Similarly, FIG. 6B shows a 90 micron wide area opened up in USG (undoped oxide) for forming the base region.

The selective ablation of oxide from a silicon surface as disclosed here can be used in solar cell making in several ways. In one application, when using in-situ emitter for back-contact cells, this process is used to open tracks in an oxide film to expose the underlying emitter. The emitter so exposed may be removed using wet etching. This region is then used for base to emitter isolation and with base formed inside it.

In another application, this process is used to open regions that are then used for making metal contacts. For front contacted cells, the oxide passivation can be used on the backside of the cells. The scheme described here is then used to open contacts for the metal that is subsequently deposited on these contacts. In this manner, the metal has localized contact that is conducive to high cell efficiency. For back contacted cells, contacts for both base and emitter may be opened using this scheme.

In a solar cell process flow, a doped oxide may need to be removed without causing any doping of the silicon underneath (i.e., without any appreciable heating of the doped oxide and silicon structure). Since, as described above, the oxide is removed by separation at the oxide/silicon substrate interface when using a picoseconds laser beam, the removal of oxide happens with limited pickup of the dopant from the oxide film being ablated.

The selective ablation of silicon nitride ($SiN_x$) is used for front contacted solar cells. Using laser ablation, the contact area to the emitter surface can be reduced thereby minimizing the area where the SiN passivation is removed. This leads to higher $V_{OC}$. Picosecond lasers with either UV or green wavelength are suitable for this application, although nanoseconds UV lasers can also be used.

Selective metal ablation from the oxide surface has historically been difficult using lasers. This is because at the high pulse energies needed to ablate metal, the energy is high enough to damage the oxide underneath and cause penetration of metal into oxide. In fact, this is the basis for the process of "laser fired contacts" (LFC) used in solar cells.

We disclose three schemes for selectively removing metal from the oxide (or another dielectric) surface with no metal penetration of oxide (or other dielectrics such as silicon nitride) and breaking or cracking of oxide. In all these schemes, aluminum is the first metal in contact with base and emitter (aluminum being used as the contact and light trapping rear mirror layer). A laser with picoseconds pulse length is suitable for this application. For high metal removal rate the IR wavelength is quite suitable. According to the first scheme, metal is ablated at a pulse energy that is lower than the threshold for oxide ablation. If the thickness of metal removed in one scan is lower than the desired thickness, multiple overlapping scans are used to remove the full thickness of metal. Since the pulse energy is below the oxide ablation threshold, a clean removal of metal from the oxide surface is obtained. However, the exact recipe used highly depends on the type of metal in the stack, their thickness and surface roughness, etc.

Figure 7B:
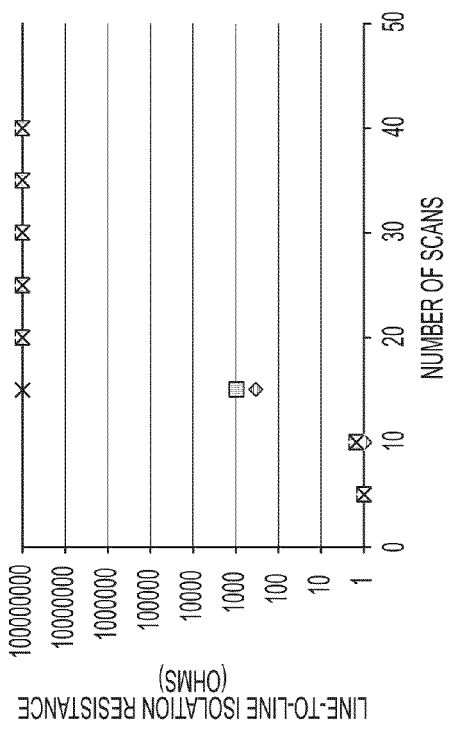
FIG. 7B shows that after 20 scans the metal runners are fully isolated.

FIGS. 7A-7C shows the ablation results when patterning a PVD-deposited bi-layer stack of 2400 A of NiV on 1200 A of Al on oxide. It is desired that the metal be removed completely between the runners without breaking through the oxide layer underneath (to prevent shunts in the cell). FIG. 7A shows the threshold for pulse energy, below which this metal stack can be removed without penetration of oxide. This threshold, besides depending on the metal stack characteristics described above, depends on the laser parameters such as spot overlap obtained using a certain pulse repetition rate of the laser as well as the scan speed. With increasing pulse overlap the threshold pulse energy would decrease, because of the energy accumulation in the metal. FIG. 7B shows that using a pulse energy below the threshold for oxide damage, more than twenty scans provided complete isolation of metal runners as determined by the 100M-ohm resistance between parallel lines. FIG. 7C shows a clean 75 micron trench formed in the 2400 A NiV/1200 Al metal stack.

According to the second, high-throughput scheme higher pulse energies are used, since a substantial part of the incident energy is absorbed as it is being ablated thereby reducing damage to the oxide. This approach makes the laser ablation of metal a very high throughput process. Using this scheme we have ablated 1250 A Al/100-250 A of NiV, with or without a tin (Sn) overlayer up to a thickness of 2500 A successfully using a two step process. In the first step the softer metal is removed using 15 microjoule pulses, followed by 30 microjoule pulses both overlapped fifteen times. For thicker aluminum such as 2000 A the second step can be carried out at 50 microjoules with the same number of overlapping of pulses.

The third scheme of metal ablation is applicable to highly reflective films, for example Al/Ag stack (with Al in contact with the cell and Ag on top of Al), such that most of the incident energy of the picoseconds laser is reflected and ablation is drastically reduced. In that case the surface of the reflective metal (Ag) is first dented using a long pulse length nanoseconds laser, pulse length from 10 to 800 nanoseconds, followed by picoseconds cleanup of the aluminum underneath.

This disclosure is also applicable to the selective doping of a substrate. For successful doping of silicon using an overlying layer of the dopant-containing material, the pulse energy should be high enough to melt the silicon but not high enough to ablate it or the dopant layer above it. As the silicon melts, the dopant is dissolved into it. Upon recrystallization of this silicon layer, a doped layer is obtained. For this application a nanoseconds pulse length laser with green wavelength is quite suitable because of its limited penetration into silicon.

The laser processing techniques described above are applicable to planar and 3-D thin-film crystalline silicon substrates. The laser processes described here are suitable for any thickness of the silicon substrate. These include the current standard wafer thickness of ≥150 microns used for crystalline silicon solar cells. However, they become even more advantageous for thin, fragile wafers or substrates as the process in carried out without any contact with the substrate. These include the wafers thinner than 150 micron obtained from monocrystalline CZ ingots or multi-crystalline bricks using advanced wire sawing techniques or by other techniques such as hydrogen implantation followed by annealing to separate the desired thickness of wafer, or thin-film monocrystalline substrates (such as in the thickness range of from a few microns up to 80 microns) obtained using epitaxial deposition of silicon on a sacrificial separation/release layer such as porous silicon and its subsequent lift off.

Figure 8B:
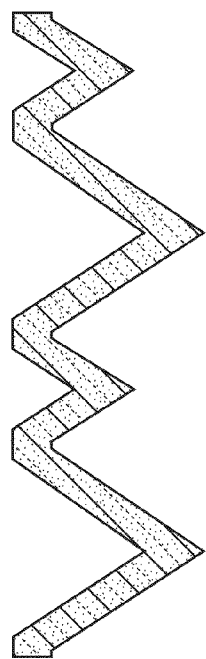
FIGS. 8A and 8B show a top view and a cross-sectional view of a pyramidal TFSC.
Figure 8A:
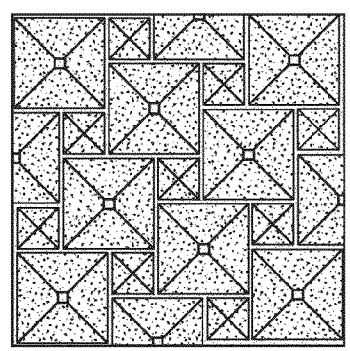
Figure 9B:
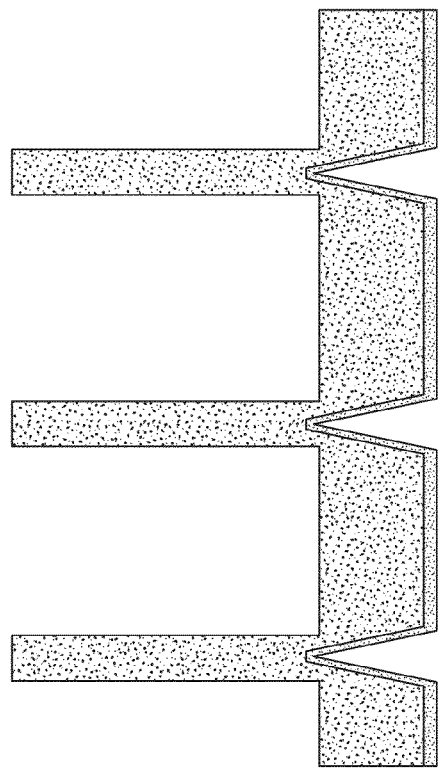
FIGS. 9A and 9B show a top view and a cross-sectional view of a prism TFSC.
Figure 9A:
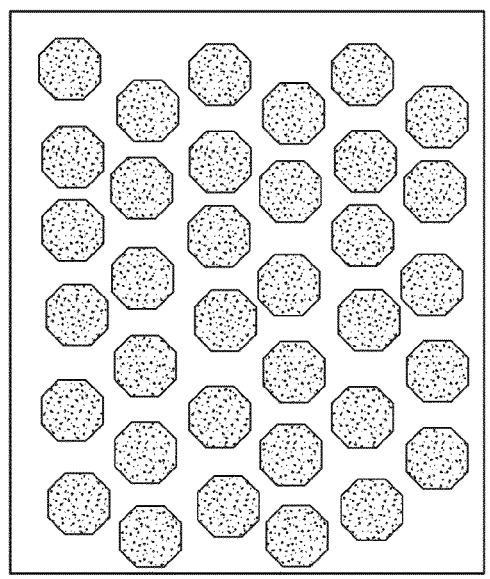

The laser processing is particularly suited to three dimensional substrates obtained using pre-structuring of reusable templates and silicon micromachining techniques. One such method is described in the '713 application (published as U.S. Pat. Pub. US2010/0304522 on Dec. 2, 2010). FIGS. 8A through 9B show the 3-D thin film silicon substrates obtained using the technique described in that publication. FIG. 8A shows the top view while FIG. 8B shows the cross-section of the TFSS so obtained. For pyramidal substrates, the tips may be flat or may end in a sharp point. FIGS. 9A and 9B show the TFSS with prism structure obtained using a reusable pre-structured 3D template described in the reference above.

Figure 10B:
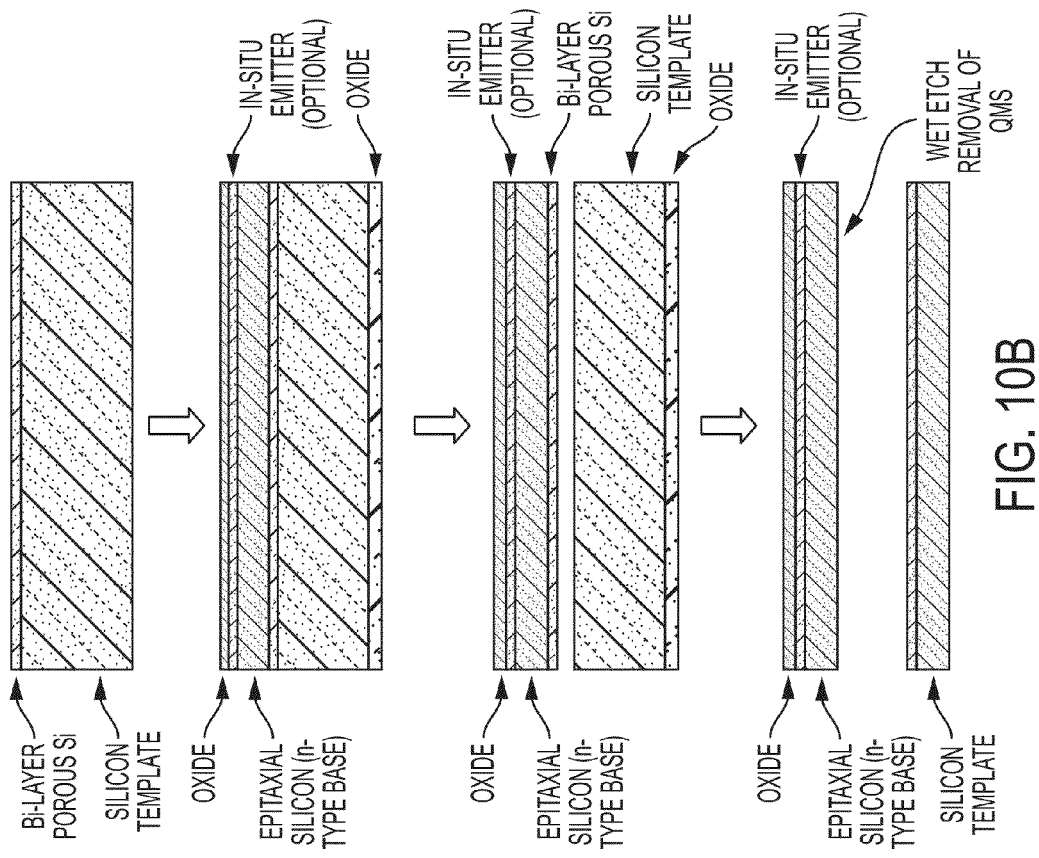
FIGS. 10A and 10B show a process flow for creation and release of a planar epitaxial thin film silicon solar cell substrate (TFSS)
Figure 10A:
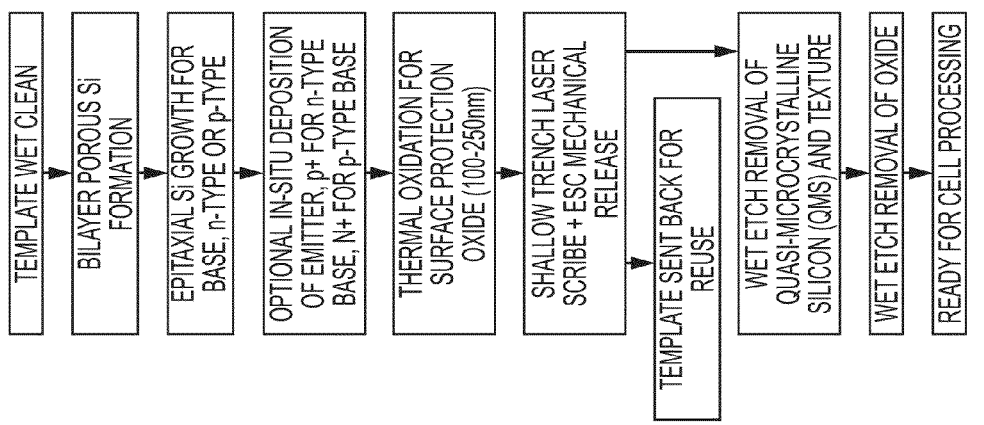
Figure 12B:
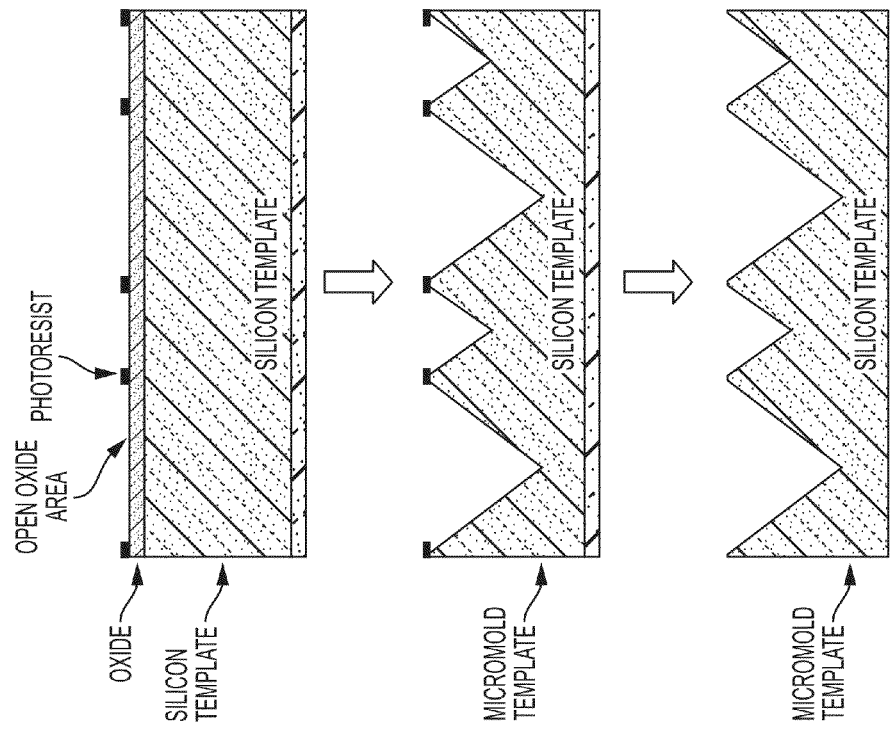
FIGS. 12A and 12B show a process flow for micromold template (or reusable template) creation for making a 3-D TFSS.
Figure 12A:
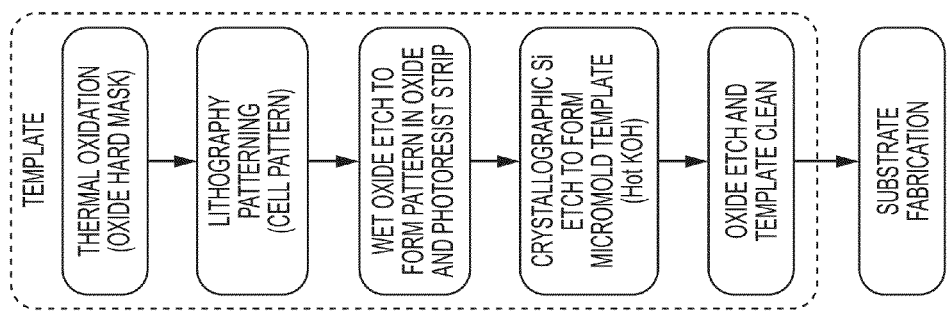

Although the laser processes and the process flows described here are applicable to any thickness of the silicon substrate (from less than one micron to over 100 microns), we disclose here their application to solar cells made using thin silicon substrates in the thickness range of from less than 1 micron to about 80 microns, including but not limited to those that are obtained using epitaxial silicon on porous silicon (or other sacrificial layer) surface of a reusable template as described in the '713 application. To facilitate the understanding of our application, the process flow for obtaining a desired thickness (e.g. from about less than 10 microns up to about 120 microns) of planar monocrystalline TFSSs according to that publication is shown in FIGS. 10A and 10B for planar TFSS that are typically greater than about 50 microns so that they can be handled as self supporting substrates during cell processing, and FIGS. 11A and 11B for planar TFSS that are typically thinner than about 50 microns so that they are not self supporting during cell processing (and hence, are reinforced prior to separation from their host templates). FIGS. 12A-12D show the process flow for obtaining three-dimensional pyramidal silicon substrates. Three-dimensional prism-shaped substrates can be obtained with similar processes, but using a lithography or screen printed pattern that provides for that structure.

Figure 13:
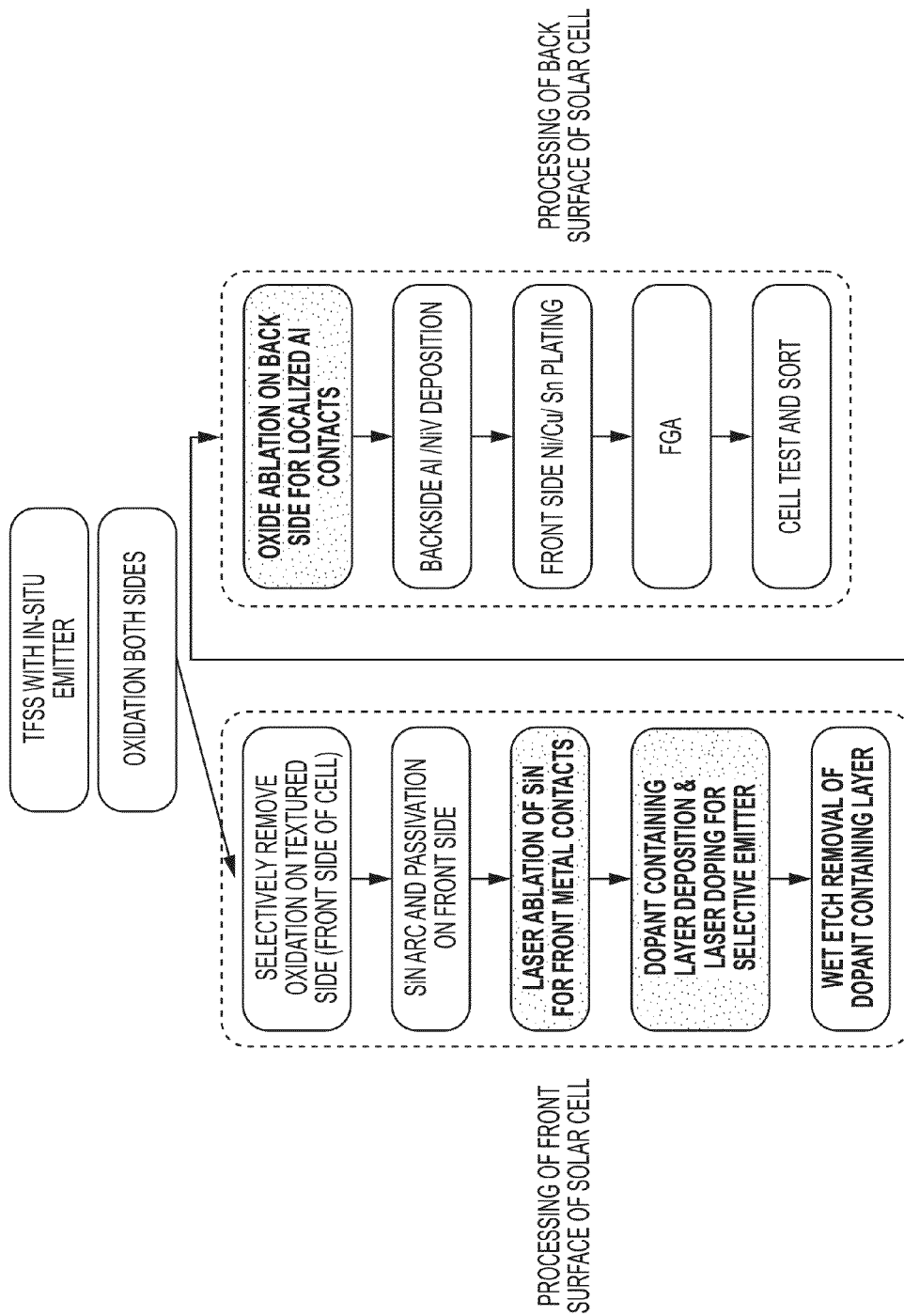
FIG. 13 shows a process flow for making a planar front contacted solar cell where the TFSS is thick enough to be free standing and self-supporting (e.g. thicker than approximately 50 microns for smaller 100 mm×100 mm substrates and thicker than approximately 80 microns for 156 mm×156 mm substrates), in accordance with the present disclosure.

The thin planar substrate obtained using the process flow of FIGS. 10A and 10B may be processed according to the process flow of FIG. 13 to obtain high efficiency front contacted solar cells. It should be noted for self-supporting TFSSs it is advantageous to process the template side of the TFSS first before proceeding to the other side. Since the template side of the TFSS is textured during the removal of the quasi-monocrystalline silicon remaining on the TFSS after its separation from the template it is preferably the frontside or sunnyside of the solar cell. The laser processes of selective ablation of silicon oxide and silicon nitride (SiN) are used to advantage in making this front contacted solar cell.

Figure 14:
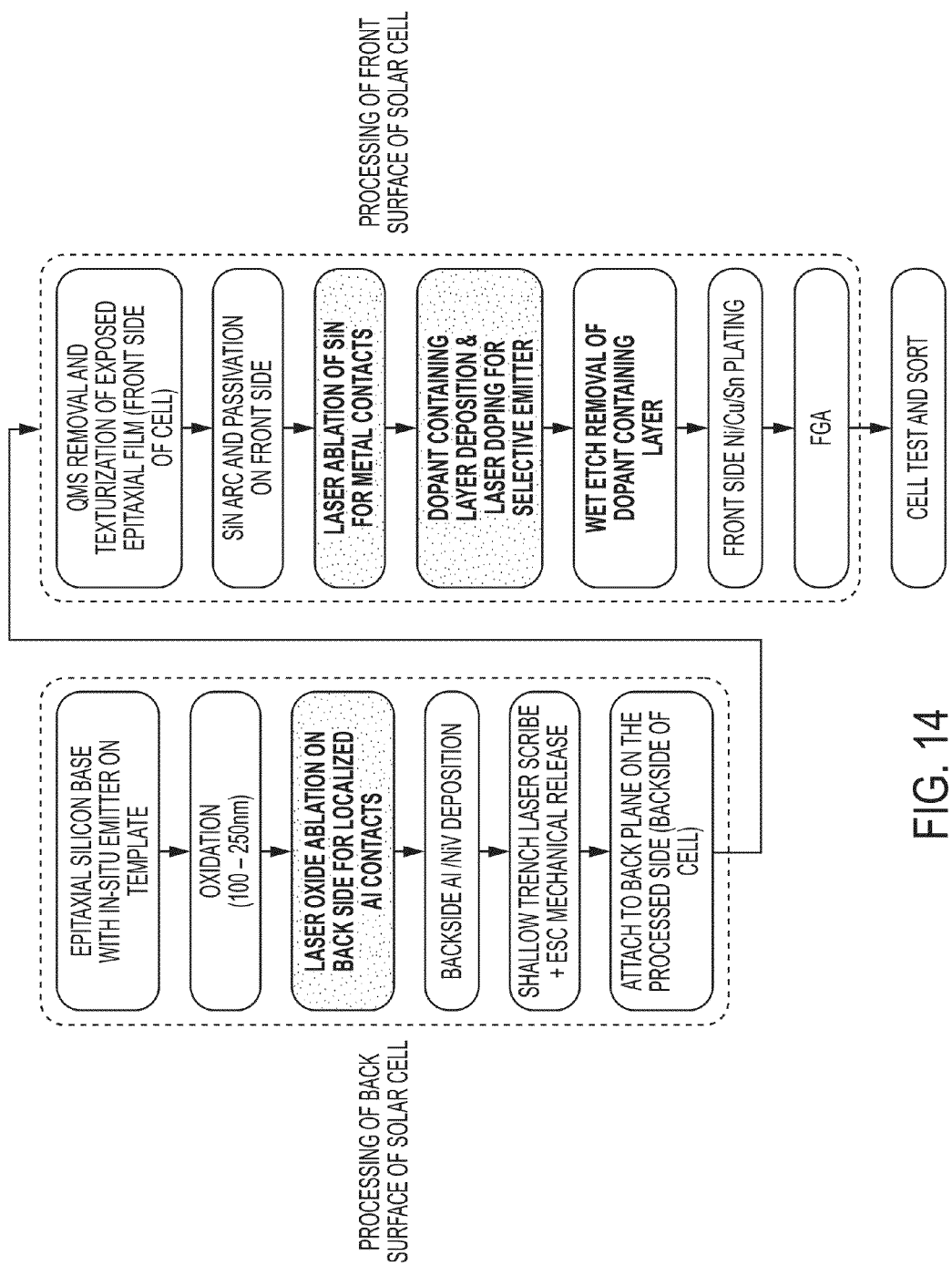
FIG. 14 shows a process flow for making a planar front contact solar cell where the TFSS is too thin to be self supporting, in accordance with the present disclosure.

FIG. 14 shows the application of various laser processes for making high efficiency front contacted solar cells using planar TFSSs where the TFSS is too thin to be free standing or self supporting during cell processing. It should be noted that in this case the non-template side surface is processed first with the TFSS on the template. Once this processing is complete the TFSS is first attached to a reinforcement plate or sheet (also called a backplane) on the exposed processed side and then separated from the template. After separation of the backplane-attached (or backplane-laminated) thin-film crystalline silicon solar cell, removal of residual porous silicon, texture etch, and SiN passivation/ARC deposition, and forming-gas anneal (FGA) operation processes are carried out on the released face of TFSS (which will end up being the front surface of the solar cell).

Figure 15:
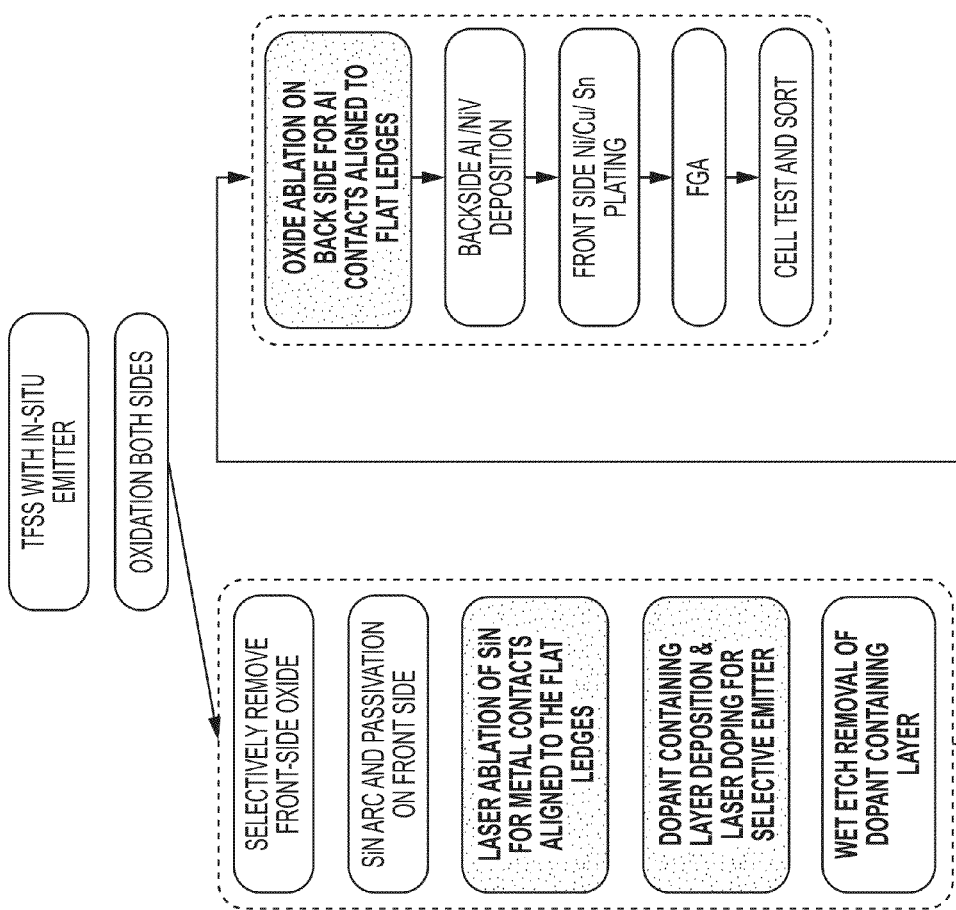
FIG. 15 shows a process flow for making a 3-D front contact solar cell in accordance with the present disclosure.
Figure 16D:
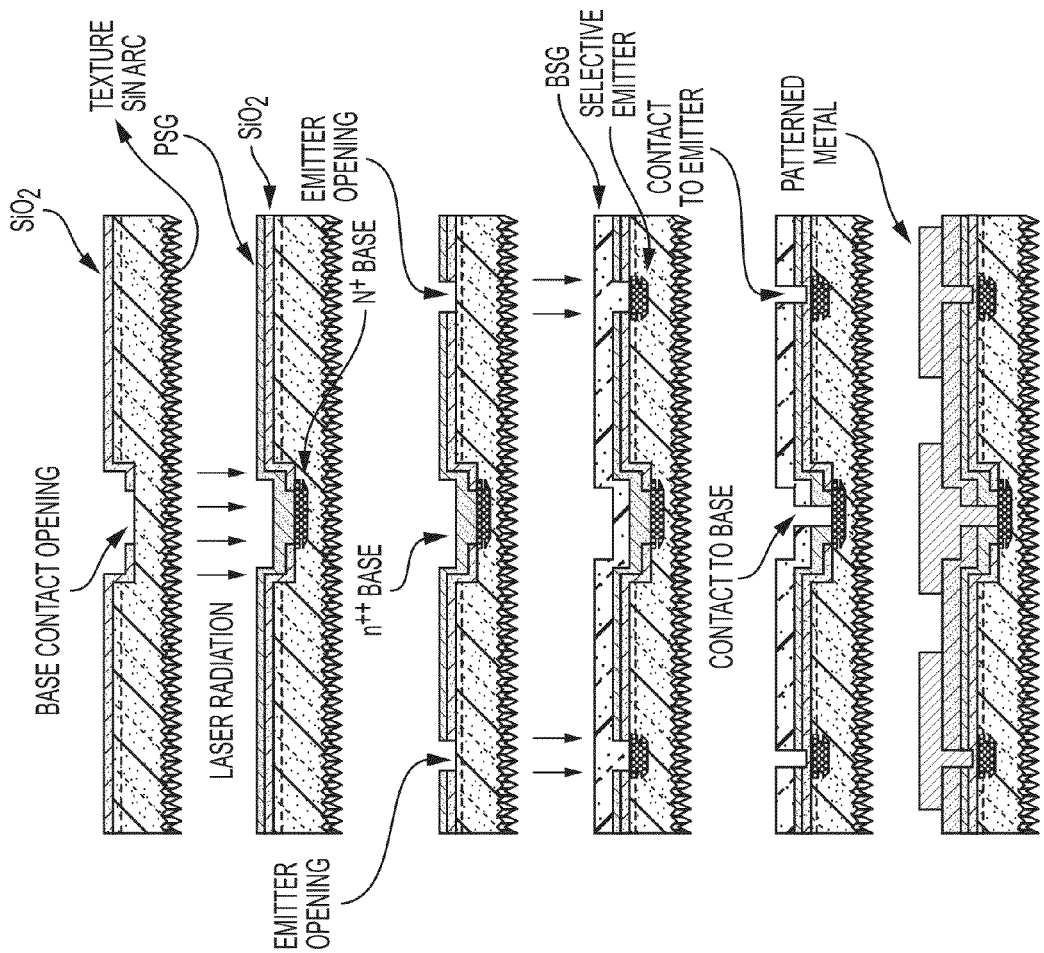
Figure 16C:
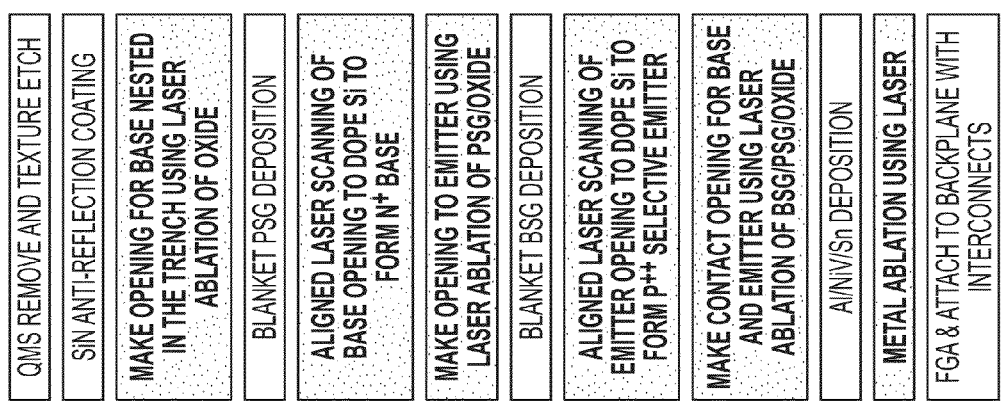

FIG. 15 shows the application of various laser processes for making high efficiency front contacted solar cells using 3-D front TFSS. For this application it is advantageous to have pyramid tips on the template side not be sharp but end in flat ledges.

The processes described here are further uniquely suited to simplifying the all back-contact cell process flow.

Figure 17:
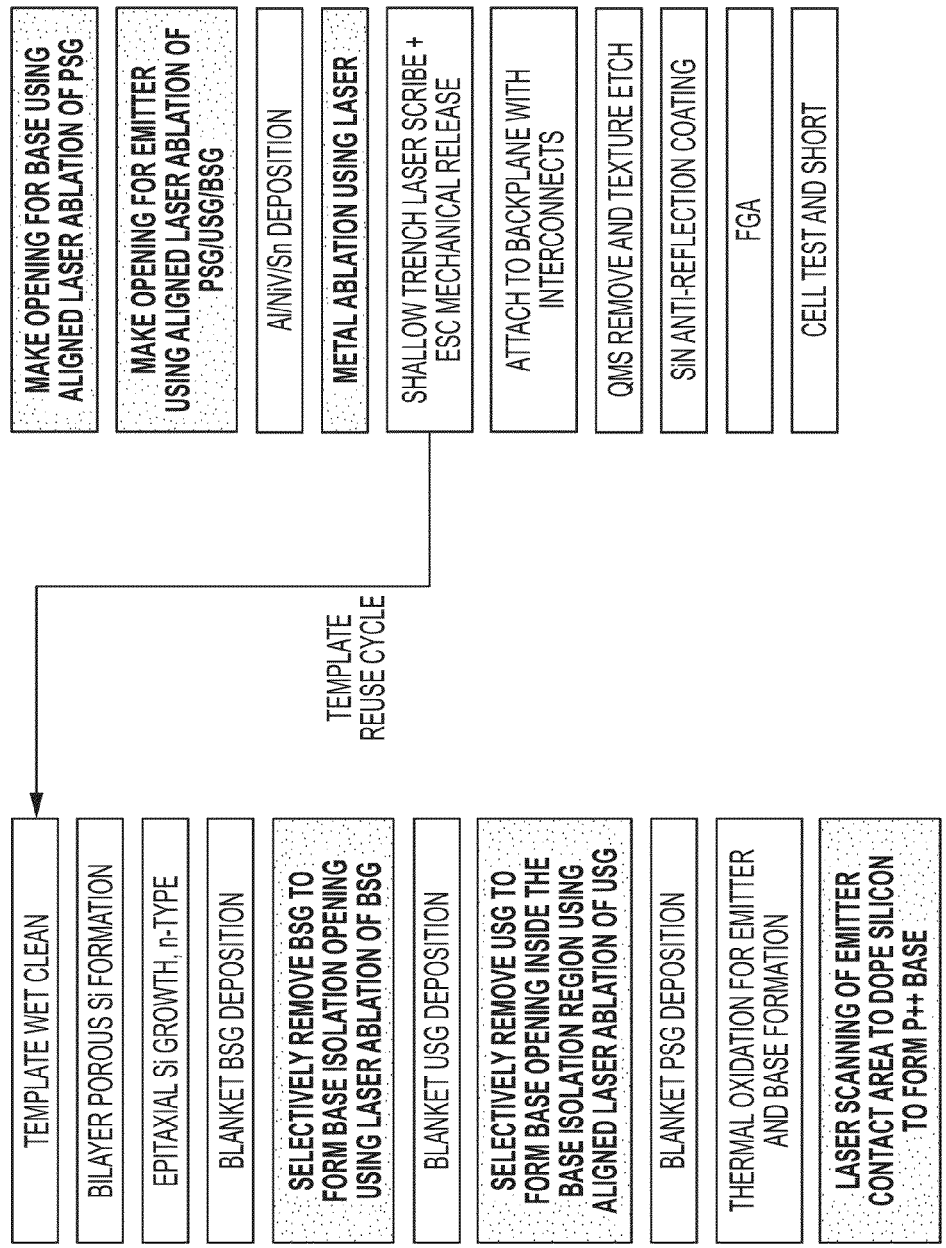
FIG. 17 shows a process flow for making an interdigitated back-contact back-junction solar cell using thick TFSS where the in-situ emitter is not deposited. Instead, a BSG (boron-doped oxide) layer is deposited on the epitaxial silicon film and patterned to open the base isolation region, in accordance with the present disclosure.

FIGS. 16A-16D show the laser processes used on the planar epitaxial substrate to make a back-contact/back-junction solar cell where the TFSS is self supporting (i.e., no backplane attachment to the cell). In this application the epitaxial emitter is deposited in-situ during silicon epitaxy following the deposition of the epitaxial silicon base. The ablation of silicon is then used to remove the emitter from the base isolation regions. At the same time four fiducials are etched into oxide to align subsequent ablation to this pattern. Next, a thermal oxide is grown to passivate the silicon surface that will become the back surface of the back-contact back-junction solar cell. The epitaxial silicon film is then disconnected or released from the template (by mechanical release from the porous silicon interface). Next, the residual porous silicon layer is wet etched and the surface is textured (both can be done using an alkaline etch process). This will become the textured front surface or the sunnyside of the solar cell. Now, the thermal oxide is ablated using a picoseconds UV laser to form base openings inside the base isolation region. The base opening is aligned inside the base isolation region (trench) formed by silicon ablation earlier using the fiducials that were etched in silicon earlier as mentioned above. Next a phosphorous containing oxide layer (PSG) is blanket deposited on the surface. Scanning with a nanosecond green or IR laser aligned to base opening using the fiducials in silicon causes the base to be doped. Also, the region that will have the contact openings to emitter is also doped in a similar manner using the aligned scans of nanosecond green or IR laser. Next, contact opening are made to these doped base and emitter areas using a picoseconds UV laser. Again, the alignment of these contact openings is made using fiducials in silicon. Now, a metal stack layer comprising aluminum as its first layer in contact with the cell (e.g., a stack of 1250 A Al/100-250 A NiV/2250 Sn) is deposited using a suitable method such as a PVD (physical vapor deposition) technique. Next, this layer is patterned using a picoseconds IR laser so that the metal runners are separately connected to the base and emitter regions. After an optional forming gas anneal (FGA), the cell is connected to and reinforced with a backplane with either embedded (Al or Cu) high-conductivity interconnects or no embedded interconnects (in the latter, the final cell metallization can be formed by a copper plating process). The cell is now ready for test and use. FIG. 17 shows the laser processes used on the planar epitaxial substrate to make a back-contact solar cell where epitaxial silicon base is not deposited with an emitter layer. Instead, a boron containing oxide (BSG) layer is deposited and patterned to open the base isolation region. A similar process to that described above is followed except that now the emitter and base are formed simultaneously during a thermal oxidation step according to the process flow outlined in FIG. 17.

Figure 18:
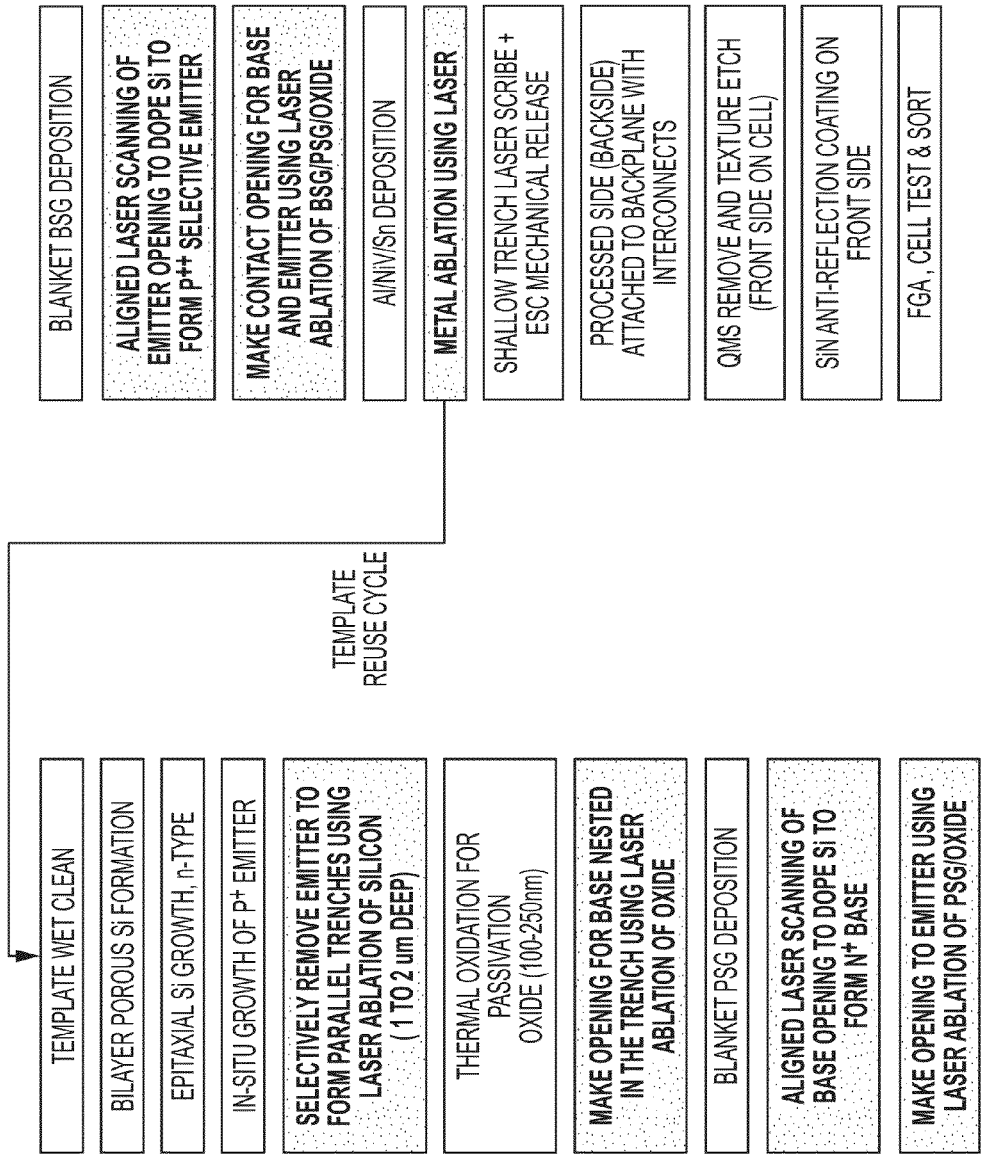
FIG. 18 shows a process flow for making an interdigitated back-contact back-junction solar cell where the TFSS is not thick enough to be self supporting, where in-situ emitter and laser ablation of silicon is used to form the base isolation opening, in accordance with the present disclosure.
Figures 19A, 19B:
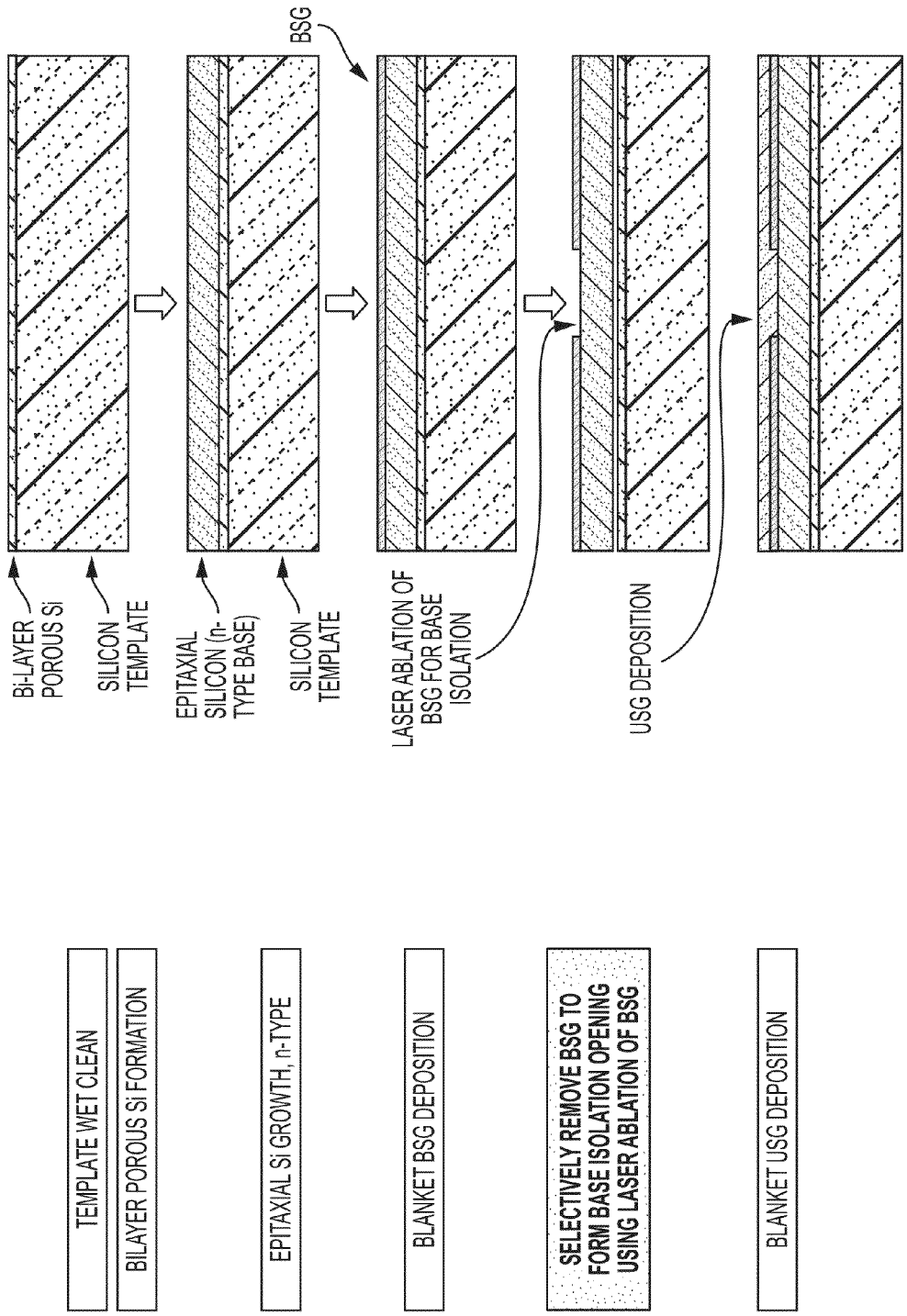
Figures 19E, 19F:
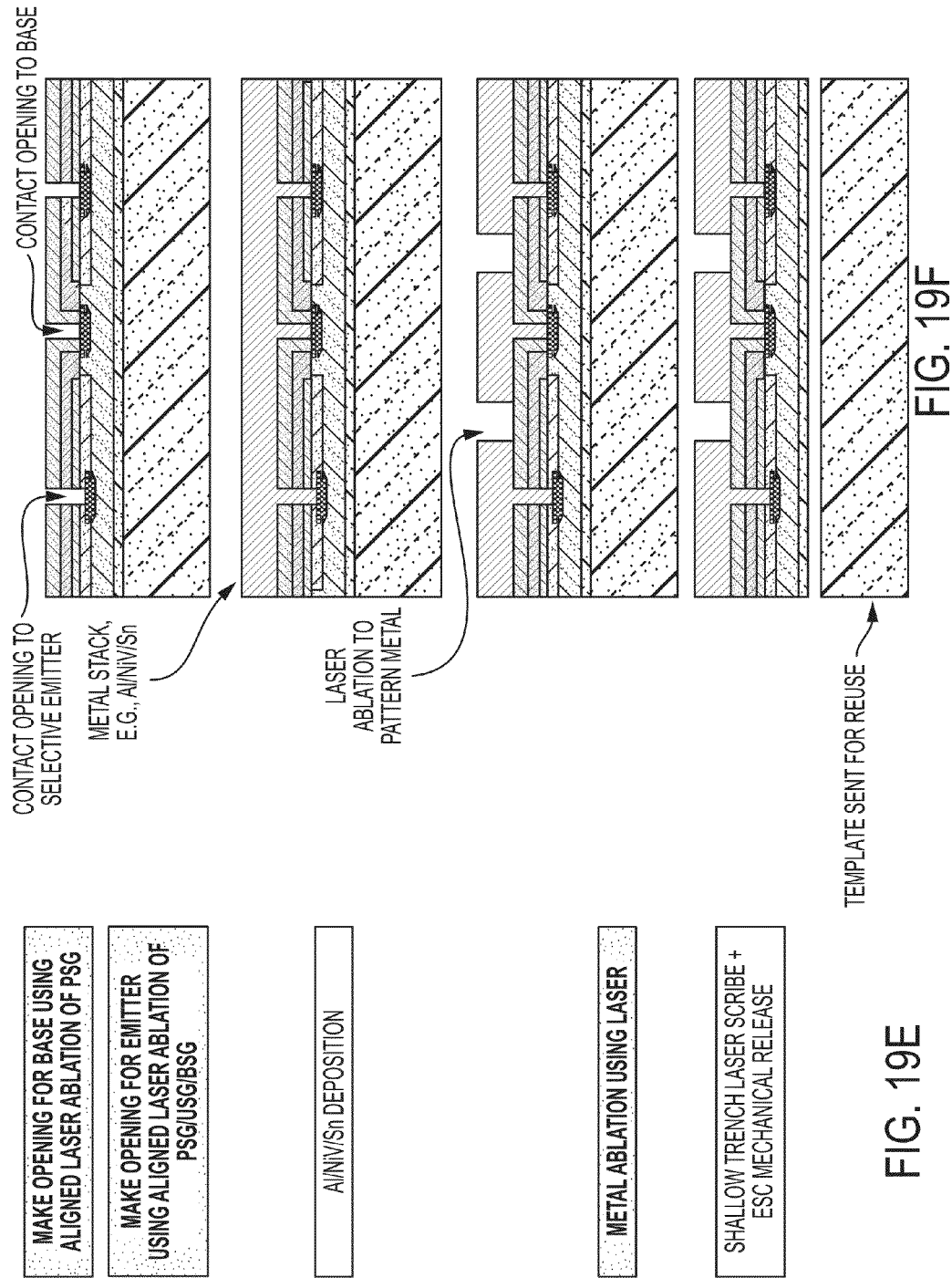

FIG. 18 shows a process flow using laser processes on the epitaxial substrate to make a planar back-contact/back-junction solar cell where the TFSS is not self-supporting (hence, a backplane is used). This flow uses the silicon ablation of in-situ doped emitter to form the base isolation region.

FIG. 19A-19H show a process flow using laser processes on the epitaxial substrate to make a planar back contact solar cell where the TFSS is not self-supporting. In this flow, instead of an in-situ emitter layer, the BSG deposition and selective laser ablation followed by thermal oxidation (or a thermal anneal or a thermal oxidizing anneal) is used to form the emitter as well as the base isolation region.

Figure 20:
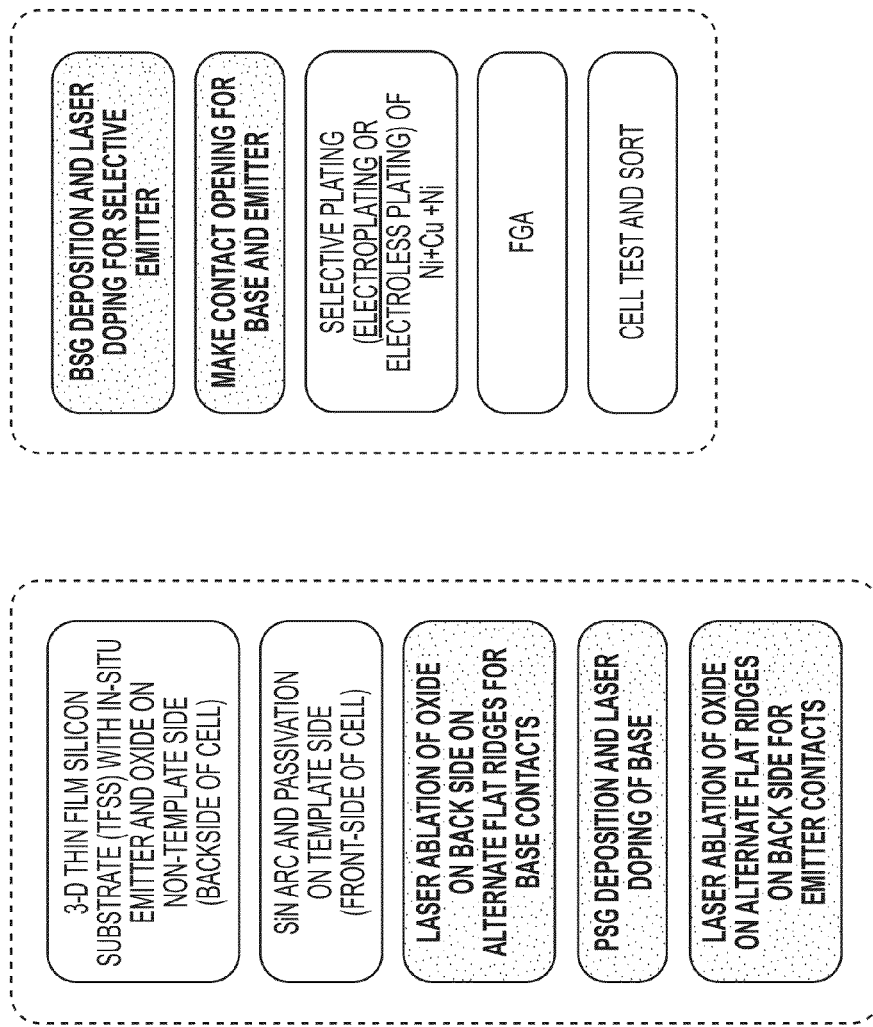
FIG. 20 shows a process flow for making an interdigitated back-contact back-junction solar cell using a 3-D TFSS, in accordance with the present disclosure.

FIG. 20 shows a process flow for making back contacted 3-D solar cells, it is advantageous to have the template side of pyramids end in relatively sharp points. Since the 3-D TFSS can be self-supporting to relatively low thickness (e.g., silicon as thin as about 25 microns), the process flow is similar to that shown in FIG. 16. It should be clear that we again have a choice of using the in-situ emitter followed by laser ablation of silicon, or BSG deposition and selective laser ablation followed by thermal oxidation (or thermal anneal, or thermal oxidizing anneal).

Figure 21:
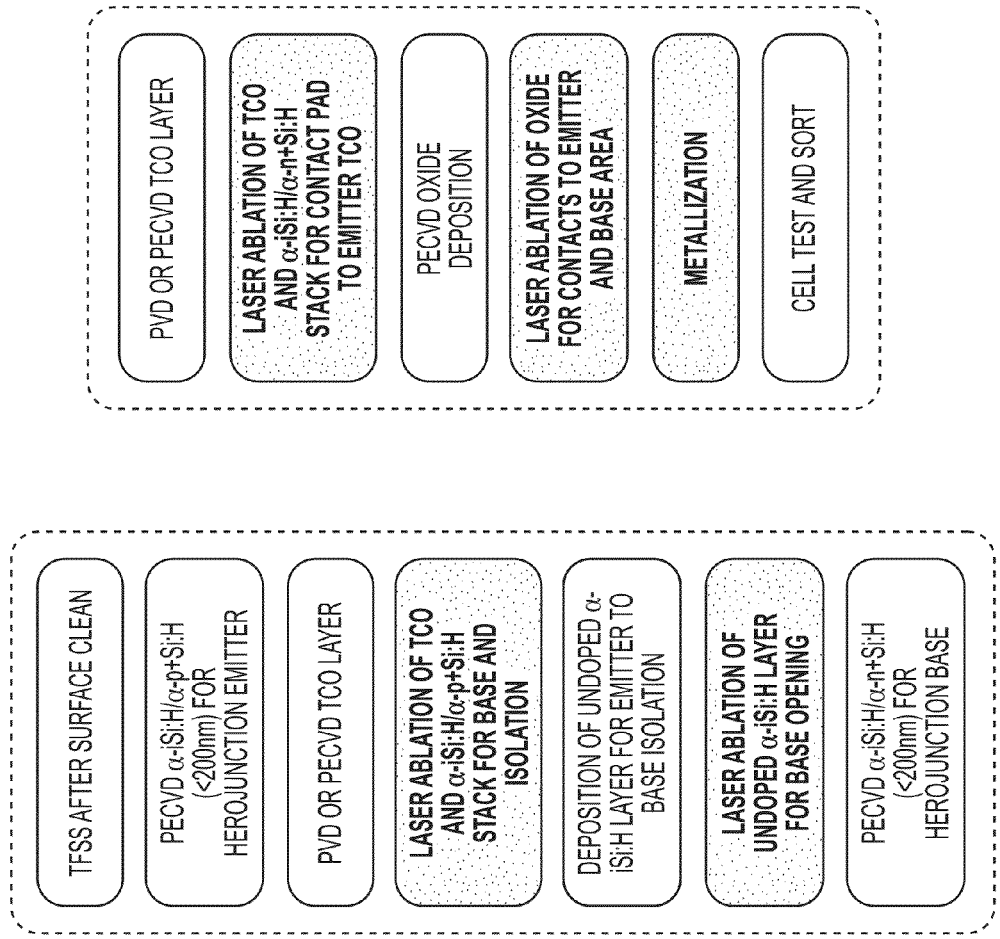
FIG. 21 shows a process flow for making an interdigitated back-contact back-junction hetero junction solar cell, in accordance with the present disclosure.

For applications in hetero junction solar cells, a hetero junction emitter may be formed by a doped amorphous silicon layer in contact with an oppositely doped crystalline silicon base. For interdigitated back contact solar cells we pattern the amorphous silicon layer and the transparent conducting oxide (TCO) using laser ablation that is selective to the crystalline layer. Femtoseconds pulsewidth lasers with either UV or green wavelength are suitable for this application. A process flow is described in FIG. 21. Several variations of this process flow are possible.

Various embodiments and methods of this disclosure include at least one of the following aspects: the process to obtain silicon ablation of crystalline and amorphous silicon with reduced damage; the process to obtain oxide ablation for both doped and undoped oxides with no or reduced damage to silicon; the process to obtain fully isolated metal patterns on a dielectric surface for solar cell metallization; the process to selectively dope the emitter and base contact regions; the use of pulsed laser processing on very thin wafers, including planar and 3-D silicon substrate; the use of pulsed laser processing on substrates obtained using epitaxial deposition on a reusable template made using template pre-structuring techniques; the use of various pulsed laser processes in making front contacted homo-junction solar cells; the use of various pulsed laser processes in making all-back contacted homo-junction solar cells; and the use of various pulsed laser processes in making hetero junction solar cells.

Although the front contact solar cells are described with p-type base and back-contact back-junction solar cells are described with n-type base, the laser processes described here are equally suited to the substrate with opposite doping, i.e., n-type for front contact solar cell with P+ emitter, and p-type base for back-contact back-junction solar cells with p-type base and n+ emitter.

The following description, tables, and figures disclose the application of flat top laser beams to laser processing methods for interdigitated back-contact cells (IBC). The description following is directed towards methods for the formation of back contact solar cells utilizing flat top laser beams as compared to traditional Gaussian laser beams. Further, the implementation of flat top laser beams to the laser processing methods described throughout this application provides substantial reduction in damage to silicon, improvement in solar cell fabrication throughput, and a bigger alignment window for defining patterns (e.g. patterns of emitter and base regions) that are inset inside another pattern.

Figure 22:
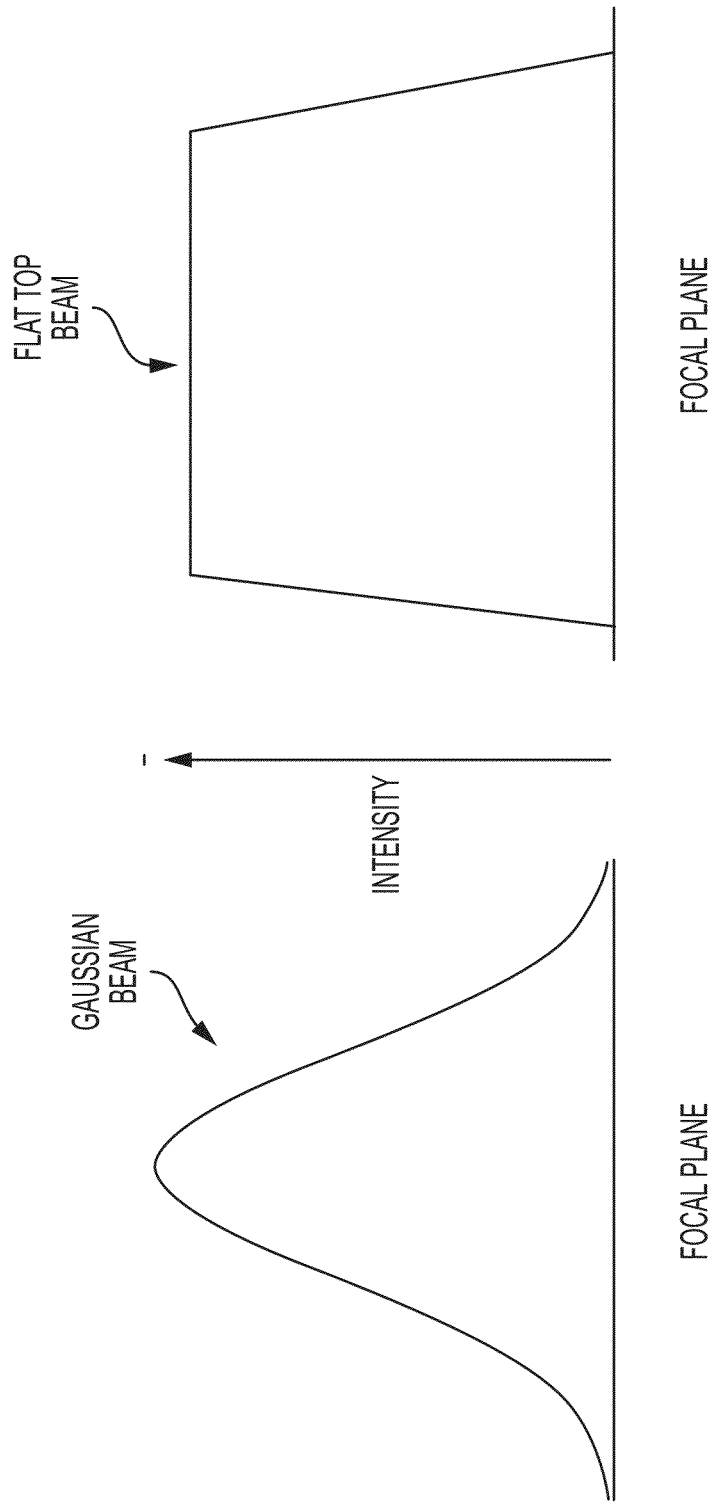

FIGS. 22A and 22B are schematics showing the profile of a Gaussian beam, FIG. 22A, and a flat top beam, FIG. 22B. The beam intensity of the Gaussian beam has a smooth decrease from a maximum at the beam center to the outside of the beam. In contrast, the intensity is "flat" or uniform for the flat top beam through most of its profile (center to outside).

Figure 23:
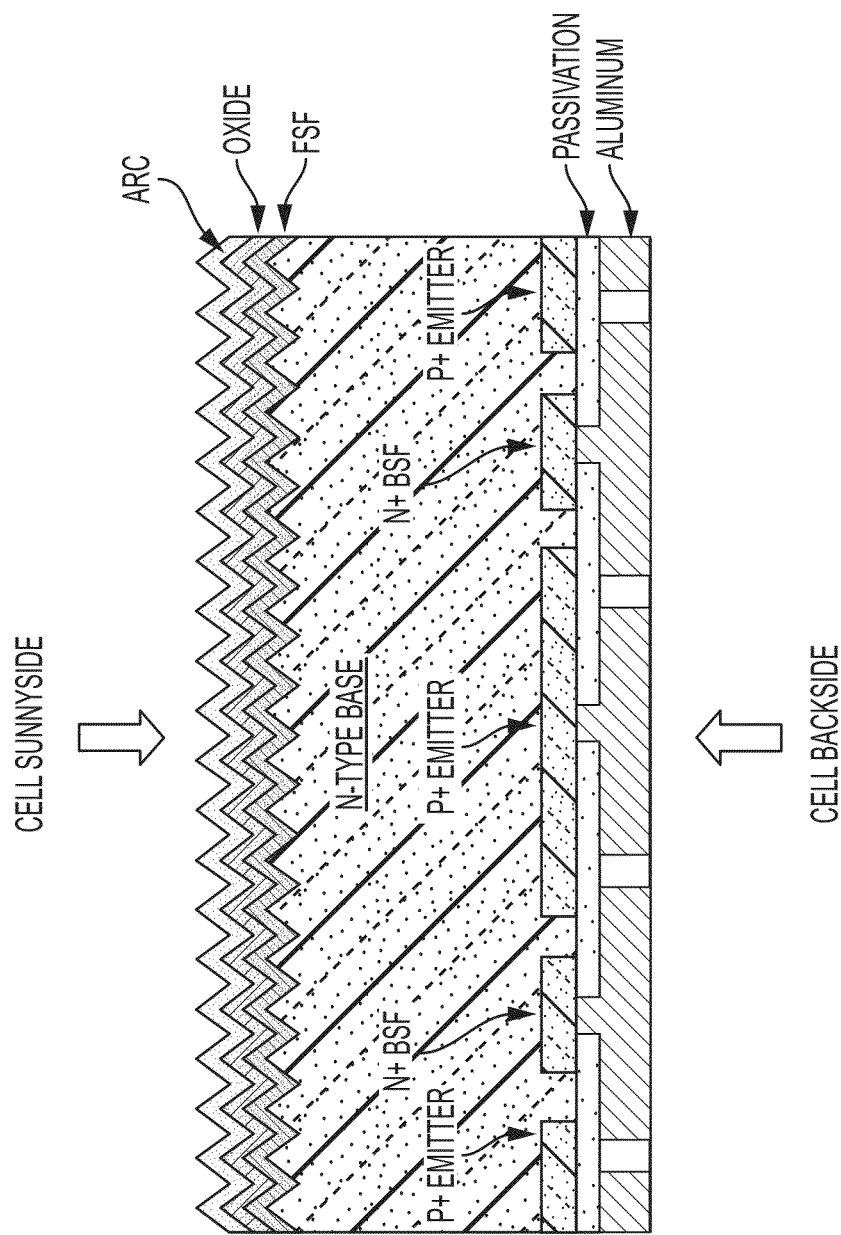

As disclosed herein, high-efficiency back-contacted, back-junction cells with interdigitated back contact (IBC) metallization benefits from the use of at least one or several steps of pulsed laser processing. Laser processing may be utilized in several processing throughout the formation of the back contact cell, including: defining emitter and base regions (or base-to-emitter isolation), defining back-surface field (BSF) regions, doping to form back surface fields, opening contacts in the dielectric to base and emitter, and metal patterning. Some of these steps require laser processing of wide areas that are typically produced by overlapping Gaussian beam laser spots. Overlapping severely reduces cell processing speed and may cause silicon damage, resulting in degradation of cell performance and yield. By replacing smaller diameter Gaussian spots with a relatively wide flat top laser beam, substantial improvement in throughput is obtained. And because the overlapping of spots is dramatically reduced, the semiconductor (e.g., crystalline silicon) substrate damage is reduced significantly. FIGS. 23-25 illustrate embodiments of back contact solar cells that may be formed according to the disclosed flat top laser beam processing methods.

FIG. 23 is a cross-sectional diagram of a back-contact/back junction cell with interdigitated back-contact (IBC) metallization formed from an n-type substrate, such as that disclosed herein. As shown in FIG. 23, alternating emitter and base regions are separated by relatively lightly n-doped substrate regions (the n-type base). The rear/backside surface is covered by a surface passivation layer that provides good surface passivation with low back surface recombination velocity, made of, for example: thermal silicon dioxide, deposited silicon dioxide, or silicon oxide/silicon nitride layers which may be deposited using techniques such as PECVD or APCVD (and/or aluminum oxide deposited by atomic layer deposition or ALD). This surface passivation process may then be followed by making openings in this passivation layer which act as 'localized contacts' to the emitter and base regions. Then conductor deposition and patterning (e.g., aluminum as shown in FIG. 23) may be performed to separately connect the emitter and base regions.

Figure 24A:
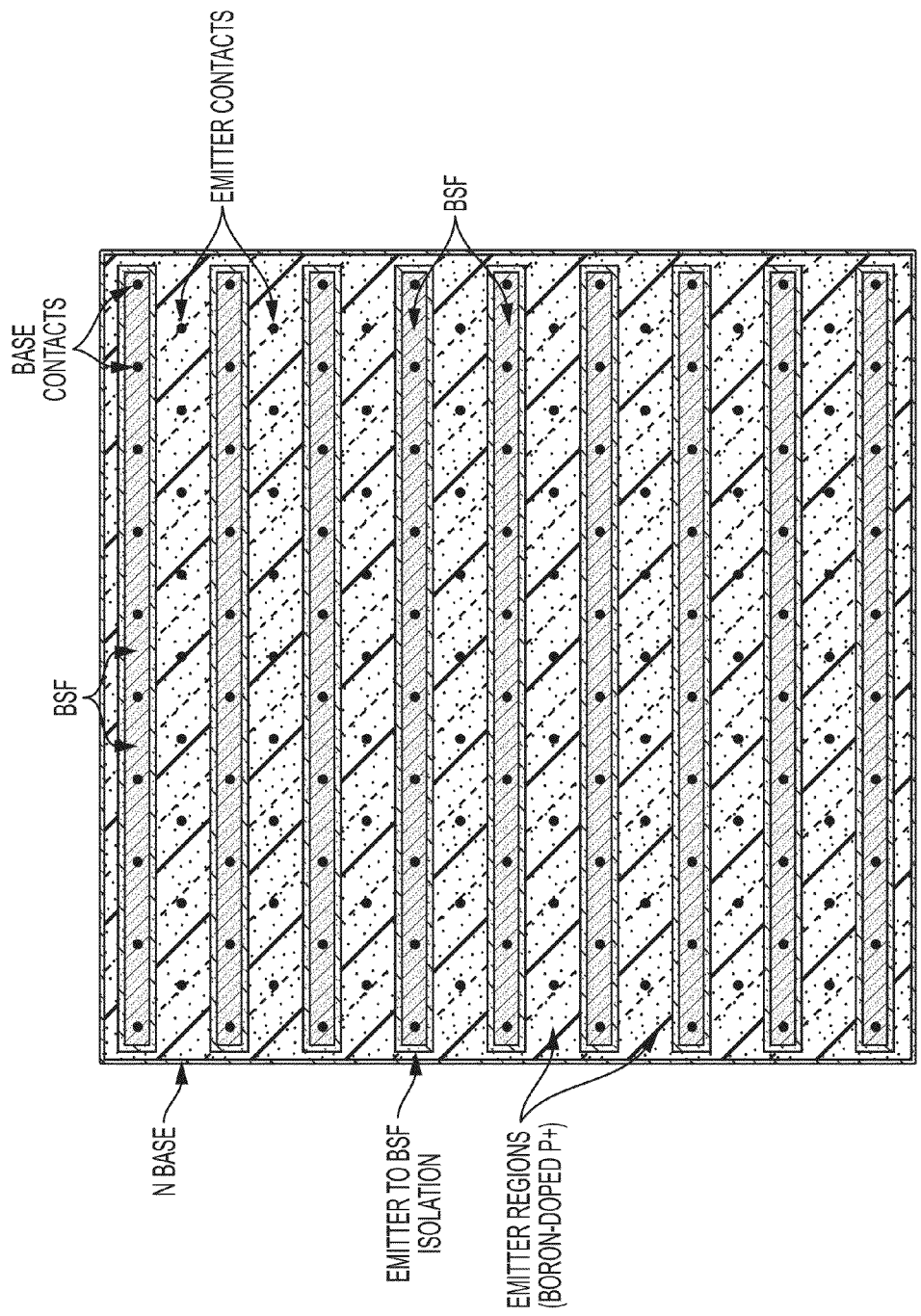
FIGS. 24A-24F are rear/backside views of a back contact solar cell during fabrication.
Figure 25:
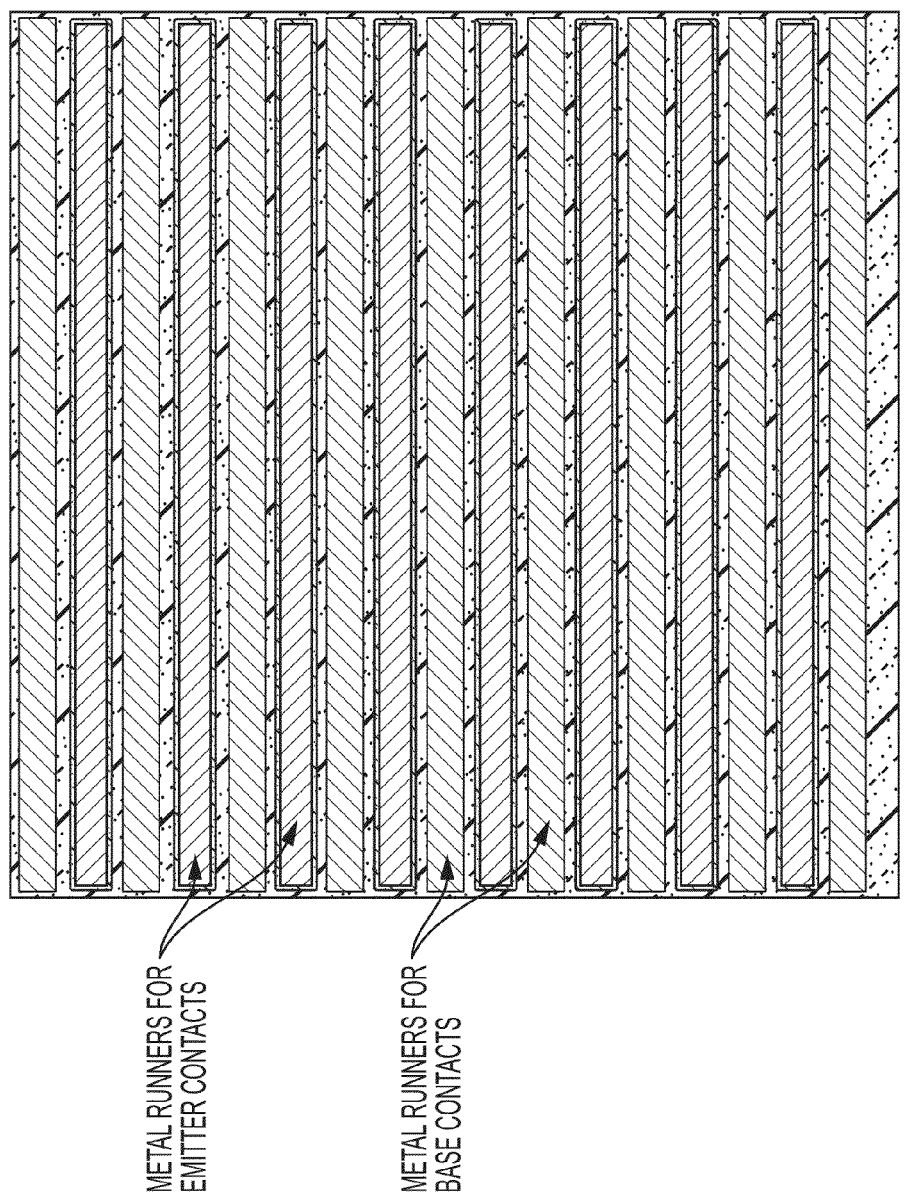

FIG. 24A is a rear/backside view of a back contact solar cell illustrating an interdigitated back contact base and emitter design with the emitter and base regions laid out in alternating parallel rows. This backside may be formed, for example, by starting with a surface that is completely covered by an emitter region, then delineating a base region resulting in the formation of the patterned emitter regions. Then doping base contact regions with phosphorous is carried out and contacts are opened to the base and emitter regions in preparation for metallization.

Figure 24B:
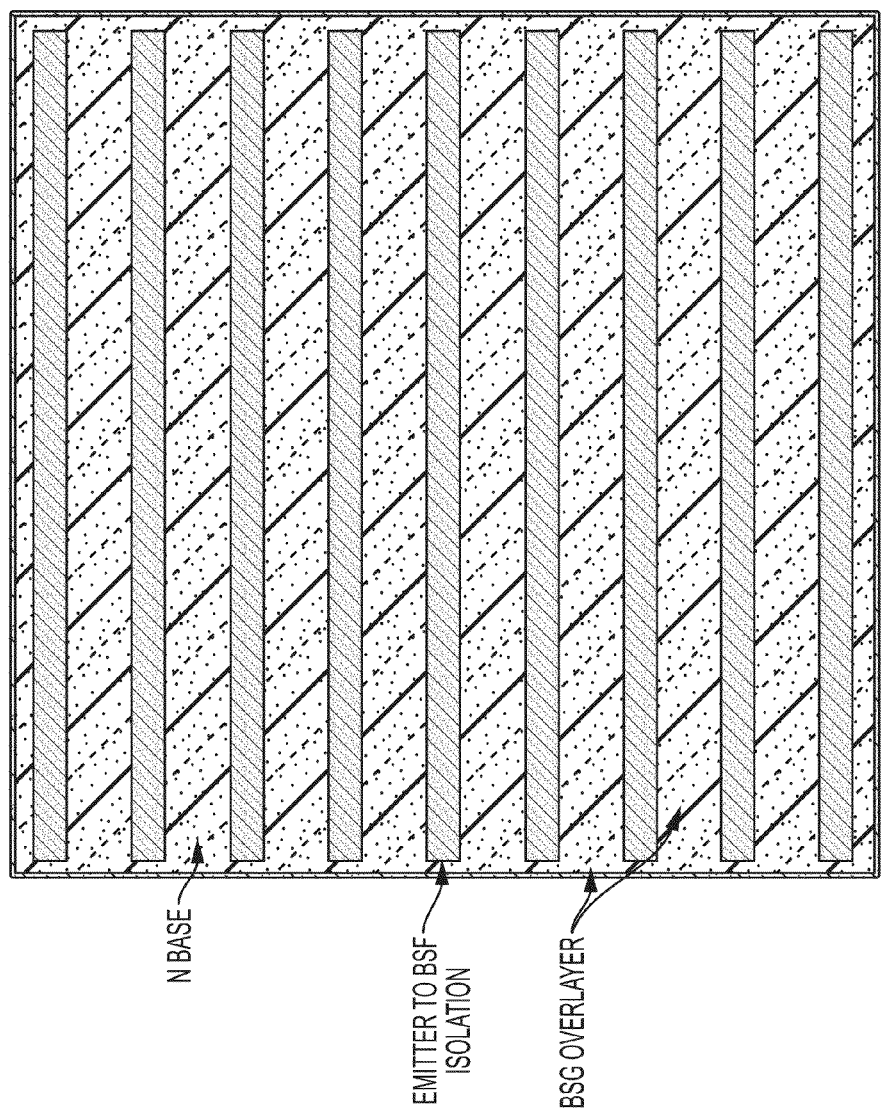

FIGS. 24B-24F are rear/backside views of a back contact solar cell illustrating the back contact cell after key processing steps, wherein any one step or combination of steps may be performed according to a laser process which may or may not utilize a flat top beam. The various laser patterning steps of this particular exemplary method are outlined in FIGS. 24B-24E. Starting with an n-type silicon substrate, a BSG layer is deposited over the whole surface. Next, the emitter to BSF isolation region is defined using laser ablation of the BSG as shown in FIG. 24B. This step, the delineation of base and emitter regions, is referred to herein as the "BSG Opening" step. Alternatively, an in-situ boron doped layer may be deposited during silicon epitaxy and the BSF region defined using laser ablation of silicon.

Figure 24C:
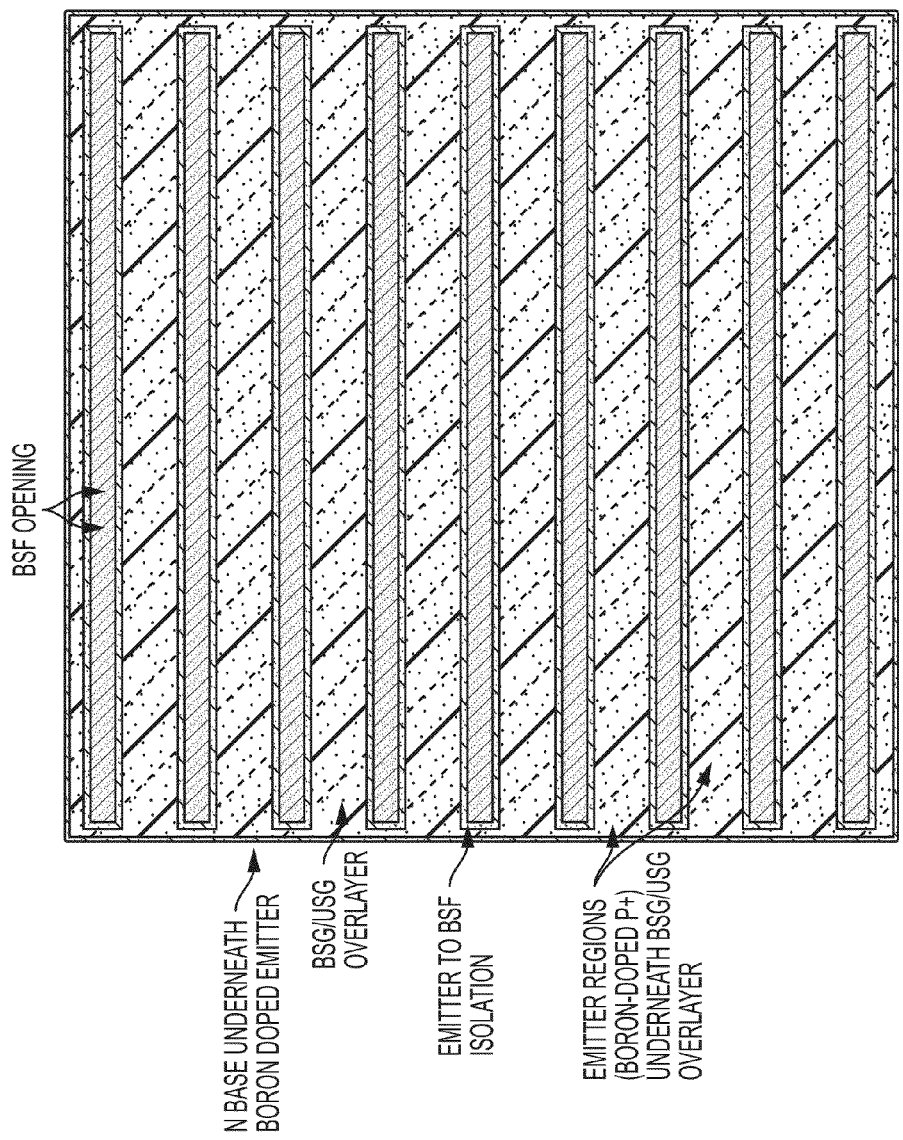
Figure 24D:
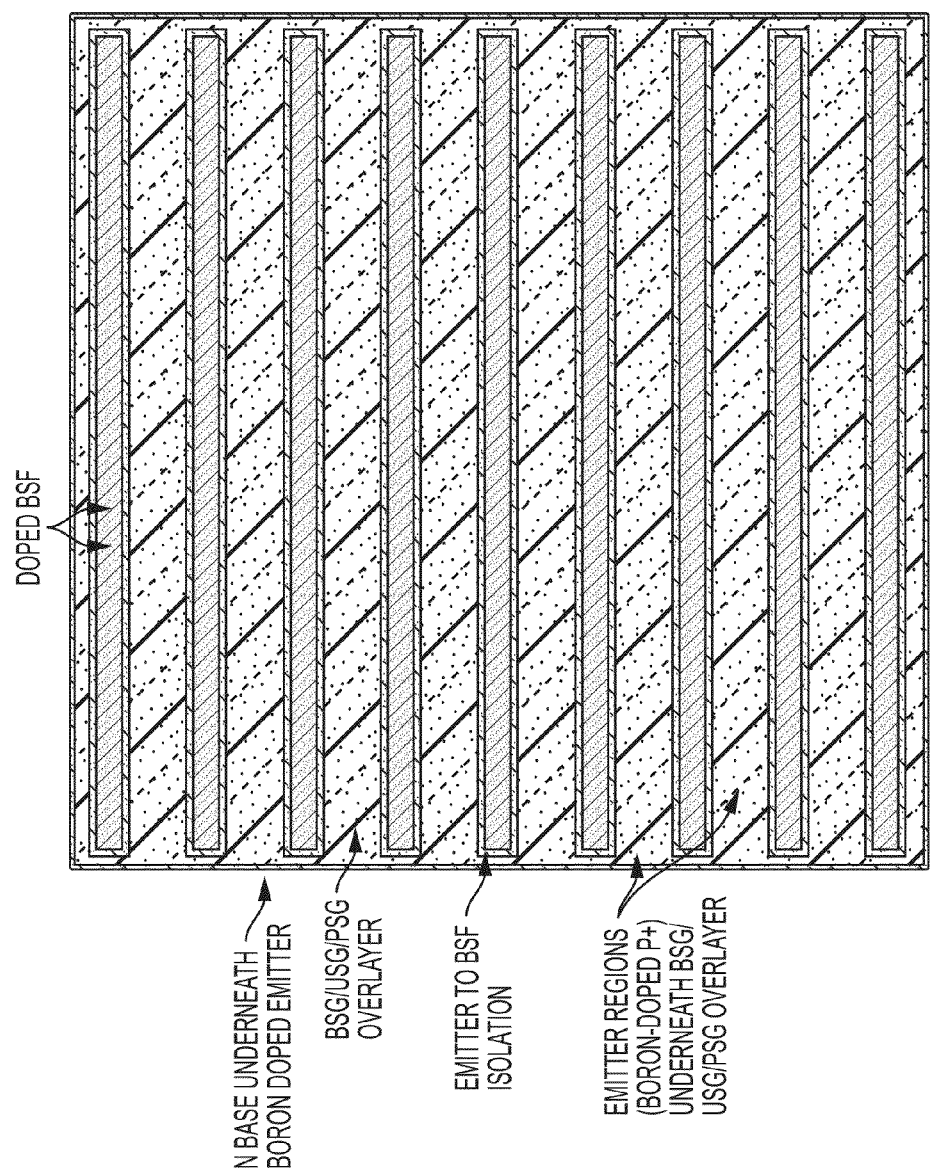

After the emitter to BSF isolation region is defined in the BSG Open step, a USG layer is deposited on the wafer followed by laser ablation of this layer in patterns that are inlaid to the BSG Open region, as shown in FIG. 24C. This patterning step is referred to herein as the BSF Opening step or base opening step. The BSF openings should be isolated from the edges of the BSG Openings to prevent shunt formation as shunts are deleterious to the solar cell efficiency.

Figure 24E:
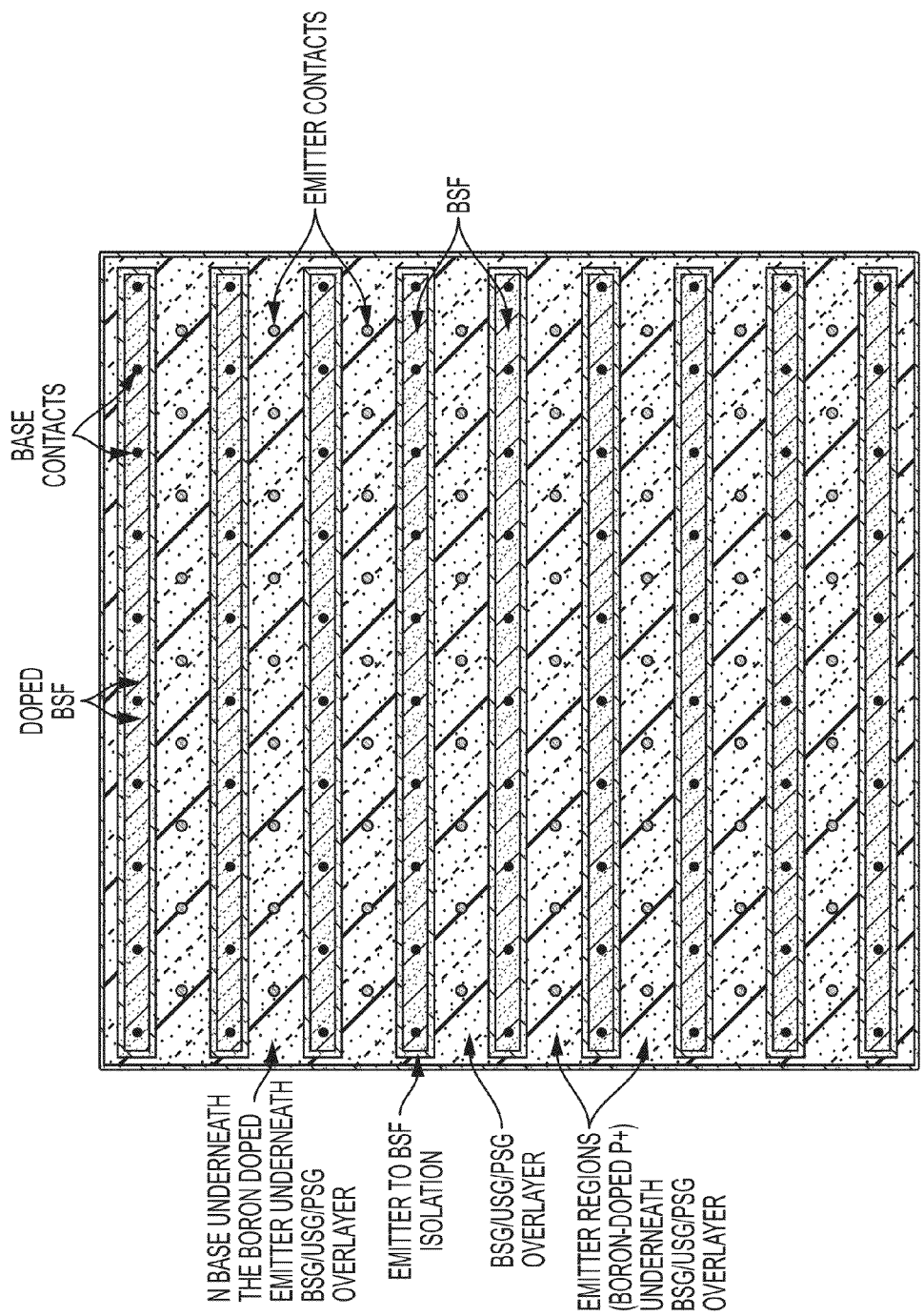
Figure 24F:
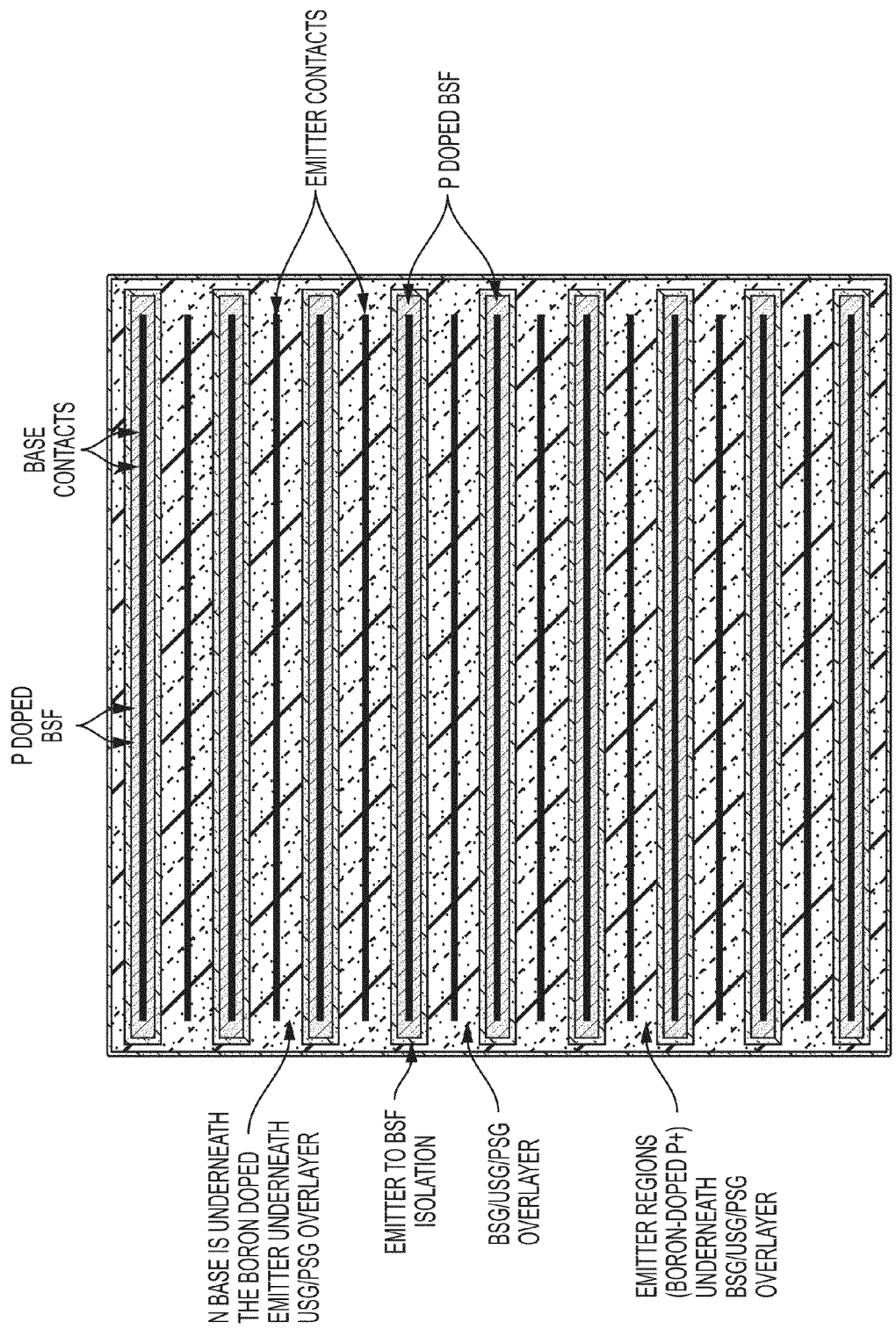

Next, a PSG layer is deposited on the wafer and the silicon exposed to PSG in the BSF opening is doped using selective laser scans of this area. The doped BSF regions (base regions) are outlined in FIG. 24D Next, the contacts to base and emitter are made using laser ablation as shown in FIG. 24E. It should be noted that the contacts may be point contacts as shown in FIG. 24E or line contacts as shown in FIG. 24F. Also, the number of contacts or the number of lines should be optimized for minimum series resistance of the current conduction path for the solar cell—thus the designs and methods of the disclosed subject matter are not limited to the exemplary embodiments shown herein. It is also important that the contact openings are properly aligned inside the particular doped area so that there is no current leakage.

As disclosed previously, a picoseconds pulse length laser may be used for oxide ablation processes of BSG open, BSF opening, and contact opening, although a nanoseconds pulse length laser may also be used. Further, although IR wavelength may be used, green or UV or smaller wavelengths are more suitable because of their reduced penetration into silicon.

For BSF doping particularly, a nanoseconds pulse length laser may be more suitable because of its penetration into silicon. And although IR wavelength may be used, green wavelength, because of its reduced penetration compared to IR, may be more suitable for the depth of doping typically desired.

FIG. 25 is a rear/backside view of the back contact solar cell of FIG. 24A with alternating metal lines contacting the emitter and base regions. Note that the metal lines for the emitter and base regions are separately connected to busbars not shown in FIG. 25 for simplicity of the figure. This metal pattern may be formed by blanket deposition of a metal followed by laser ablation of the metal to isolate base contacts from emitter contacts. Because relatively thick metal lines are required for good current conduction (usually lines 20 µm thick or thicker), a thinner metal stack such as aluminum/nickel-vanadium/Tin may be first deposited and patterned by lasers, followed by the selective deposition of a thicker metal such as copper using electro or electroless plating. Alternatively, a backplane with relatively thick conductors may be applied and attached to the cell with thin conductor lines. A picoseconds pulse length laser with IR wavelength may be most suitable for ablating the metal stack with good selectivity to the underlying oxide layer.

Figure 26A:
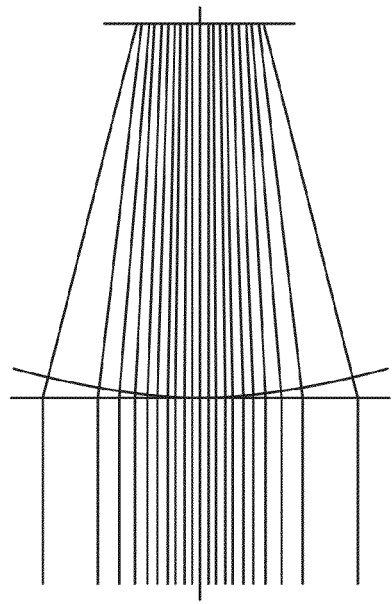
FIGS. 26A-26C are diagrams illustrating three ways a flat-top beam profile may be created.
Figure 26B:
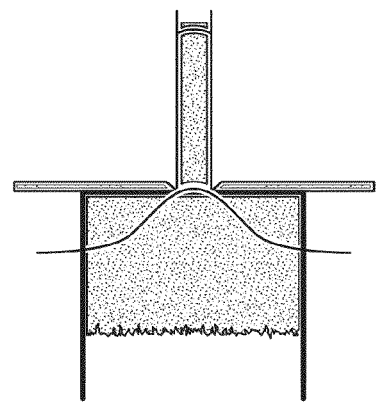
Figure 26C:
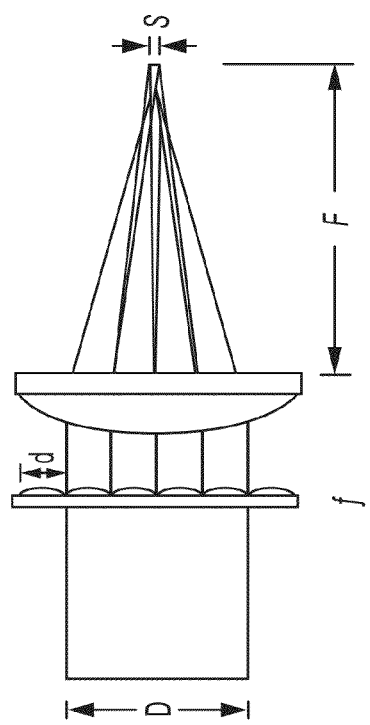

The disclosed flat top laser beam processing steps that may be utilized to make this structure possible include, but are not limited to: delineation of emitter and base regions (BSF and emitter to BSF isolation) by laser ablation of an emitter or deposited boron doping dielectric (such as boro-silicate glass BSG deposited by APCVD); delineation of the BSF region by opening the dielectric covering the opening made in the BSG; N+ doping of the base (e.g., with phosphorus); opening of metallization contacts to base and emitter regions; and metal patterning using metal laser ablation to isolate base and emitter contacts. FIGS. 26A-26C are diagrams illustrating three ways a flat-top beam profile may be created (diagrams reproduced from F. M. Dickey and S. C. Holswade, "Laser Beam Shaping: Theory and Techniques", Mercel Dekker Inc., NY, which is hereby incorporated by reference in its entirety). FIG. 26A illustrates one technique for creating a flat top beam profile, the so-called "aperturing of the beam." Using this method, the Gaussian beam is made flatter by expanding it and an aperture is used to select a reasonable flat portion of the beam and to cut-out the gradually decreasing 'sidewall' areas of the beam. Using this method, however, may cause a significant loss of beam power.

A second example method for creating a flat top beam, as shown FIG. 26B, uses beam integration wherein multiple-aperture optical elements, such as a micro-lens array, break the beam into many smaller beams and recombine them at a fixed plane. This beam integration method may work very well with beams of high $M^2$ value.

A third beam shaping system for creating a flat top beam, as shown FIG. 26C, uses a diffractive grating or a refractive lens to redistribute the energy and map it to the output plane. Any known method, including the three example techniques disclosed in FIGS. 26A-26C, may be used obtain the flat top beam profile for applications described herein. The suitability and choice of a flat top laser beam formation method depends on a variety of factors including the available beam characteristics and the results desired.

Figure 27B:
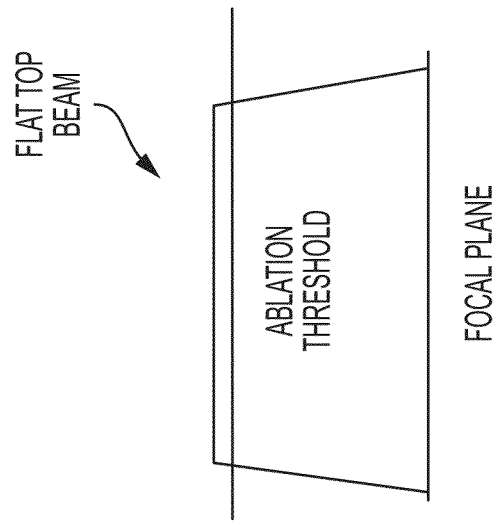
FIGS. 27A and 27B are schematics showing the profile of a Gaussian beam and a flat top beam highlighting the ablation threshold.
Figure 27A:
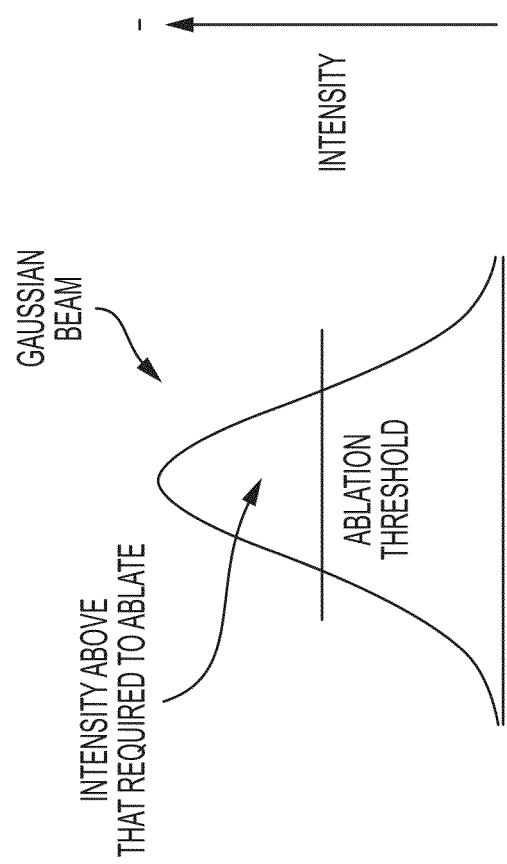

FIGS. 27A and 27B are schematics showing the profile of a Gaussian beam and a flat top beam highlighting the ablation threshold. As shown in FIGS. 27A and 27B, a flat top laser beam, particularly as compared to a Gaussian beam, can substantially reduce the laser damage during ablation and doping processing. For Gaussian beams there is substantial excessive laser intensity above that required for ablation, particularly in the center of the beam, that can cause damage of silicon (as shown in FIG. 27A). The flat top beam can be configured so the peak intensity is only slightly above that required to ablate the material (the ablation threshold as shown in FIG. 27B) and the damage that may be caused by the high intensity of the Gaussian beam is avoided.

Figure 28A:
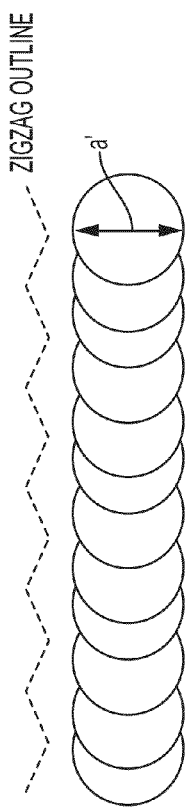
FIGS. 28A and 28B are diagrams showing a Gaussian beam and a flat top beam ablate region profile/footprint, respectively.
Figure 28B:
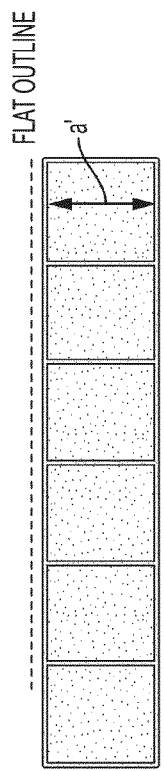
Figure 28C:
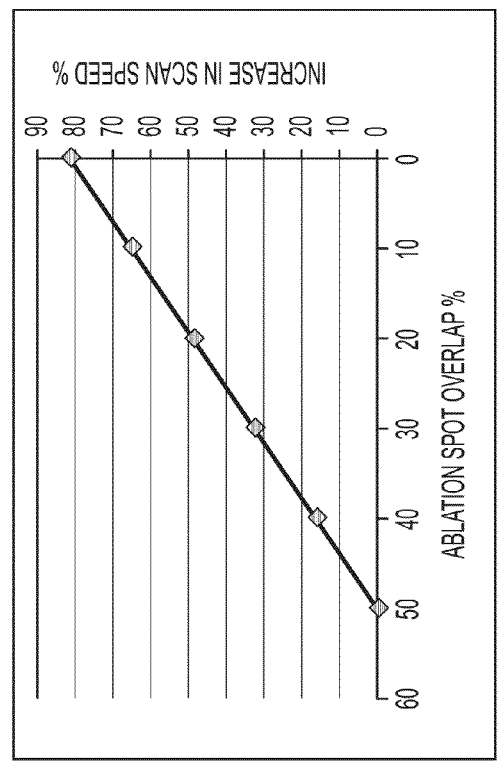
FIG. 28C is a graph of overlap and scan speed.

A flat top beam, whether having a square or rectangular cross section, offers throughput advantages particularly as compared to a Gaussian beam. FIG. 28A is diagram showing a Gaussian beam ablated region profile/footprint. The circular shaped spots of a Gaussian beam are required to overlap substantially to minimize the zigzag outline of the pattern, typically as much as 50% overlap (FIG. 28A). FIG. 28B is diagram showing a flat top beam ablate region profile/footprint. Since the square or rectangular flat top beam have flat edges, thus creating a flat outline, the overlap can be significantly reduced (FIG. 28B). FIG. 28C is a graph showing the improvement in scan speed as beam overlap is reduced. Note that even for an overlap of 30%, a scan speed increase of 33% may be realized.

FIG. 29A is a diagram illustrating a beam alignment window of a Gaussian beam and FIG. 29B is a diagram illustrating a beam alignment window of a flat top beam. As can be seen in FIGS. 29A and 29B, yet another advantage of using a flat top beam for making inlaid patterns is the larger alignment window the flap top beam provides. The circular shaped spots obtained from a Gaussian beam create zigzag edges of the ablated regions (FIG. 29A). The alignment margin of M as shown in FIG. 29A is reduced and limited to M-a-b due to the waviness of the zigzag edge profile.

However, the ablation region edges created using a flat top beam are straight allowing the alignment margin to stay at M. For the back contact back junction solar cells described herein, BSF openings are formed inside the BSG Open regions, and contact openings are formed inside the BSF region. Hence, a larger alignment margin is important as it allows for smaller BGS Open, BSF, and contact regions. Thus reducing the electrical shading and improving solar cell performance.

Since the overlap of square or rectangular flat top beam can be reduced in both x and y direction while making a large area ablation or doping, the throughput is significantly enhanced. Also, since the size of the square or rectangular flat top can be increased without causing excessive zigzagging of the perimeter, throughput is further increased. Table 1 shows the reduction in the number of scans needed to open a 150 um wide line, such as used for delineating the base area by ablating the BSG film.

Table 1 below shows the throughput of Gaussian vs. Flat Top laser beams for creating a 90 μm wide base opening. The results of Table 1 are shown graphically in FIG. 29E.

TABLE 1

| PROCESS | Width of line (um) | Spot Size (um) | Overlap % | Pitch of scans (um) | Number of scans per line |
|---|---|---|---|---|---|
| BSG Ablation with Gaussian | 150 | 30 | 50 | 15 | 9 |
| BSG Ablation with Flat Top | 150 | 30 | 20 | 24 | 6 |
| BSG Ablation with Flat Top | 150 | 60 | 20 | 48 | 3 |

Figure 29D:
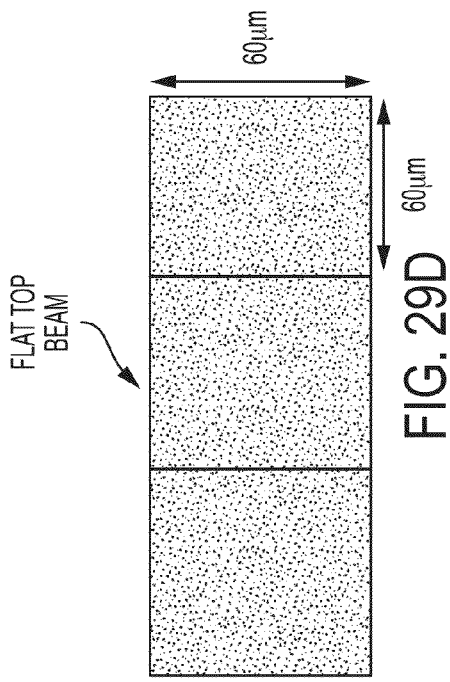
FIGS. 29C and 29D are diagrams showing a Gaussian beam region profile and a flat top beam region profile, respectively.
Figure 29C:
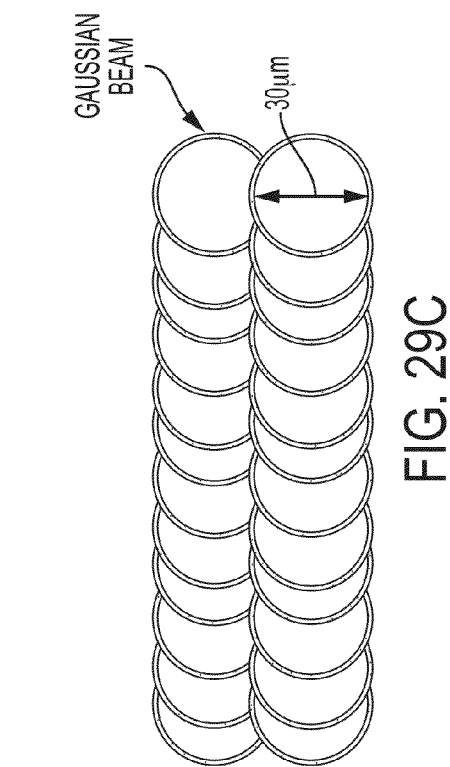
Figure 29E:
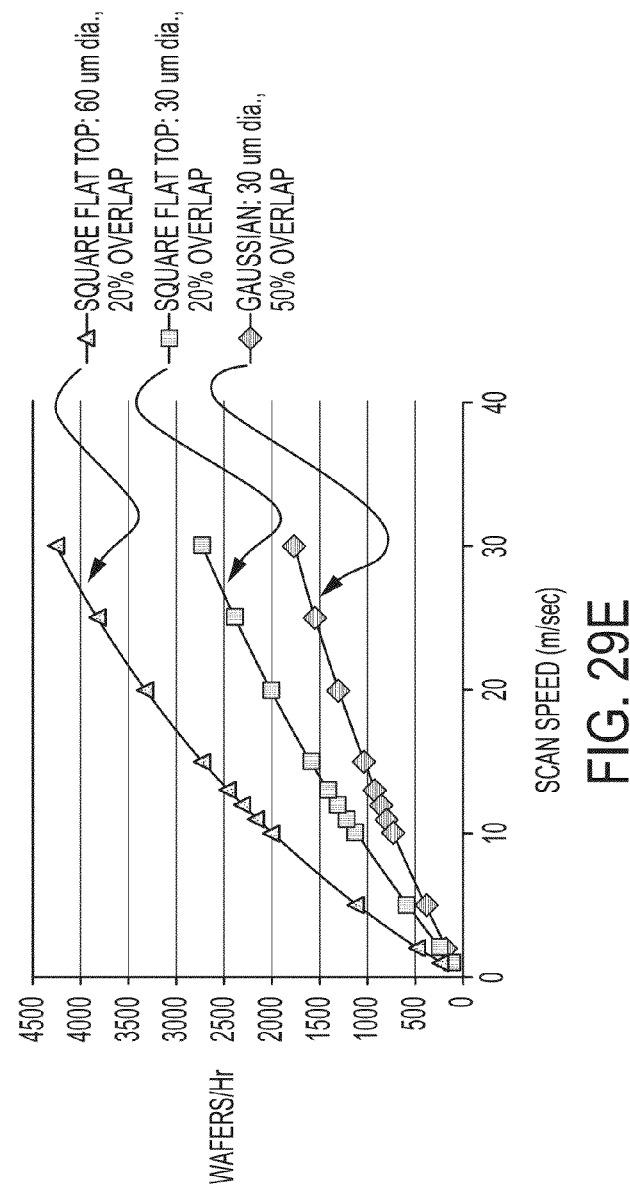
FIG. 29E graphically depicts the results of Table 1.

FIG. 29E shows the throughput advantage of flat top beams (the 60 μm flat top beam region profile is depicted in FIG. 29D) as compared to the Gaussian beam (the 30 μm flat top beam region profile is depicted in FIG. 29C), for a high productivity laser system that can process four wafers at a time. To further reduce cost, for example, two lasers may be utilized with each laser beam further split into two. However, many variations of this flat top laser beam hardware and fabrication scheme are possible.

Also, because overlap is significantly reduced in both x and y directions when using a flat top beam, the laser induced damage of silicon is greatly reduced as compared to the Gaussian beam.

Similar throughput advantages may also result when utilizing a flat top beam for opening the oxide region for BSF, doping the BSF region using the overlying PSG, forming base and metal contact openings if they are line contacts, and the metal ablation isolation lines—all with the concurrent advantage of reduced silicon damage. Additionally, utilizing a flat top beam provides the advantage of increased alignment window for BSF opening inside the BSG opening and contact opening inside the BSF. Flat top laser processing methods may also increase throughput for forming a back surface field. For example, the back surface field may be formed by doping the base region, opened as described, with an n-type dopant such as phosphorous. For this process the base is covered with a phosphorus-doped silicon oxide (PSG) layer and the doping may be performed by irradiating this region with a laser beam. While uniformly doping this region using Gaussian laser beams requires overlapping, overlapping is minimized or may be completely reduced using a flat top beam. And as with the base and emitter region delineation and back surface field delineation described herein, utilizing a flat top laser beam provides a substantial throughput and reduced damage advantage as required overlapping is decreased. It should be noted that for forming a back surface field, the beam need to be flat top beam only in one direction—normal to the scan, whereas it may be Gaussian in the direction of the scan. This type of beam is called a hybrid flat top beam.

Importantly, for forming isolated base or emitter contacts, although overlap is not an issue, the silicon damage is still reduced using a flat top beam because of the absence, unlike Gaussian, of a high intensity peak in the center of the beam (as shown in FIGS. 27A and 27B).

Another aspect of this disclosure relates to the use of laser annealing to improve the conversion efficiency performance of crystalline semiconductor solar cells in general, and crystalline silicon solar cells in particular, by improving the passivation properties of dielectric-coated surfaces, and more specifically silicon nitride (SiN)-coated surfaces. The improved front surface passivation properties are manifested as reduced Front-Surface Recombination Velocity (or reduced FSRV) and increased effective minority carrier lifetime. This technique is especially advantageous for high-efficiency back-junction, back-contacted cells with interdigitated metallization (IBC) where annealing of SiN-coated front surface may also be used to concurrently result in the annealing of emitter and base metal contacts on the solar cell back surface, thereby, lowering the specific contact resistivity and improving the solar cell fill factor (FF). The laser annealing methods of this disclosure are applicable to crystalline semiconductor solar cells using semiconductor absorber layers over a wide range of thicknesses, i.e., thick wafer-based solar cells such as crystalline silicon wafer solar cells with wafer thicknesses of 10's to 100's of microns. Moreover and more specifically, the non-contact laser annealing process and methods of this disclosure are applicable to extremely thin (e.g., crystalline semiconductor layers from a few microns to ~50 microns thick) crystalline silicon solar cells where unsupported cell mechanical handling can result in cell breakage. It is also an in-line replacement for the batch furnace annealing processes. The laser annealing process and methods can be used as the last step in the cell manufacturing process flow or immediately after deposition of the front-surface passivation and anti-reflection coating (ARC) layer. The processes and methods of this disclosure enable formation of high-quality surface passivation and ARC layers using low-temperature, low-thermal budget deposition processes for passivation & ARC layers such as silicon nitride deposited by low-temperature PECVD.

The passivation of the surface of phosphorous-rich $N^+$ emitter with silicon nitride for standard front contact solar cells with p-type silicon bulk (or p-type base), is well known and widely utilized in the solar industry. While the SiN film acts as an antireflection coating to reduce the optical reflection losses and to increase sunlight trapping, it also serves a very important task of passivating the surface of the phosphorous-rich $N^+$ emitter by the well-known hydrogenation process. The hydrogen released from the hydrogen-containing SiN layer satisfies the open bond on the silicon surface (or silicon dangling bonds causing surface states and traps), thereby reducing the surface recombination velocity or rate of minority carriers by these dangling bond sites. For cells made from multi-crystalline or polycrystalline silicon, this hydrogen provided by the SiN layer further reacts with the impurities and defects in the bulk of the silicon wafer as well as removes the grain boundary trap sites, thereby reducing the overall minority carrier recombination and increasing the effective minority carrier lifetime in the bulk of the material.

The release of hydrogen and hence the surface and bulk passivation of silicon is typically obtained during the so-called "metal firing" process in the standard front-junction/front-contact solar cell manufacturing process flow, currently widely used in the solar cell manufacturing industry. The screen-printed metal firing process consists of multiple-step heating of the solar cell using a carefully designed temperature and time sequence with a final dwell at about 850-900° C. before a desired cooling sequence. This firing cycle is optimized after careful experimentation. Since hydrogen is a small atom it can diffuse out of the wafer if the wafer temperature is too high or the annealing times are too long. On the other hand, the hydrogen passivation may be unsatisfactory if the temperature is too low or annealing times are too short. Hence, the hydrogen-passivation phenomenon has been a subject of intense investigation and research in the solar cell industry and is considered not just science but also an art by many (since there are still many areas yet to be fully understood). It is clear that a process that can provide a high degree of control is thus desired.

For the standard mainstream front-contact solar cell with p-type silicon bulk (or p-type boron-doped base) and $n^+$ phosphorus-doped emitter, the front contact surface is contacted by silver while the back surface is contacted by aluminum—which may be screen printed as a blanket layer or make selective contacts through openings made in the backside dielectric surface. To obtain low resistance contacts, the intermixing of silver with silicon in the front and aluminum in the back is promoted during the metal firing process that has been described above. Based on the description of the metal firing process above, the practice of obtaining low resistance contacts and hence high FF in the solar cell is complicated. Again, a process that can provide a high degree of control is desired.

Additionally, the all back-contact, back-junction solar cells that use the same metal, aluminum, in contact with both $n^+$ and $p^+$ contacts on the back side cannot be heated too high as the doping of $n^+$ contact by aluminum, a p-type dopant, will increase the contact resistance, thereby lowering the fill factor of the cell. Moreover, overheating of aluminum much above 450° C. can result in degradation of optical reflectance of aluminum (and thus increased optical losses of the infrared photons in the cell). A controlled low-temperature heating, preferably in the range of 200-450° C., of the contacts where aluminum makes intimate contact with silicon by reducing and absorbing the oxide at the silicon surface, is highly desirable.

We disclose here a process where the front surface or sunnyside of the solar cell is substantially uniformly or in selected areas irradiated with the laser beam, selectively heating the semiconductor (e.g., silicon) such that hydrogen atoms are released from SiN thereby effectively passivating the silicon surface, reducing the surface state density, reducing the front-surface recombination velocity (FSRV), and increasing the effective minority carrier lifetime of the solar cell. The processes and methods of this disclosure may also reduce the bulk trap density and enhance the bulk minority carrier lifetime. One embodiment of the disclosed method is based on using a pulsed laser source with a wavelength smaller than that of the semiconductor (e.g., silicon) bandgap. In this embodiment (for instance, using a pulsed green or UV laser source for crystalline silicon surface annealing), the front-surface is selectively heated using pulsed laser source irradiation, while the backside of the cell remains substantially cooler than the frontside of the cell. Another embodiment of the disclosed method is based on using a pulsed laser source with a wavelength near to or larger than that of the semiconductor bandgap. In this embodiment (for instance, using a pulsed IR laser source for crystalline silicon surface annealing) while the front-surface is heated using pulsed laser source irradiation, the backside of the cell is also heated and annealed. Using this alternative embodiment, at the same time the laser beam penetrates to the back of the solar cell heating the Al/silicon contacts to decrease the contact resistance and to improve the overall cell fill factor and efficiency. The laser annealing process and methods of this disclosure may be performed at the end of the solar cell fabrication process flow or immediately after formation of the passivation/ARC layer and before the cells are tested and sorted for module packaging. Alternatively, the laser annealing process and methods of this disclosure may be performed after assembling and packaging the cells in a PV module and through the front glass cover of the module assembly. In this case wavelengths need to be used that can go through the glass, such as infrared.

It is important that the laser anneal process should be optimized (including the laser source wavelength, pulse width, power, etc.) such that the passivation layer (e.g., the PECVD SiN layer) is not degraded during this process so that the sunlight can pass through this antireflection coating without significant optical absorption losses. Also, the surface texture should not be affected so that the light trapping is not reduced. It is clear that the type of the pulsed laser source and the laser process parameters should be carefully chosen to meet all these requirements.

The laser pulse length should be long enough so that there is no non-linear optical interaction with the passivation/ARC layer (e.g., SiN layer) so that the passivation/ARC layer) is unaffected. Although, lasers with pulse length from 1 nanosecond to microseconds or continuous wave can be used for this application, the choice depends on the depth to which the heat penetration is desired. Using shorter pulse length the heat is limited to shallow depths. Wavelength also should be chosen based upon the depth of semiconductor (e.g., crystalline silicon) that is required to be heated. For applications to single crystal solar cells where only front surface passivation is required to be improved, green wavelength may be more suitable. For applications where improved bulk silicon passivation is required and/or back contact annealing is desired, IR wavelength may be more suited. It should be clear that based on the desired application a range of laser pulse length and wavelengths can be used.

Processes for back contacted cells with interdigitated metallization, called NBLAC cells, have been described in related applications (see, e.g., U.S. patent application Ser. No. 13/057,104 filed Aug. 13, 2012).

Figure 30:
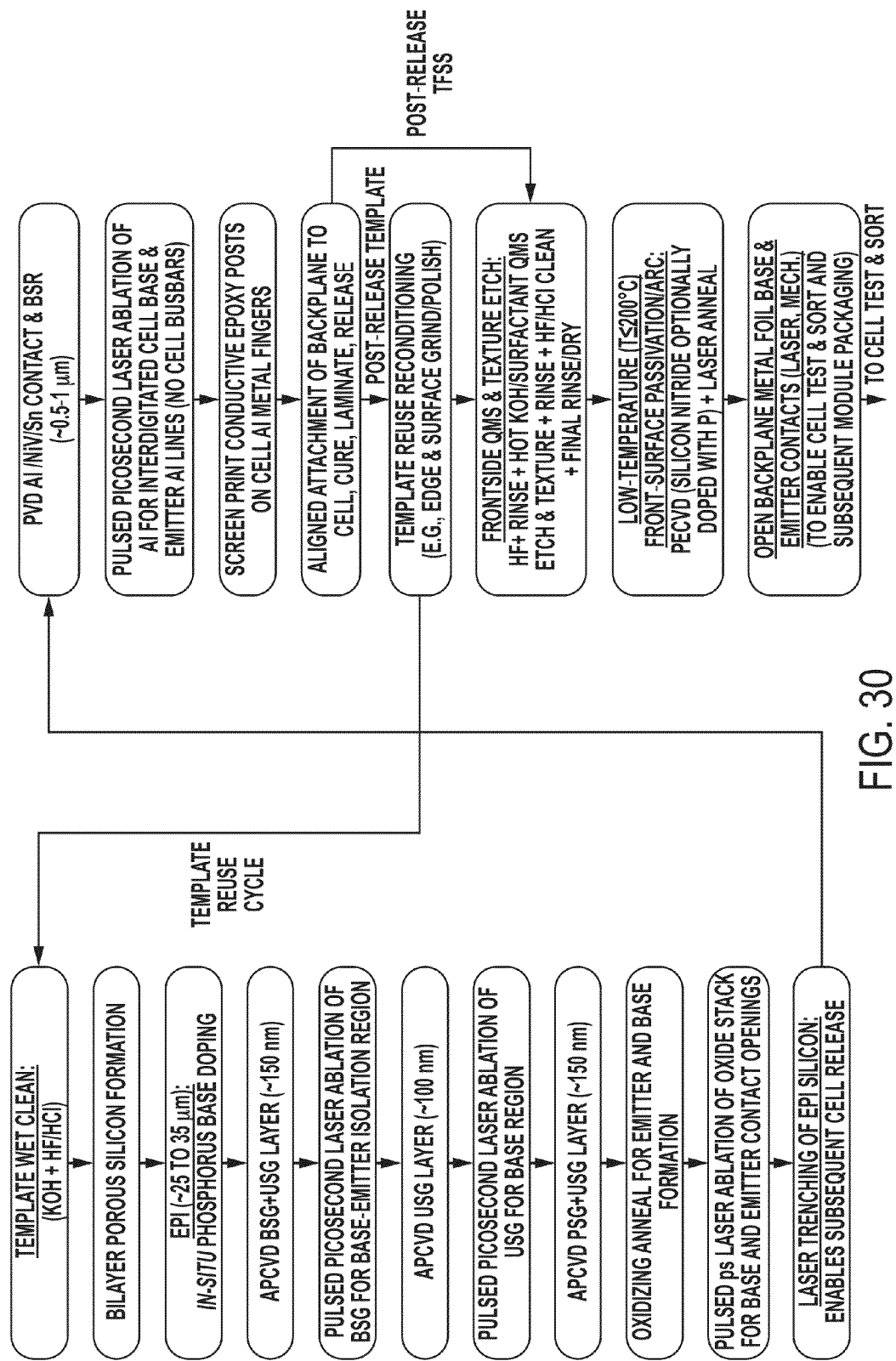
Figure 31:
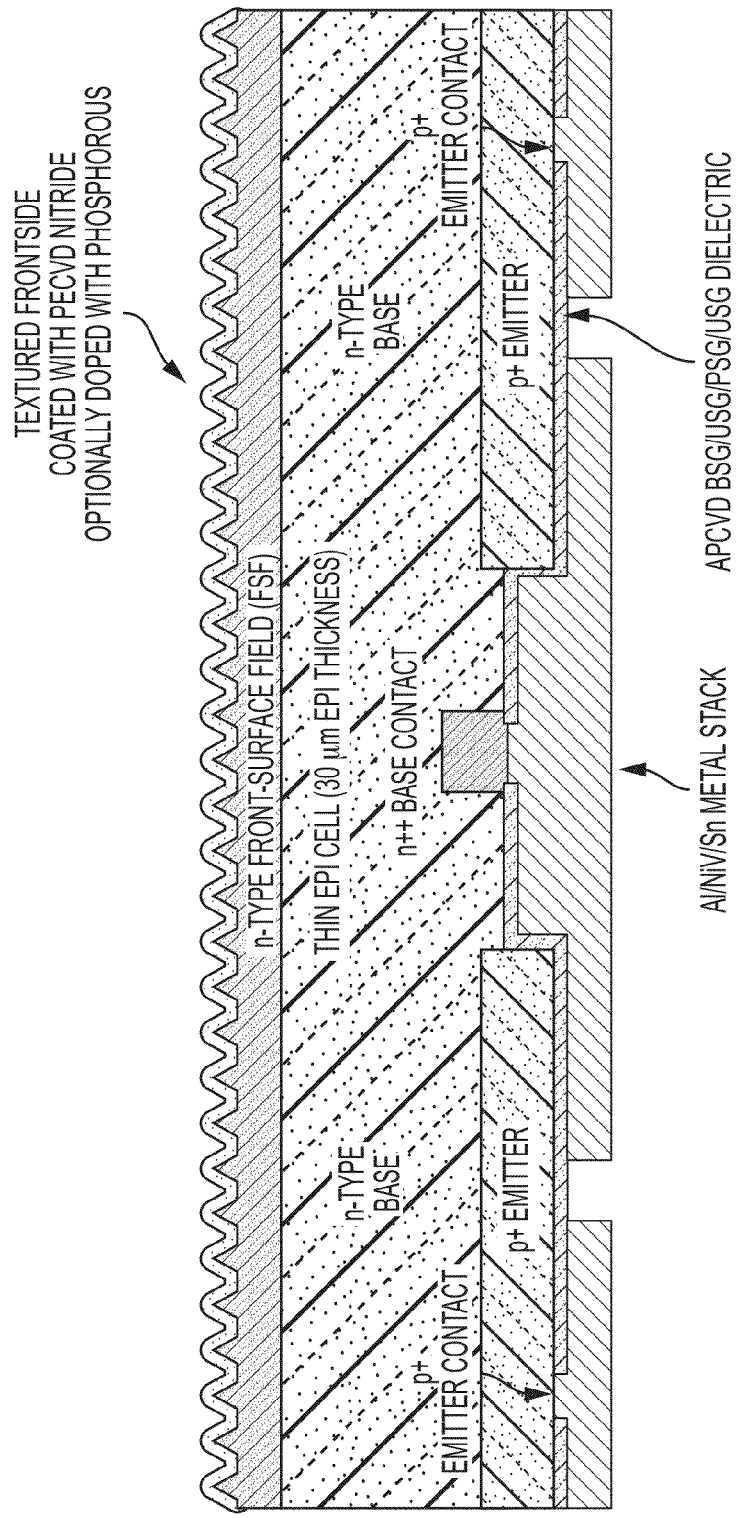
FIG. 31 shows a schematic cross section of an NBLAC cell.

FIG. 30 outlines one of the embodiments of the NBLAC process flow, while FIG. 31 is the schematic of the cross section of the cell (the backplane is not shown for clarity). The low-temperature front-surface passivation/ARC:PECVD (silicon nitride)+laser anneal process step in FIG. 30 involves the deposition of SiN at lower temperatures than is used in the industry (<350 C). The surface is then subjected to pulsed laser irradiation causing preferential silicon frontside annealing that results in improved passivation of the silicon surface with hydrogen from the SiN. In particular, the laser annealing processes and methods of this invention enable formation of high-quality passivation and ARC layers (like single layer SiN and bilayer SiN with amorphous silicon) deposited at low temperature as low as 90° C., and more typically in the deposition temperature range of 90° C. to 250° C.

In some embodiments, the SiN being annealed may contain a desired amount of phosphorus dopant. In this case, the annealing step also causes silicon doping with phosphorus. This process is discussed in connection with FIG. 36 below.

Besides SiN, silicon oxynitride ($Si_xO_yN_z$), or silicon carbide ($Si_xC_y$) single layers or a bilayer stack with SiN on amorphous silicon ($\alpha$-Si), a bilayer stack with SiN on silicon oxide ($SiO_2$), or a bilayer stack with SiN on silicon oxynitride, can also be used for silicon surface passivation. For example, it is known that an amorphous silicon layer can passivate the silicon surface quite well. However, for the current industrial process, significant surface cleaning of silicon and process optimization of the $\alpha$-Si deposition process is required. Laser annealing of $\alpha$-Si films covered with hydrogenated SiN can activate the hydrogen in SiN and lead to dramatic enhancement of passivation, as measured by substantially increased effective minority carrier lifetime and substantially reduced front-surface recombination velocity.

The PVD Al/NiV/Sn contact & backside reinforcement BSR step and the pulsed picosecond laser ablation of Al for interdigitated cell base & emitter Al lines step in FIG. 30 form the metal contacts to the base and emitter on the back surface of the solar cell. These contacts are shown in the cross section in FIG. 31. It should clear that the laser beam that penetrates to the back of the silicon film will concurrently anneal the back contacts, resulting in reduced contact resistance and increased fill factor of the solar cell.

Figure 32:
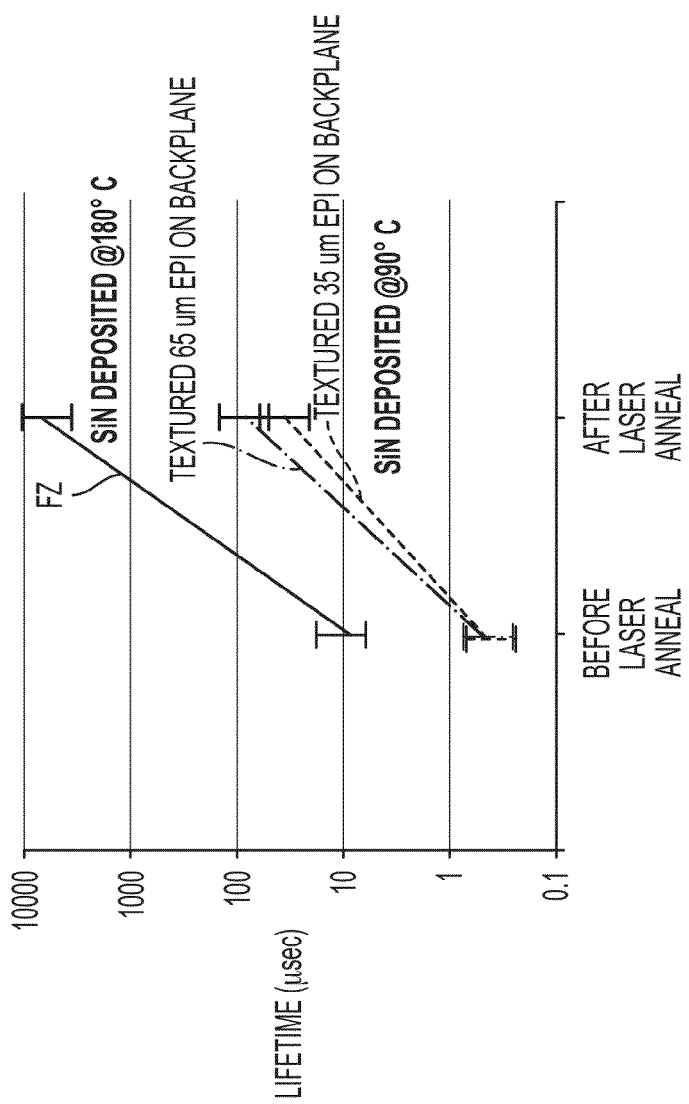
FIG. 32 shows a graph of minority carrier lifetime with and without laser annealing.

Results obtained using laser annealing are shown in FIG. 32. It is seen that up to 100 times effective lifetime improvement is obtained on low-temperature-deposited passivation layer of SiN without resorting to high temperature metal firing. In the NBLAC process the thin epitaxial silicon is supported on a backplane. In case this backplane cannot withstand a high temperature, the SiN deposition temperature is reduced to facilitate thin epitaxial/backplane assembly processing and process integration accommodating the heat sensitive backplane assembly. For such heat sensitive backplanes the laser annealing is highly suitable since with a suitable selection of laser pulse length and wavelength, the heat can be limited to the front side of the silicon while keeping the backside of the silicon within the acceptable value for the backplane.

The non-contact laser annealing process is highly suitable for NBLAC cells that use epitaxial films having thickness approximately in the range of a few to 50 microns, which are fragile to handle.

For enhanced throughput and improved process control, the laser source used for these applications may have top-hat profile (with relatively uniform beam power over at least 100 micron or more) in order to reduce the overall surface irradiation scan time. This also eliminates the chance of damage in beam overlapping areas.

This laser annealing process is an attractive alternative to furnace annealing as it can be an in-line cost effective process.

According to another aspect of the present disclosure, the selective laser ablation and patterning of electrically insulating layers, such as thermally grown or chemical-vapor-deposited silicon oxide on silicon is used in crystalline silicon solar cell process flows for obtaining relatively high cell efficiency values. In such applications it is advantageous that no or at most negligible damage is introduced in the underlying silicon substrate, since any substantial ablation-induced damage can lead to increased minority carrier recombination loss, resulting in further loss of cell conversion efficiency. We present here a novel scheme that ensures that the solar cell semiconductor (e.g., silicon) surface will not be damaged during the pattern-selective ablation of the dielectric (e.g., silicon oxide) overlayers. This disclosure involves introducing a thin intermediate layer of silicon that stops the laser beam from reaching the silicon substrate. This thin intermediate silicon layer may be placed closer to the underlying silicon surface, separated only with a thin buffer layer of silicon oxide. The layer of oxide above this intermediate silicon layer is ablated by the laser beam interacting and separating the silicon oxide-intermediate silicon layer interface. A very thin (for example, 3 nm to 100 nm or in some embodiments 3 to 30 nm) layer of silicon oxide under this intermediate silicon layer prevents any significant damage-causing effect of laser action at this interface from reaching the silicon substrate. The intermediate silicon layer is subsequently oxidized (using either a thermal oxidation process or an oxidizing anneal process), thereby eliminating any unwanted interaction in subsequent laser processing. This scheme is particularly suited for application in an all-back-contact back-junction solar cell design where laser ablation of dielectric layers such as silicon oxide is utilized several times, such as the NBLAC solar cell.

In one embodiment of a process flow, the oxide ablation process is used three times to form oxide patterns, namely BSG (or BSG/USG stack) ablation to delineate emitter and base regions, USG (or PSG/USG stack) ablation to define the base regions, and finally ablation of PSG (phosphosilicate glass—oxide) to open contacts to base and the ablation of BSG/USG/PSG ablation to open contacts to the emitter regions. The technique described herein can be advantageously used in the first step of ablation of the BSG layer to define the patterned emitter and base regions (for solar cells using n-type base). If desired, this technique can be further used during the ablation of USG for defining the openings for $N^+$ base regions. (These polarities would be reversed for solar cells using p-type base.)

FIG. 33A shows a process flow for an all back contact solar cell that involves oxide ablation at three different steps. FIG. 33B shows the slight modification to the BSG/USG (USG is undoped silicate glass or undoped silicon oxide) deposition step where a very thin α-Si layer is deposited on top of a thin USG layer (in some embodiments in situ within the same APCVD BSG deposition equipment) before the deposition of the remaining BSG/USG stack. During the laser ablation process, the laser beam separates the BSG/α-Si interface, thereby removing the BSG/USG stack. This thin layer of silicon is oxidized during the subsequent steps as described in FIG. 33B.

Figures 33C, 33D:
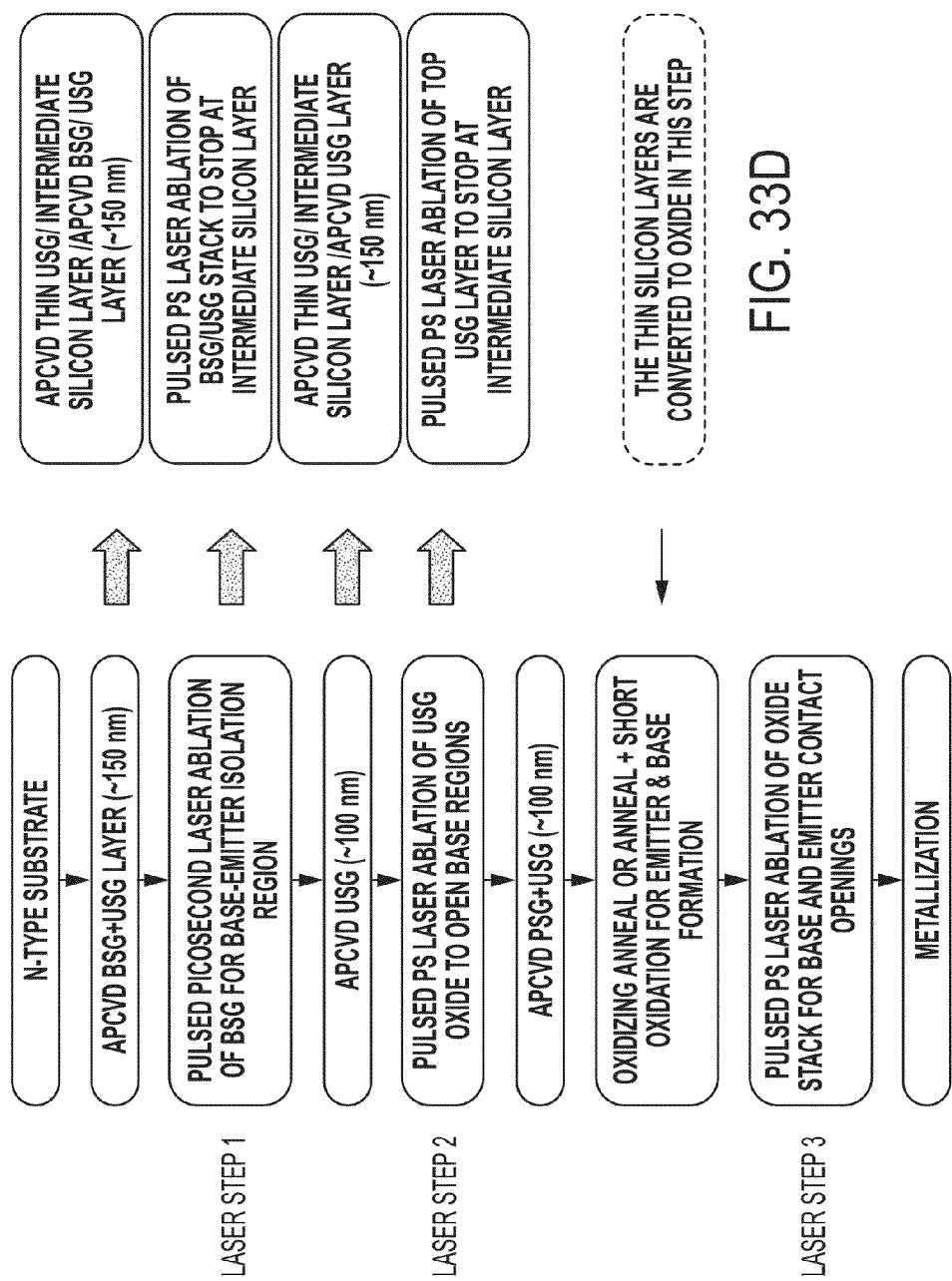
FIGS. 33C and 33D show process flows for all back contact solar cells with oxide ablation.

FIGS. 33C and 33D show a further modification to the process flow of FIGS. 33A and 33B, where the USG deposition step is modified to include the deposition of the very thin α-Si layer on top of a very thin USG layer before the deposition of the thicker USG layer. During the laser ablation the laser beam separates the top USG/α-Si layer, thereby removing the top USG layer. As before, this thin layer of silicon is oxidized along with the previously deposited α-Si as described above during the subsequent step as shown in FIG. 33D.

FIG. 34 shows schematically a standard oxide ablation process using a laser beam with pulse width in the range of a few picoseconds. It can be seen that the interface being acted upon by the laser is the surface of the silicon substrate that may be damaged if the correct pulse energy is not used. FIG. 35 shows the scheme where a very thin amorphous silicon layer is deposited after the deposition of a very thin USG layer. As shown in FIG. 35B, the interface for laser action is the BSG/amorphous silicon interface. This interface acts as an ablation stopping layer and shields the crystalline silicon surface from laser irradiation thereby preventing or suppressing any possible crystalline silicon surface damage, resulting in higher cell efficiency.

The complete stack USG/α-Si/BSG/USG may be deposited in situ using APCVD for solar cell fabrication. The APCVD equipment may be high-productivity in-line APCVD equipment with multiple sequential in-line deposition zones to enable deposition of the entire stack in a single piece of APCVD equipment. Using APCVD equipment, the thin undoped silicon layer may be deposited in one of the APCVD deposition zones (the second zone after deposition of the initial USG layer) using e.g. silane and argon (or silane and nitrogen) at a temperature of less than approximately 500° C. Alternatively, it can be deposited using a PECVD technique. A wide range of thicknesses of thin USG and thin α-Si can be used based upon the particular process flow. Typically, the USG in contact with the crystalline silicon surface may be in the range of 3 nm to 100 nm, while the amorphous silicon layer may be in the range of 3 nm to 30 nm. However, as mentioned above, thicknesses outside of these ranges will also work if the rest of the process flow is changed to accommodate the thickness of these films.

The same scheme can also be used, if so desired, to open oxide layer for base regions that will be subjected to phosphorous doping to form $N^+$ layer. In that case the process flow is modified to ensure oxidation of this α-Si layer.

Various aspects of the laser processing innovations and corresponding semiconductor, passivation, doping, metallization materials disclosed herein may be used singularly or in combination to improve solar cell efficiency.

The following laser patterning methods utilize auxiliary heat on the wafer (e.g., laser) in combination with wet etching to form patterned solar cell doped regions which may further improve cell efficiency by completely avoiding laser ablation and associated laser damage of the semiconductor substrate associated with ablation of an overlying passivation/oxide layer. Further, the passivation materials and associated laser oxide ablation methods as well as laser doping parameters disclosed above may be used in conjunction with the laser mask method described for solar cell efficiency improvement.

High efficiency back-junction, back contact solar cells with interdigitated metallization over alternating or distributed base and emitter region highly benefit from very fine patterning of passivation layers in order to obtain higher solar cell conversion efficiencies. Pulsed laser ablation patterning of these layers, particularly using pulsed pico-seconds and/or femto-seconds laser processing, may be advantageous to obtain the smallest size pattern dimensions with minimal damage. However, dielectric passivation layers often used (e.g., patterned silicon oxide, aluminum oxide, etc.) in conjunction with solar cells are transparent to laser wavelengths down to ultraviolet (UV). Thus, it is not possible to selectively ablate these dielectric passivation layers without damaging the underlying silicon substrate or sensitive solar cell semiconductor absorber layer to some degree. The solution disclosed herein provides damage-free laser patterning utilizing auxiliary heating to anneal laser patterned regions. The auxiliary heating source may be a laser or a radiant heater. In the case of laser source heating, such laser heating may be performed either in a separate laser processing tool or within the laser ablation processing tool incorporating both the ablation and annealing laser sources.

Figure 36:
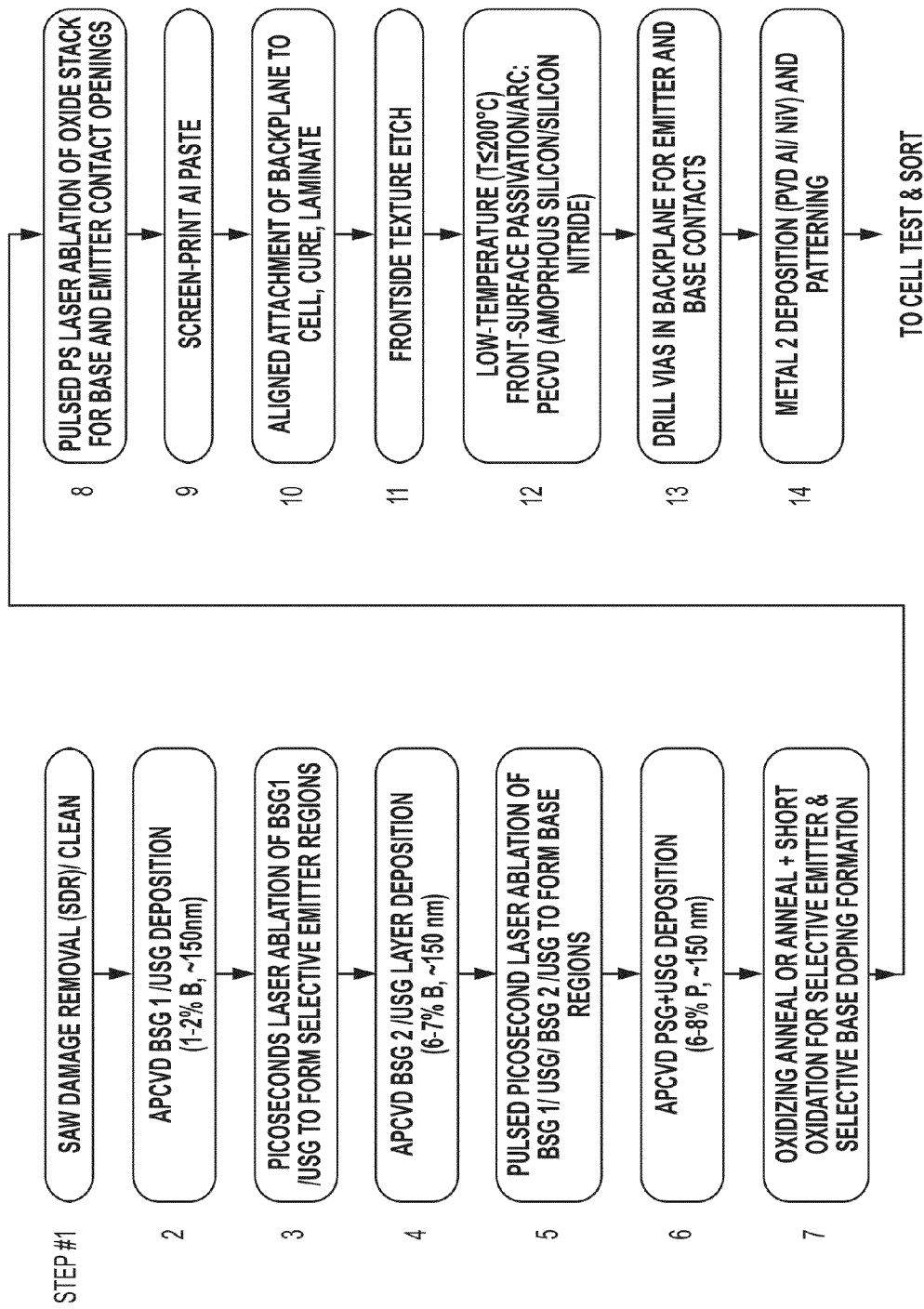
FIG. 36 outlines the process flow to form back-junction, back-contact solar cell using a starting wafer.

Aspects of the process flow disclosed in FIG. 30 describe the laser patterning of passivation layers to form high efficiency three dimensional solar cells using epitaxially deposited thin crystalline silicon films. These same laser patterning schemes are applicable to standard back-junction, back-contact solar cells using planar crystalline silicon wafers. FIG. 36 outlines the process flow to form back-junction, back-contact solar cell using laser ablation of oxide using a picoseconds laser with UV (355 nm) wavelength to form selective emitter (i.e., a lightly doped emitter junction with heavily doped emitter contact regions), patterned base, and metallization contact openings on a wafer. It should be noted that the use of a backplane to support a thin semiconductor film (such as a thin layer of crystalline silicon) may make this process flow suitable for thin silicon films having a thickness as small as a few microns (e.g., in the range of approximately 100 to 5 microns).

Passivation layers such as silicon oxide, aluminum oxide, silicon oxynitrides, and silicon nitride are typically transparent to wavelengths as short as 355 nm (UV). To some degree laser beams with wavelengths down to UV pass through these passivation layers and attack and damage the silicon substrate. This damage may be mitigated and reduced, for example using the methods and structures outlined above, to have minimal effect on solar cell efficiency. For example, using shorter wavelengths reduces the penetration of the laser beam into silicon. And shorter pulse laser beams limit the heat penetration into silicon. Thus, it is advantageous to go to shorter wavelengths (e.g., green or UV) and shorter pulse lengths (e.g., picoseconds or femtoseconds) for the ablation of these transparent dielectric layers—a substantially reduced heat affected zone (HAZ) may be obtained when going from, for example, 1064 nm (IR) to 355 nm (UV), and going from nanoseconds laser pulse to picoseconds and femtoseconds pulse laser beams.

These solutions may lead to reduced semiconductor layer (e.g., silicon) damage when ablating an overlying oxide layer (i.e., reducing damage to a lower and/or negligible impact on cell efficiency). FIGS. 38A through 38E are scanning electron microscope (SEMS) images highlighting damage to an underlying silicon substrate during oxide ablation—specifically laser damage found when ablating using a Gaussian laser beam having an approximately 10 picoseconds pulse width and 355 nm wavelength. FIG. 38A, is a SEMS image of an ablation spot in Si formed using a laser at a high laser fluence. It may be noted there is extensive damage in the center of the spot due to the high power at the Gaussian peak. Additionally, there are ripples extending towards the ablation edge. It is clear that this crystalline lattice damage may be reduced by lowering the laser fluence to the minimum required for ablation. FIG. 38B, is a SEMS image of an ablation spot in Si formed using a laser at an optimized laser fluence. The ripple damage is substantially reduced, however minimal ripples may still be observed in the ablated spots. FIGS. 38C and 38D are two SEMS images showing a magnified view of ripples and silicon melting near the ablation spot in Si formed using a laser at an optimized laser fluence (e.g., that shown in FIG. 38B). Droplets of silicon may be observed near the oxide ablation edge in FIGS. 38C and 38D. FIG. 38E is a Transmission Electron Micrograph of the ablation edge showing the creation of amorphous silicon by the picoseconds UV laser ablation of an overlying oxide. Amorphous silicon formation may be observed in the open spot as well as some distance under the overlying oxide that is present outside the ablation area. This amorphous silicon is typically seen in the optical microscope as a gray halo around the ablation spot. As silicon oxide is transparent to the picoseconds UV beam, oxide ablation occurs due to the melting and subsequent evaporation of molten silicon. Any portion of the melted and/or evaporated silicon not able to escape (e.g., at the ablation edge or the ripples seen in FIG. 38) solidifies as amorphous silicon because of the extremely rapid heating and cooling rates associated with ultrafast picoseconds laser beam irradiation. Although, this amorphous (and/or nanocrystalline) silicon may crystallize during subsequent process steps, for example during furnace annealing such as that shown in FIG. 36, the passivation of the silicon/oxide interface may be degraded and may cause minority carrier recombination at these sites leading to lowered solar cell efficiency. And while this damage may be reduced and minimized to a lower and/or negligible impact utilizing the methods herein, in some instances it may be desired to further repair and/or avoid this damage.

Figure 37A:
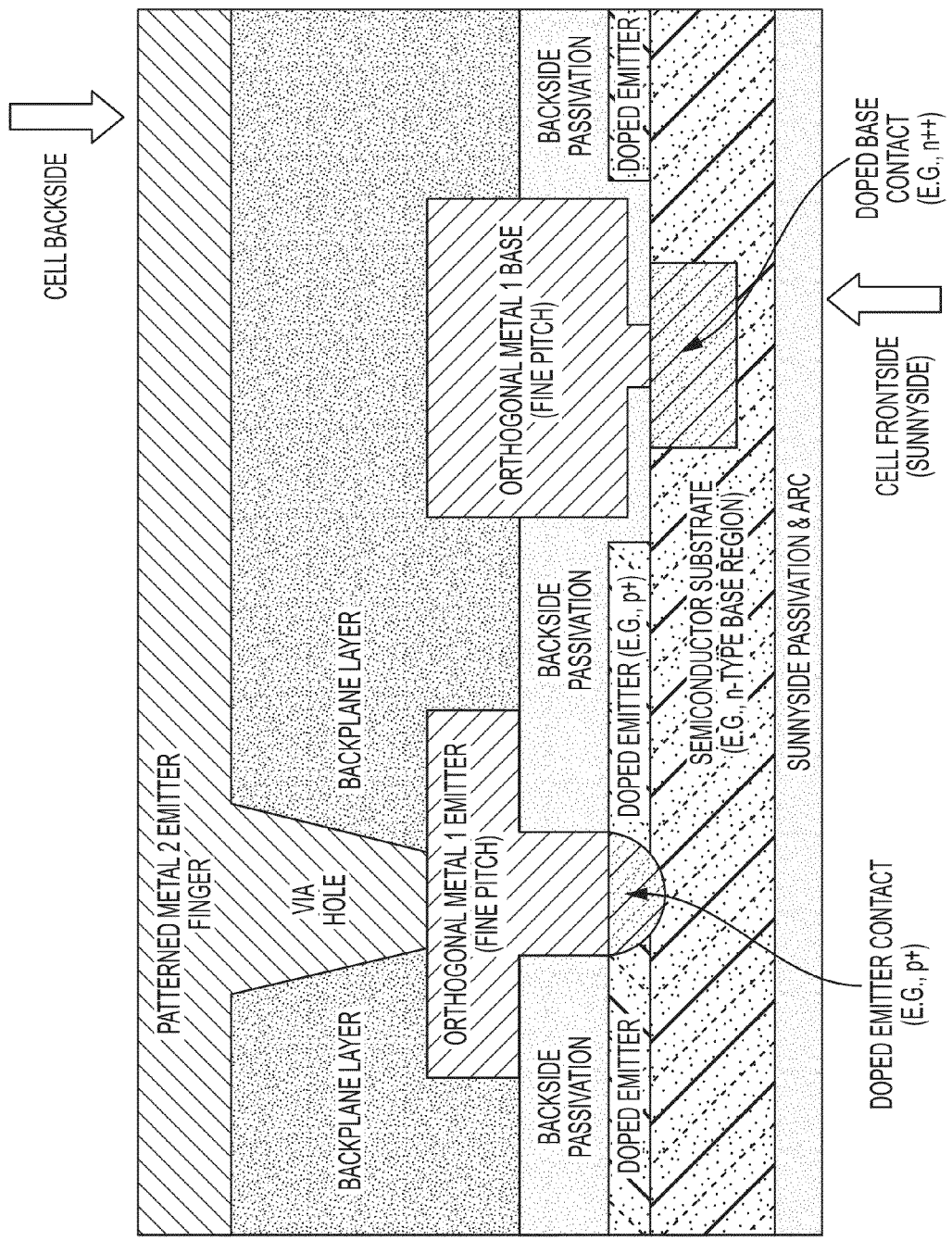
FIGS. 37A and 37B are cross-sectional diagrams of a solar cell having an interdigitated orthogonal back contact metallization pattern.
Figure 37B:
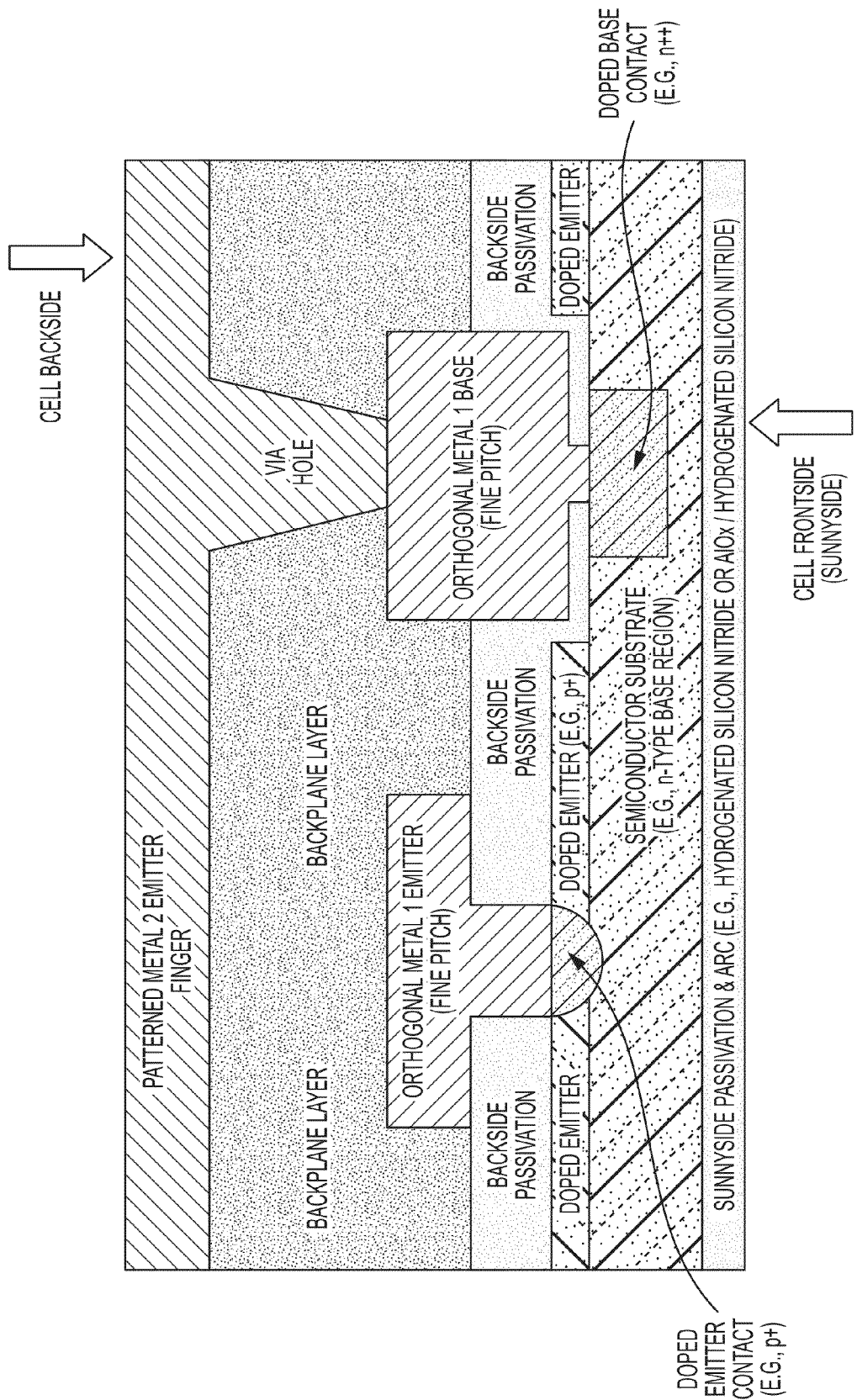

FIGS. 37A and 37B are cross-sectional diagrams of a solar cell having an interdigitated orthogonal back contact metallization pattern with two levels metallization (e.g., on-cell metallization metal 1 patterned orthogonally to metal 2, metal 1 and metal 2 separated by an insulating backplane), and having a non-overlapped laser spots for selective emitter and base with the contact made in each spot, referred to herein as a spot-in-in spot laser pattern, such as may be formed using the process flow of FIG. 36. FIG. 37A is a cell cross-section showing metal 1 and metal 2 emitter contact and FIG. 37B is a cell cross-section showing metal 1 and metal 2 base contact. The backside passivation layer may comprise, for example, an APCVD deposited BSG/USG/PSG/USG dielectric layer stack. The cell frontside may be textured and coated with a passivation layer (e.g., PECVD hydrogenated silicon nitride, AlOx/hydrogenated silicon nitride, or amorphous silicon).

In order to open up the desired amount of area for selective emitter (i.e., lightly doped emitter junctions in conjunction with heavily doped emitter contact) and selective base (i.e., lightly doped base region in conjunction with heavily doped base contact) regions, the passivation layer may be ablated by using overlapped pulsed laser ablation spots. FIG. 39A is an optical microscope image showing four overlapped ablation rows with each ablation spot overlapping the next along the row. FIG. 39B is an expanded view of the image of FIG. 39A. As may be observed in FIGS. 39A and 39B, the overlapping laser spots cause noticeable damage to the silicon substrate—thus resulting in minority carrier lifetime drop. Laser-induced damage created by the beam overlap may be reduced by patterning isolated/non-overlapped ablation spots. FIG. 39C is an optical microscope image showing isolated/non-overlapped ablation spots formed using the same laser fluence as the ablation spots in FIG. 39A. FIG. 39D is an expanded view of the image of FIG. 39C. As may be observed in FIGS. 39C and 39D, isolated/non-overlapped ablation spots may reduce laser damage as compared to overlapping laser spots under the same laser fluence. However, damage to the underlying semiconductor (e.g., silicon) substrate—areas of high minority carrier recombination that reduce the resulting solar cell efficiency—may still be observed in FIGS. 39C and 39D.

Figure 40A:
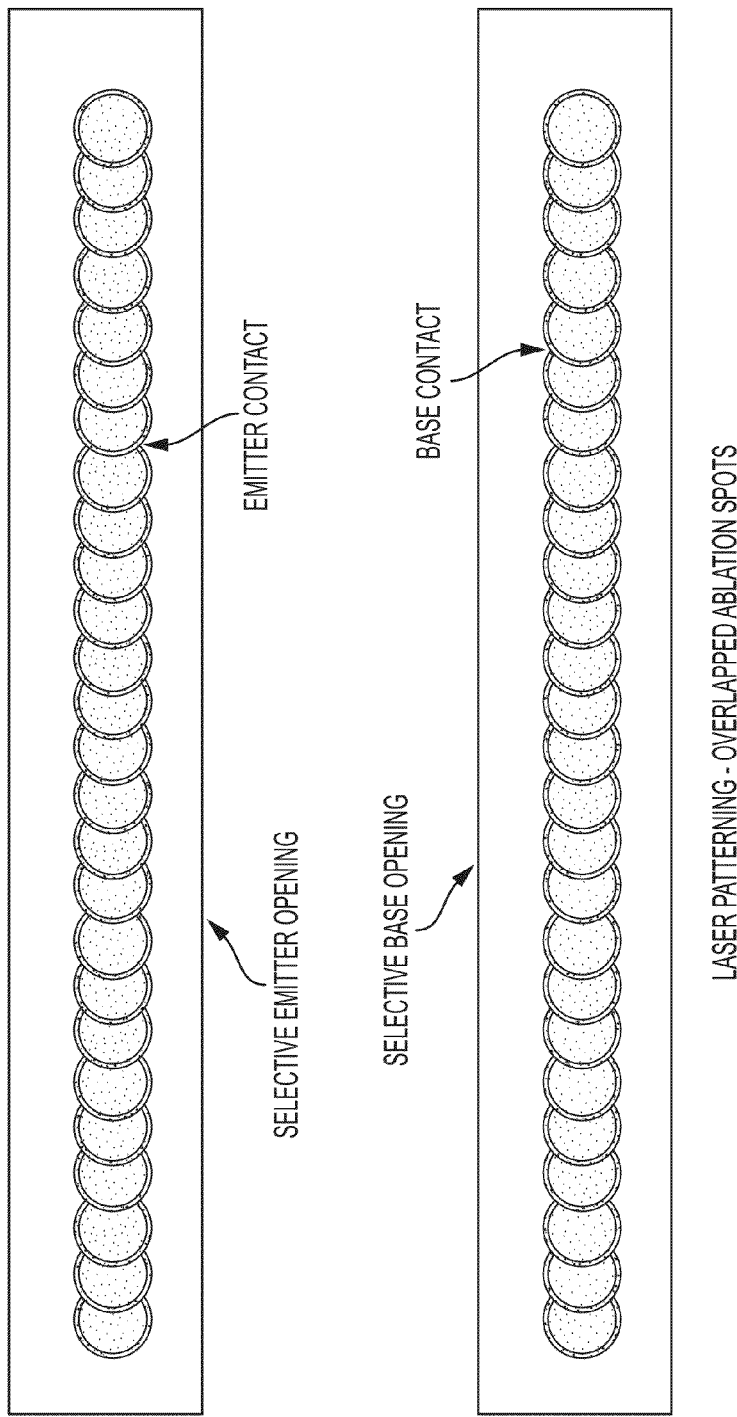

FIGS. 40A and 40B are schematic diagrams showing two laser patterning opening and contact schemes. FIG. 40A show a laser patterning scheme having overlapped ablation spots. In FIG. 40A the selective emitter (SE) and selective base (SB) regions opened/exposed by the laser ablation are doped with an emitter dopant (e.g., p-type emitter such as boron-doped emitter for n-base) and a base dopant (e.g., n-type base such as phosphorus-doped base for n-base), respectively. The contacts to these selective emitter and base regions may then be formed by a subsequent laser ablation step, such as that as outlined in the process flow of FIG. 36.

FIG. 40B shows a "spot-in-spot" laser patterning scheme where the SE and SB openings are not overlapped (i.e., isolated openings or islands) and the contact openings are aligned inside and isolated within the SE and Base openings (e.g., having a single base contact opening per discrete base island).

FIGS. 41A and 41B are scanning electron micrographs of a spot-in-spot laser pattern. FIG. 40A shows the selective emitter (SE) and selective base (SB) openings and FIG. 40B, shows emitter and base contacts centrally located inside the SE and SB openings, respectively. As can be observed, although the spot-in-spot technique reduces laser-induced damage as compared to overlapped spots, some crystalline lattice damage is still present and may reduce solar cell efficiency due to recombination losses. In some instances, this efficiency loss may be negligible. However, in other cases it may be desired to further reduce and/or eliminate this damage and improve the solar cell efficiency.

The presently claimed subject matter provides auxiliary heating to anneal out or eliminate laser ablation damage. In one embodiment, laser annealing is utilized. In this scheme, after the pulsed laser ablation is complete (e.g., pulsed ablation of an overlying oxide layer), the ablated area is annealed using another suitable pulsed laser beam that anneals out the damage. If needed, but not required, this laser annealing may result in the melting and solid phase epitaxy of the amorphous silicon layer (i.e., the damaged laser damaged silicon, as shown in FIG. 38E) yielding a mono-crystalline silicon surface that may be adequately passivated so there is no increase in minority carrier recombination at the surface. Alternatively, pulsed laser annealing may not melt the silicon surface layer and may simply promote and drive damage removal and re-crystallization of silicon by pulsed laser heating. For ablated areas with overlapped ablation spots, the laser annealing spots may also be overlapped (or alternatively, the laser annealing spot is larger to cover the overlapped ablation spots). In spot-in-spot laser patterning scheme, each ablation spot may be annealed using synchronized laser triggering from the annealing laser. For annealing, a suitable laser may have pulse length in the long nanoseconds range, for example in the range of approximately 10 to 900 nanoseconds (and in some instances pulse lengths in the range of microseconds, as high as 100 microseconds, or even femtoseconds may be used), and a wavelength in the range of IR (1064 nm) to UV (355 nm). However, other lasers with shorter or longer pulse length and alternative wavelengths may be used depending on the extent of the ablation laser damage to be annealed, e.g., a pulse length 10 to 500 nanoseconds, and a wavelength of 532 nm. During laser anneal the amorphous silicon formed during laser ablation may be melted (or heated) and crystallized to obtain a damage free or damage reduced silicon surface that may be suitably passivated and resulting in increased effective minority carrier recombination lifetimes.

Figure 42C:
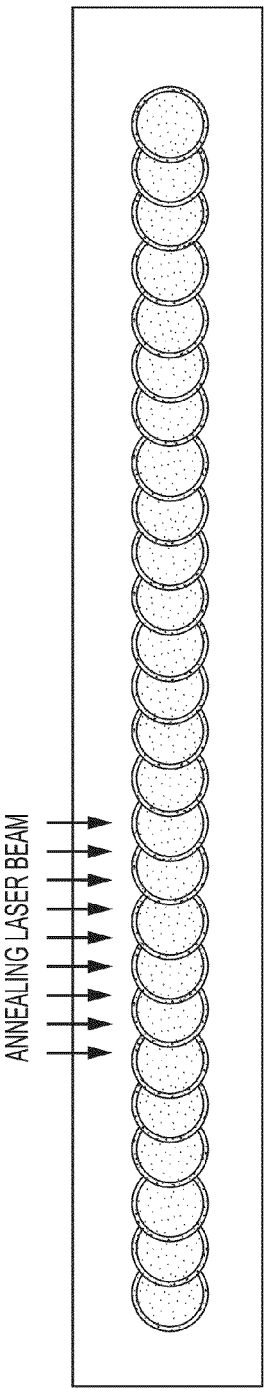
FIGS. 42C and 42D are schematic diagrams showing laser annealing spot overlap of contacts in selective emitter and selective base ablations, respectively.
Figure 42D:
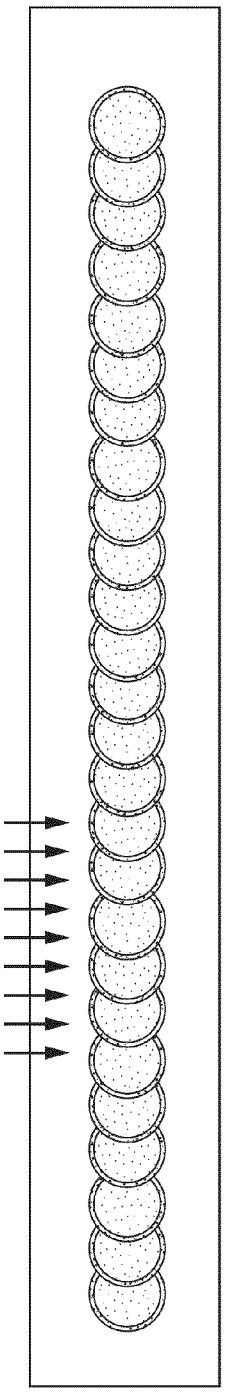

FIGS. 42A and 42B are schematic diagrams showing laser annealing of damaged silicon in selective emitter and selective base ablations, respectively. FIG. 42A is a schematic diagram showing laser annealing of overlapped selective emitter ablations and FIG. 42B is a schematic diagram showing laser annealing of overlapped selective base ablations. FIGS. 42C and 42D are schematic diagrams showing laser annealing of contacts formed by ablation in the selective emitter and base regions of FIGS. 42A and 42B, respectively. FIG. 42C is a schematic diagram showing laser annealing of contacts to selective emitter and FIG. 42D is a schematic diagram showing laser annealing of contacts to selective base.

Figure 43C:
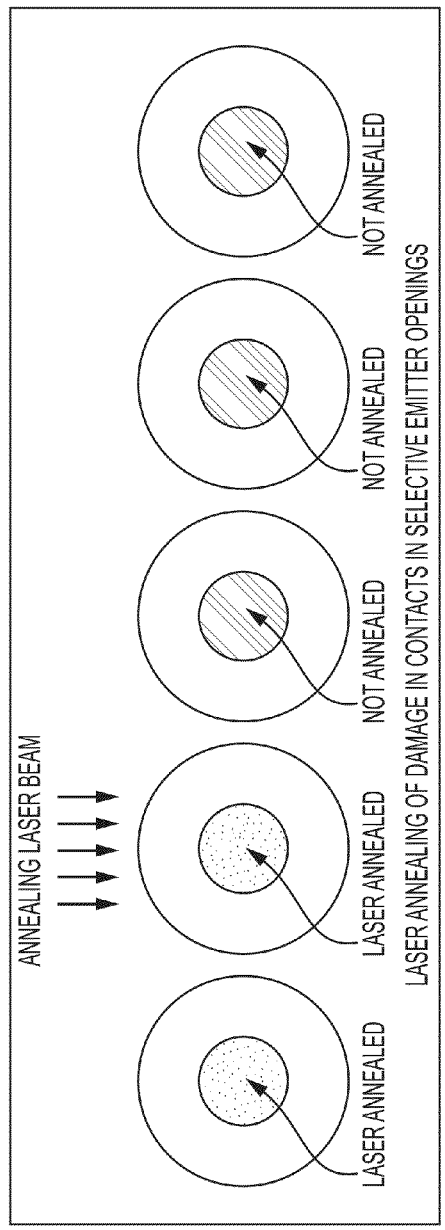
FIGS. 43C and 43D are schematic diagrams showing spot by spot laser annealing of damaged silicon in ablations in a spot-in-spot patterning scheme.
Figure 43D:
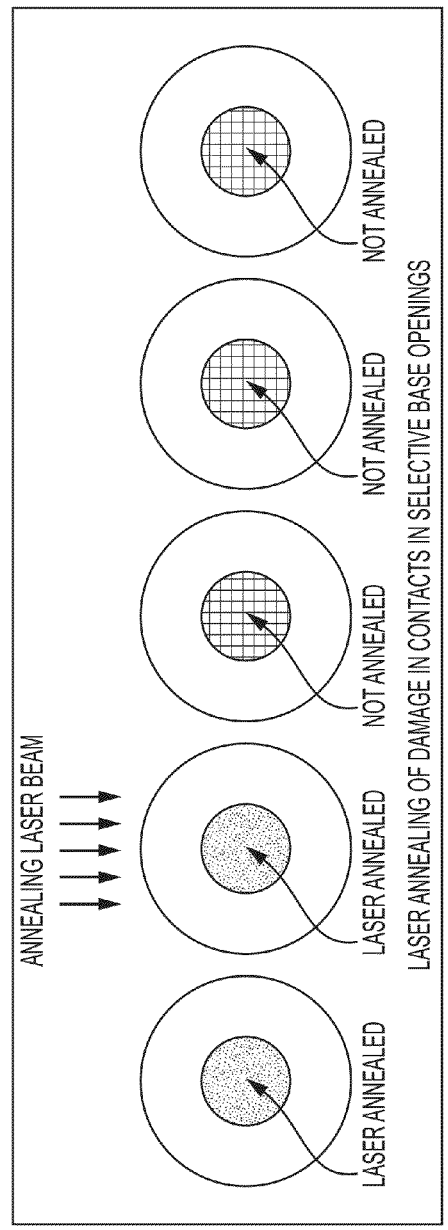

FIGS. 43A and 43B are schematic diagrams showing spot by spot laser annealing of damaged silicon in selective emitter (SE) and selective base (SB) ablations in a spot-in-spot patterning scheme. FIG. 43A is a schematic diagram showing laser annealing of damage in selective emitter ablations and FIG. 43B is a schematic diagram showing laser annealing of damage in selective base ablations. FIGS. 43C and 43D are schematic diagrams showing spot by spot laser annealing of laser damage in the contact ablation areas formed in the selective emitter openings and selective base openings of FIGS. 43A and 43B, respectively. FIG. 43C is a schematic diagram showing laser annealing of damage in contacts in selective emitter openings and FIG. 43D is a schematic diagram showing laser annealing in contacts in selective base openings. FIGS. 44A and 44B are optical micrographs showing laser ablation spots before laser anneal and the same ablation spots after annealing with a 30 nanoseconds UV laser, respectively. The elimination of amorphous silicon (and/or nanocrystalline silicon) in the ablation spots by laser annealing may clearly be observed in FIG. 44B.

Figure 45:
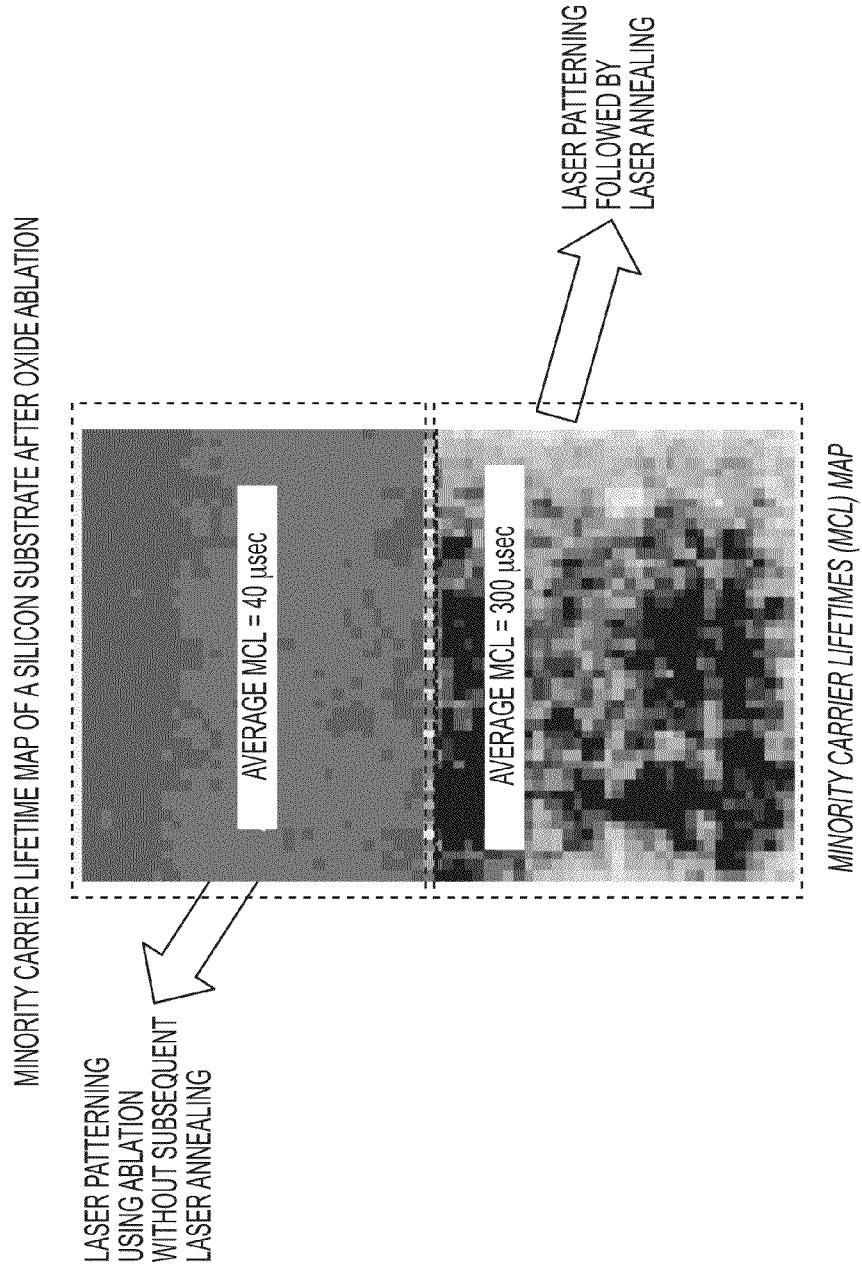
FIG. 45 is a minority carrier lifetime map of a silicon substrate after oxide ablation.

FIG. 45 is a minority carrier lifetime map of a silicon substrate after oxide ablation. FIG. 45 shows the improved effective minority carrier lifetime (MCL) obtained upon laser annealing by comparing the wafer bottom half patterned by laser ablation followed by laser annealing to the wafer top half patterned by laser ablation which did not receive laser annealing.

Figure 46:
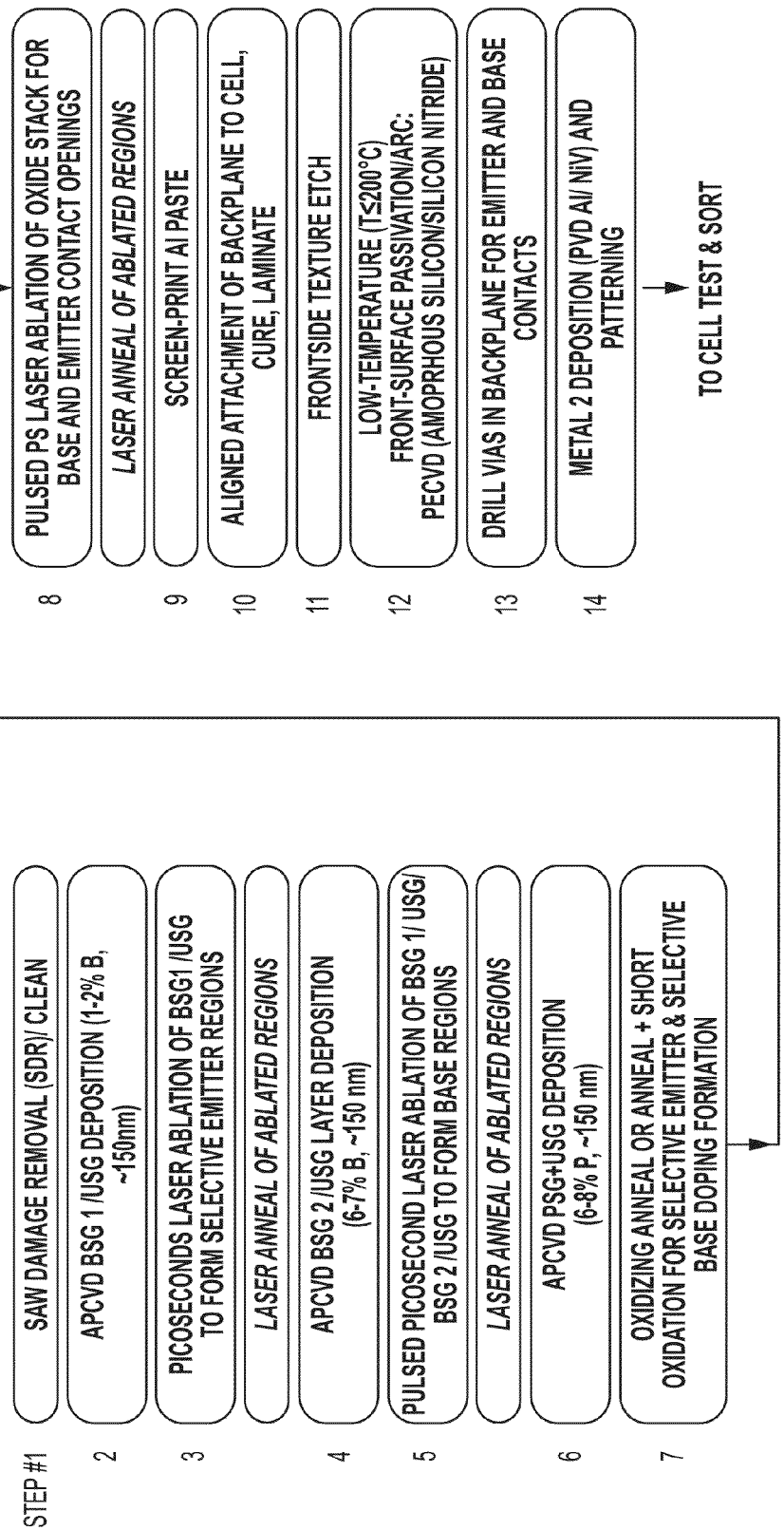
FIG. 46 is process flow for the formation of a back contact back junction solar cell utilizing laser annealing of laser ablation damage.
Figure 47:
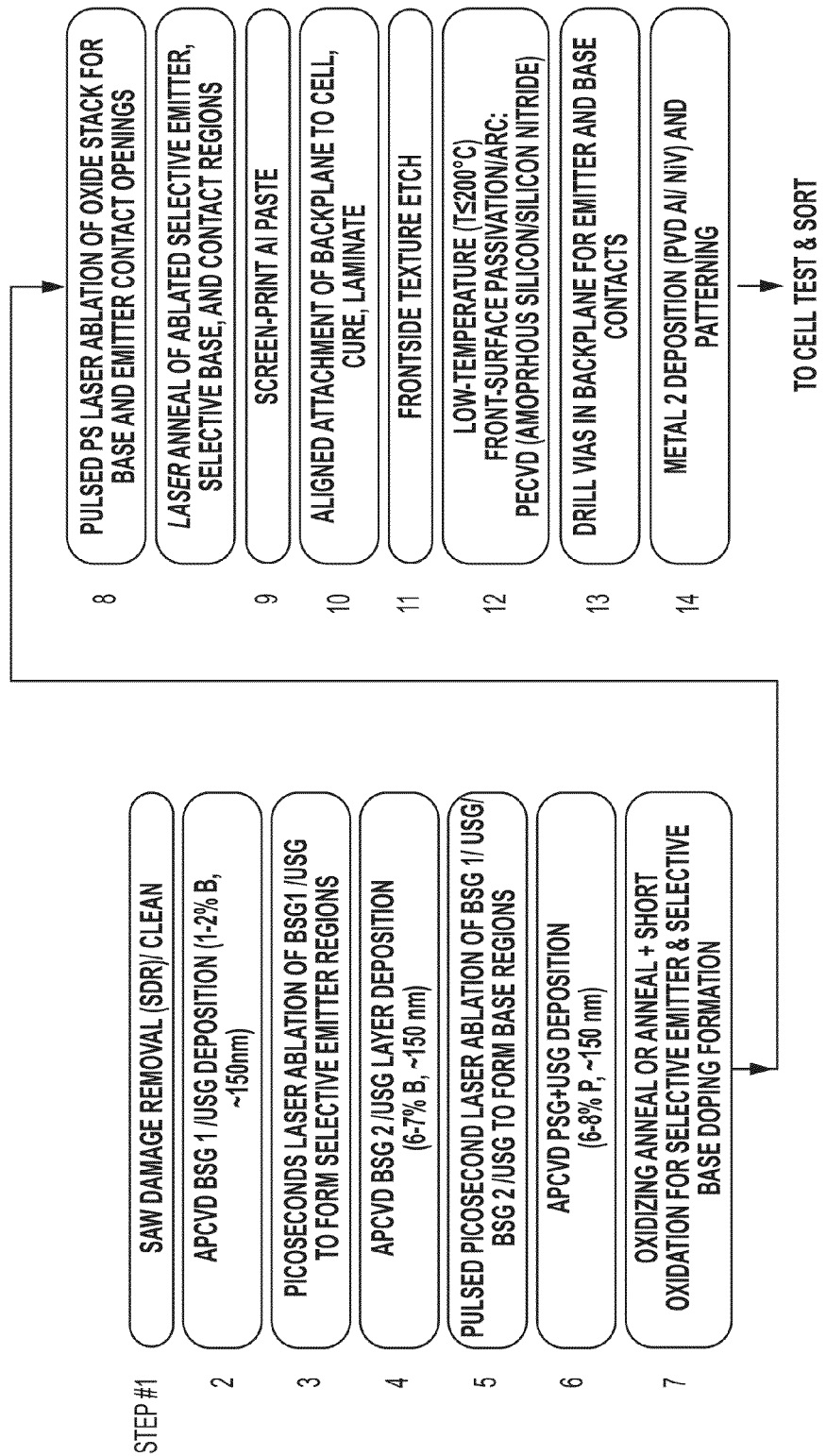
FIG. 47 is an alternative process flow for the formation of a back contact back junction solar cell utilizing laser annealing of laser ablation damage.

FIG. 46 is process flow for the formation of a back contact back junction solar cell utilizing laser annealing of laser ablation damage. The process flow of FIG. 46 is similar to that of FIG. 36 except after each ablation (steps 3, 5, and 8 in FIG. 46) laser annealing is carried out to reduce or eliminate the damaging effect of laser. FIG. 47 is an alternative process flow for the formation of a back contact back junction solar cell utilizing laser annealing of laser ablation damage similar to FIG. 36 except using a single anneal after contact ablation only (step 8 in FIG. 47) which may obtain equivalent laser damage reduction due to laser ablation as that of the multi-anneal of FIG. 46. The embodiments disclosed herein may utilize only one laser anneal process after at least one or multiple pulsed laser ablation processes or multiple laser anneal steps interspersed after multiple laser ablation processes dependent on desired process flow requirements and resulting cell structures.

Figure 48:
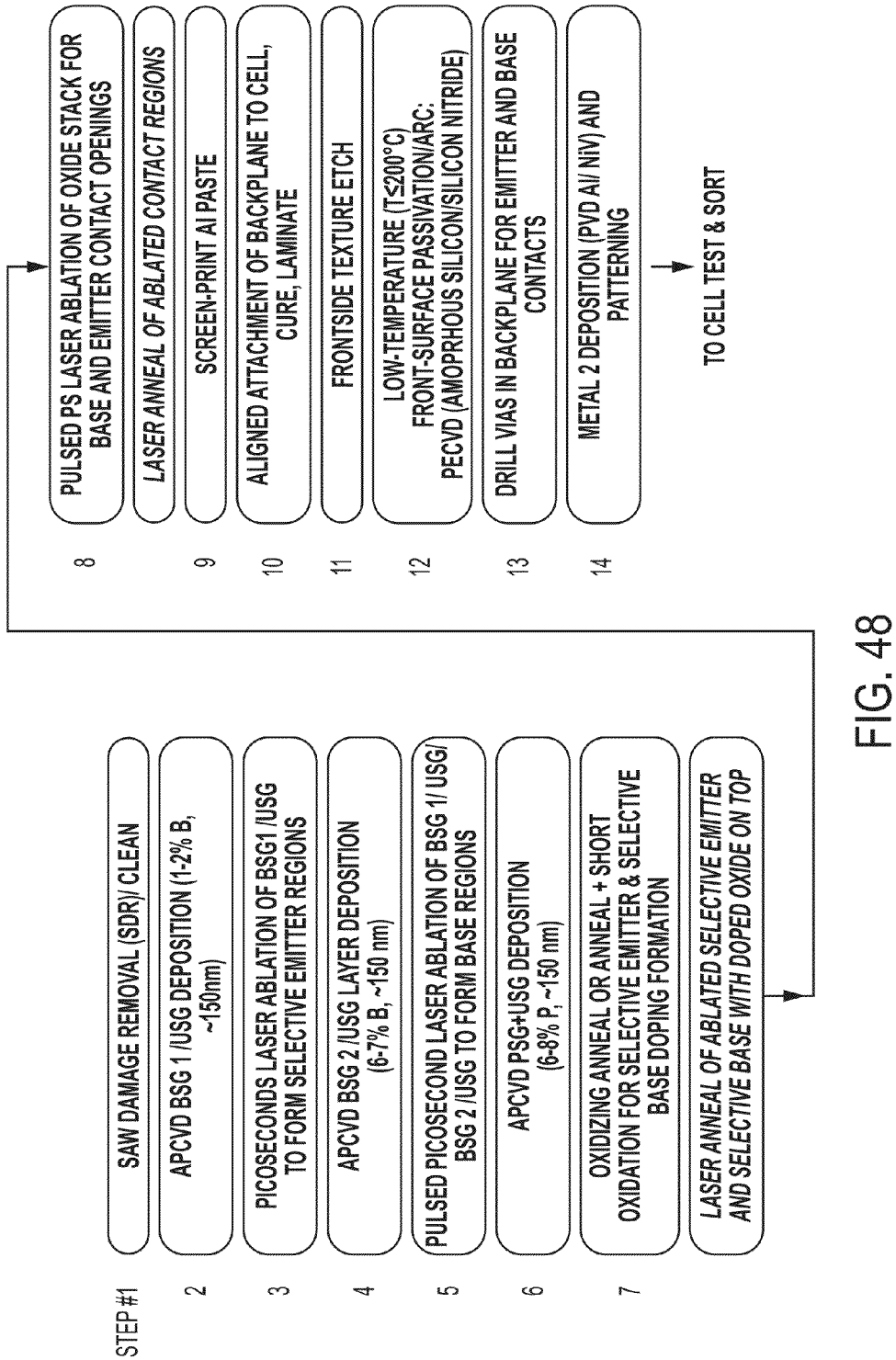
FIG. 48 is an alternative process flow for the formation of a back contact back junction solar cell utilizing laser annealing.

The laser annealing embodiments disclosed herein may also be integrated in a back contact back junction process flow to improve the dopant profiles in junctions. In one scheme the laser anneal of the ablated regions is carried out with at least one doped oxide layer covering the ablated regions. FIG. 48 is a flow for the formation of a back contact back junction solar cell utilizing laser annealing to improve junction dopant profile. The process flow of FIG. 48 is similar to that of FIG. 47 and also including a laser anneal after step 7. As shown in FIG. 48 the melting on silicon during laser annealing (shown as the laser anneal after step 7 in FIG. 48) results in melt incorporation or absorption of p-type (e.g., boron) and n-type dopant (e.g., phosphorous) from the overlying BSG and PSG films into molten silicon, respectively. This provides a high concentration of these dopants in the vicinity of the surface in addition to the dopants that are driven in by the furnace anneal and have a diffused error function profile from a relatively fixed dopant source. This results in a high-low junction for these doped junctions and may reduce carrier absorption at the silicon surface thereby improving the cell efficiency. In this instance, the annealing laser spot may be larger than ablation spot and the laser fluence may be below the threshold level for melting silicon. For example, using a Gaussian beam with a higher fluence in the center of the ablation spot and a lower fluence below the threshold level for melting silicon outside the ablation spot.

Figure 49B:
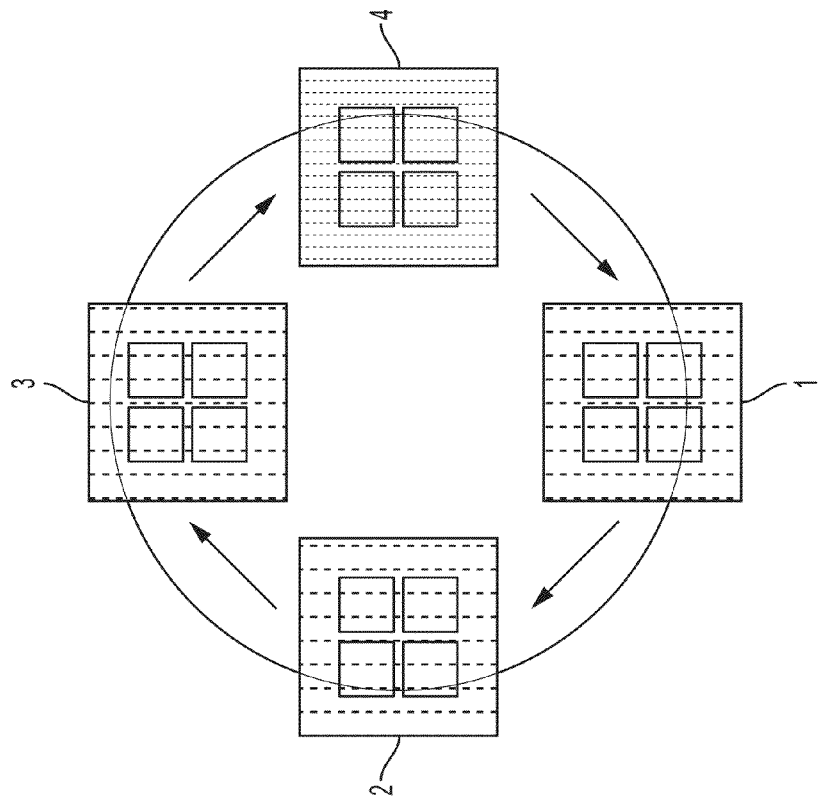
FIGS. 49A and 49B are schematic diagrams of a laser tool configuration a highly cost-effective multi-station platform that provides for high-throughput parallel processing at different stations.
Figure 49A:
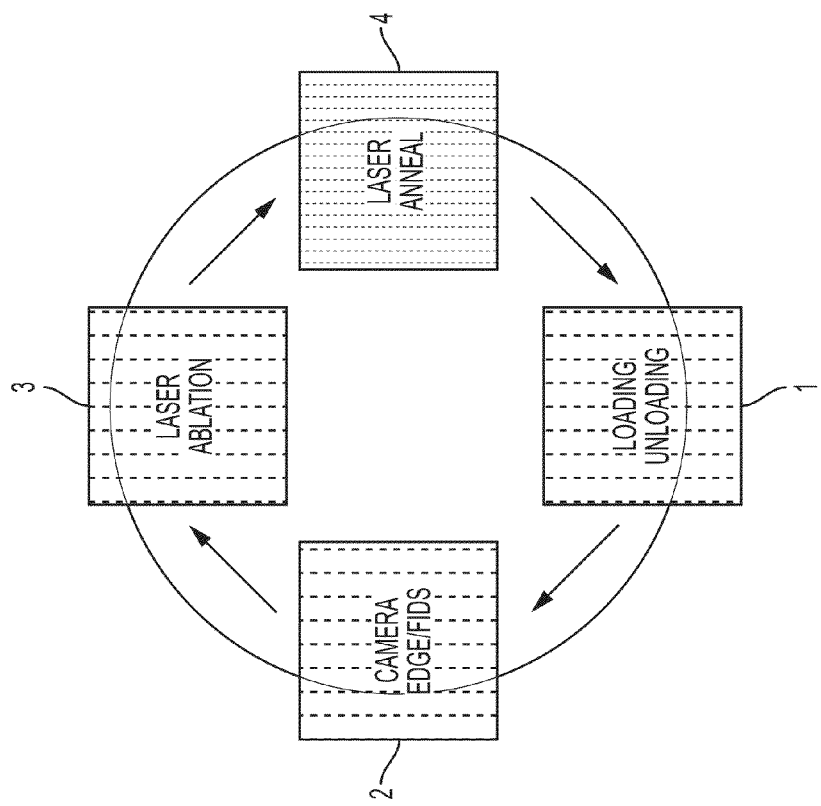

As described above, after laser ablation patterning the wafers may be annealed in a separate laser processing system (or chambers within the same laser platform) to recover the minority carrier lifetime (MCL). However, this may require an additional tool for laser annealing and result in increased production cost. A cost-effective and economical solution is to perform high-throughput annealing in the same tool as the laser ablation. FIGS. 49A and 49B describes a laser tool configuration a highly cost-effective multi-station platform that provides for high-throughput parallel processing at different stations. FIG. 49A is a diagram of a multi-station substrate laser processing tool and FIG. 49B is a diagram of the tool of FIG. 49A holding multi-wafers. FIGS. 49A and 49B show the configuration of a tool having four stations although stations may be added or subtracted. The wafer is rotated from one chuck to another where a different step of the ablation/annealing process is carried out. As shown in FIGS. 49A and 49B, the wafer is loaded in station 1, moved to station 2 for fiducial detection for accuracy of laser ablation patterning and aligned laser annealing. The laser ablation is carried out in station 3 followed by annealing in station 4. It should be noted that this scheme provides for parallel processing on different chucks, the throughput being controlled by the slowest process in this sequence. To improve the throughput the number of wafers on the chuck can be increased with a concurrent increase in the laser ablation and laser annealing to multi-wafer capability. FIG. 49B shows such an embodiment having four wafers per chuck.

Figure 50:
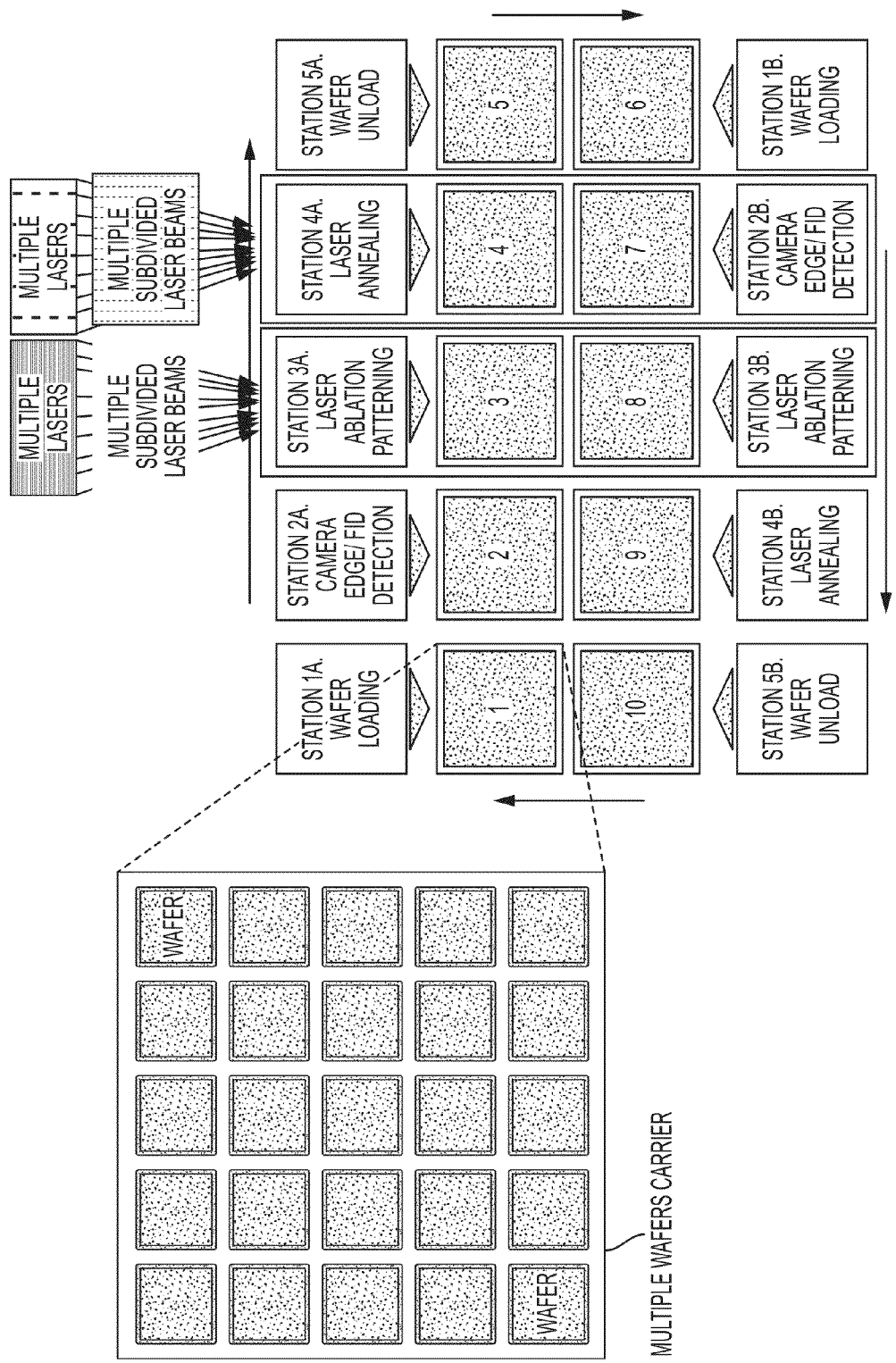
FIG. 50 is a schematic diagram of a high throughput laser ablation laser annealing system.

FIG. 50 is a schematic diagram of a high throughput laser ablation laser annealing system. Additional wafers may be processed by adjusting the wafer tray in the parallel processing tool of FIG. 50. As shown, the laser ablation and laser annealing systems have a corresponding number of beams which may be calculated as the optimal cost effective selection of the number lasers and the laser beam subdivision from each laser.

Figure 51:
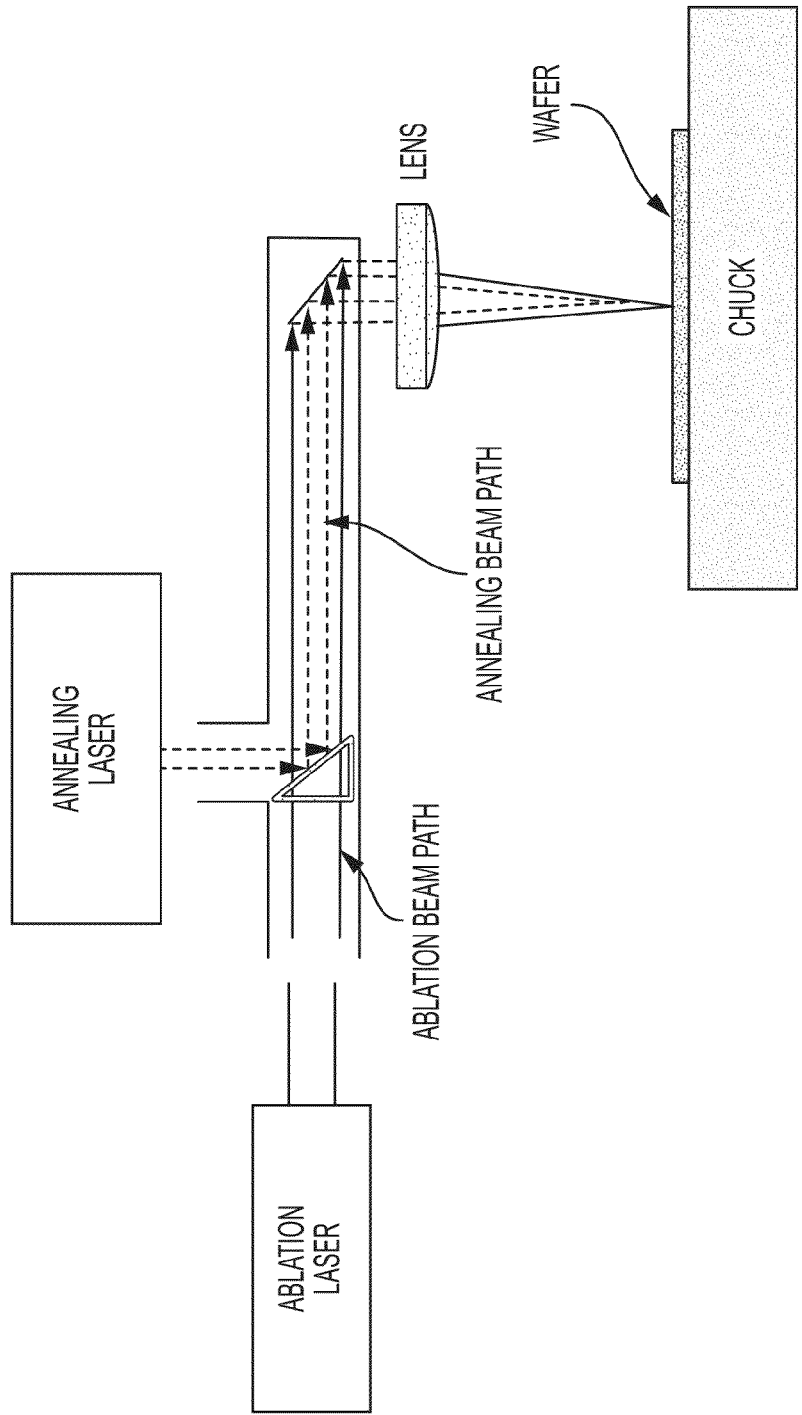
FIG. 51 is a schematic diagram outlining same station laser ablation and corresponding laser annealing using collinear (coaxial) laser beams.

In another embodiment, laser ablation and corresponding laser annealing may be performed in the same station using collinear (coaxial) laser beams. In other words, the laser ablation and laser annealing beams are supplied to the same station thus reducing the foot print and the cost of the laser system while providing a high process throughput. In this embodiment, the laser beams from the ablation laser and annealing laser are formed collinear or coaxial using suitable optics before reaching the scanner so the laser spots from the two lasers are continuously aligned as the beams scan the wafer. Further, laser pulse triggering may be synchronized for the two lasers using an external trigger from the system electronics to trigger pulses in both lasers. This approach is highly suitable for the spot-in-spot patterning described earlier. FIG. 51 is a schematic diagram outlining same station laser ablation and corresponding laser annealing using collinear (coaxial) laser beams. A picoseconds (ablation laser) laser based ablation of transparent passivation layers in the presence of a nanoseconds (annealing laser) laser beam incident on the wafer reduces the formation of amorphous silicon and increase the ablation quality.

Figure 52:
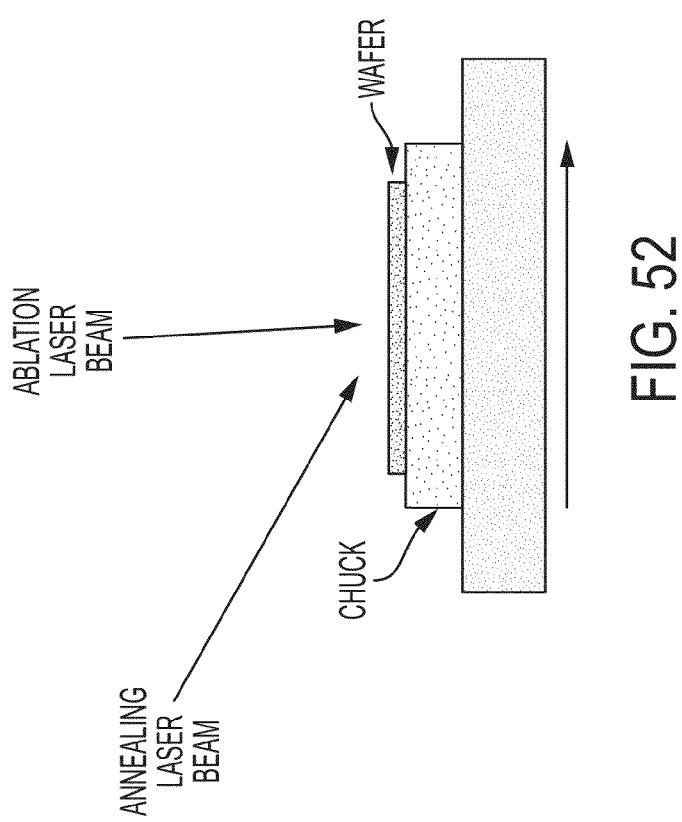
FIG. 52 is a schematic diagram showing a same station ablation and annealing using separate laser beams.

In yet another embodiment, laser ablation and corresponding laser annealing may be performed in the same station using collinear separate laser beams. FIG. 52 is a schematic diagram showing a same station ablation and annealing using separate laser beams. Specifically, FIG. 52 is a schematic diagram showing a separate annealing laser beam incident on the area of the wafer that is undergoing patterning by the ablation laser beam. Again, the ablation pulse and the annealing pulse may be synchronized to be simultaneously incident on the wafer. To reduce the alignment accuracy requirement the annealing beam spot may be much wider (oversized) as compared the ablation beam spot. As mentioned earlier, the presence of a nanoseconds annealing beam (annealing laser) during ablation by a picoseconds pulse beam (ablation laser) improves the quality of ablation and reduced the MCL loss.

Figure 53:
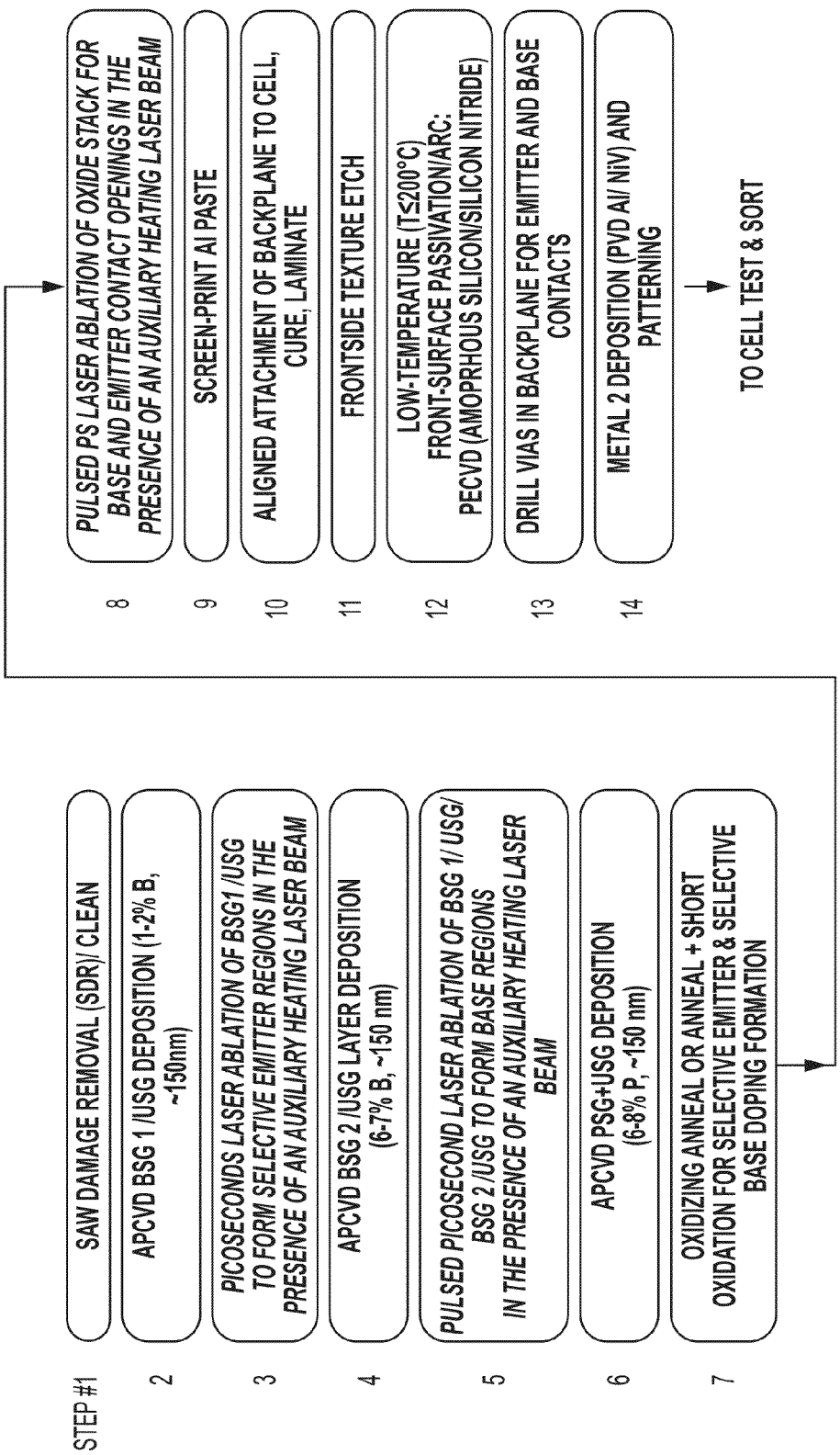
FIG. 53 is a process flow for the formation of a back contact back junction solar cell showing oxide ablation carried out in the presence of a heating beam.

FIG. 53 is a process flow for the formation of a back contact back junction solar cell showing oxide ablation carried out in the presence of a heating beam (shown in steps 3, 5, and 8 of FIG. 53) such as that provided by the tool shown in FIG. 52. Importantly, the heating beam may be incident from the same beam path or separate one.

Figure 54:
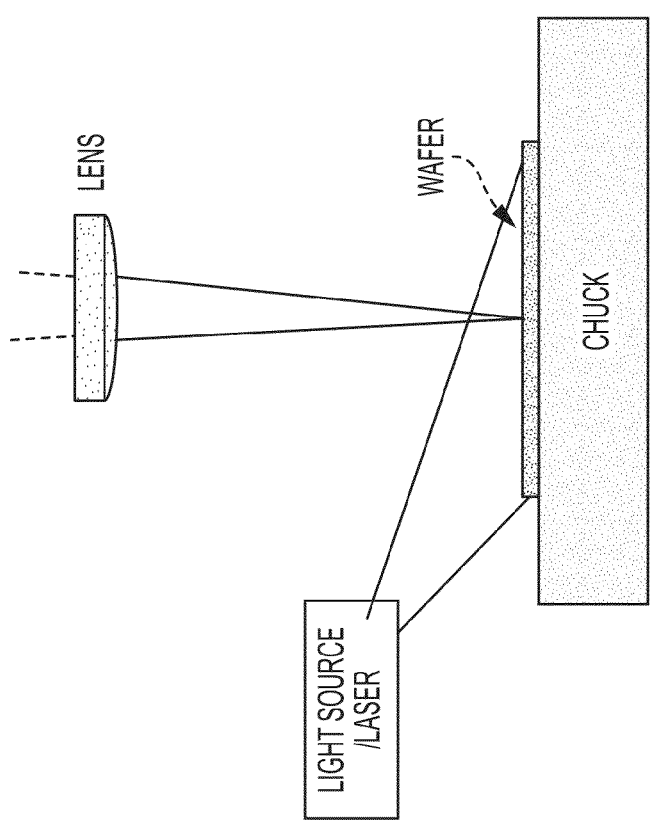
FIG. 54 is a schematic diagram showing a same station ablation and annealing using wafer heating.

In another embodiment, the wafer may be simultaneously heated while carrying out laser ablation to reduce and in some instances prevent the formation of crystalline damage (e.g., amorphous silicon and/or nanocrystalline silicon) in the laser-ablated spot. This may be due to the increased efficiency of silicon evaporation and resulting improved ablation quality of simultaneous wafer heating as well as increased cooling time for any molten silicon remaining on the wafer. A laser or a radiant heat source such as an arc lamp may be used for this purpose. To limit the heat penetration in the wafer the lamp may be selected to have light output mostly in the green or UV region of the spectrum and also may be pulsed. The heating area may be as large as the area of the wafer. FIG. 54 is a schematic diagram showing a same station ablation and annealing using wafer heating. Specifically, FIG. 54 is a schematic diagram showing simultaneous wafer heating during on the area of the wafer that is undergoing patterning by the ablation laser beam.

Figure 55:
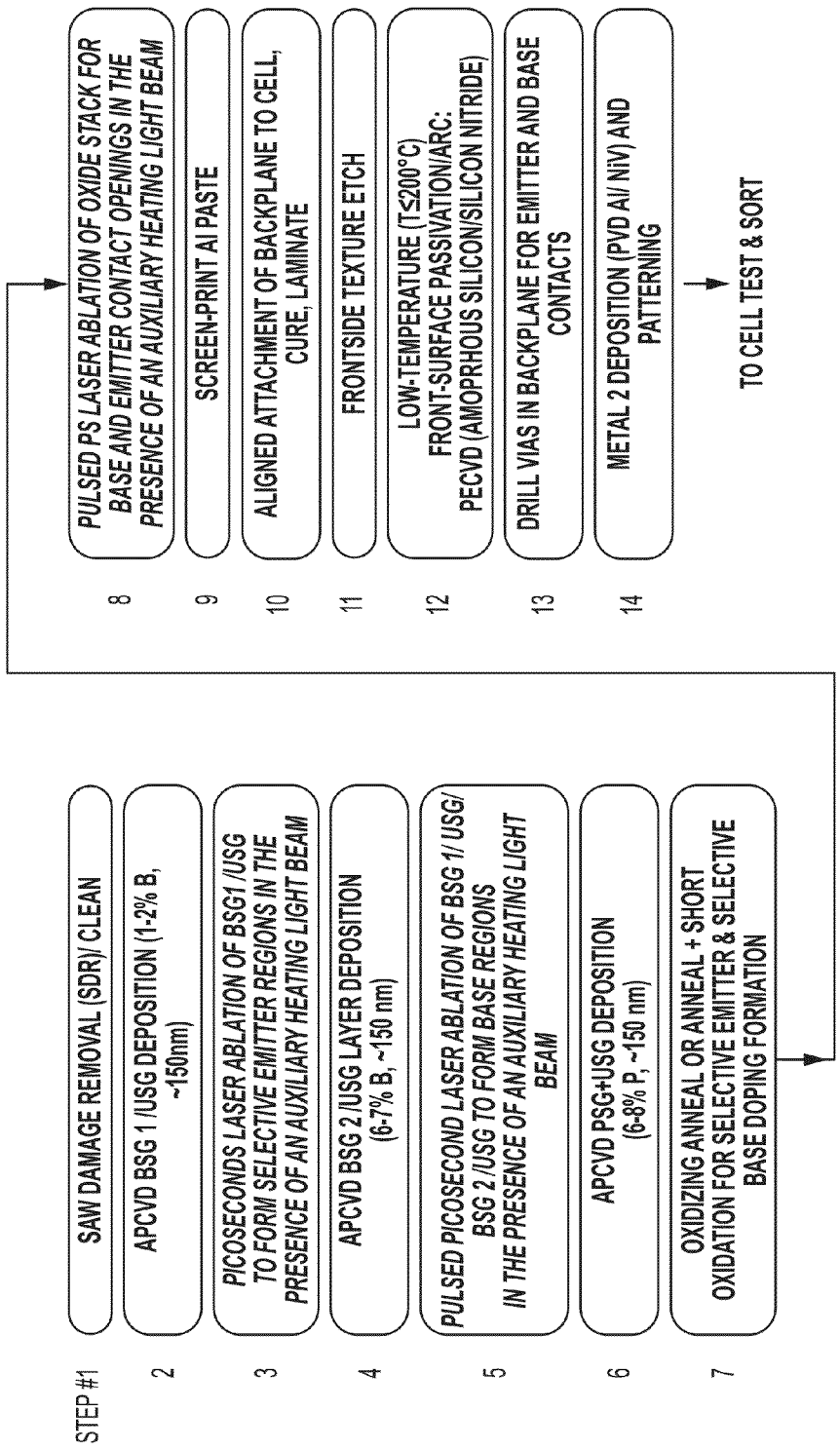
FIG. 55 is a process flow for the formation of a back contact back junction solar cell showing oxide ablation carried out in the presence of a heating light.

FIG. 55 is a process flow for the formation of a back contact back junction solar cell showing oxide ablation carried out in the presence of a heating light (shown in steps 3, 5, and 8 of FIG. 55) such as that provided by the tool shown in FIG. 54.

Figure 56:
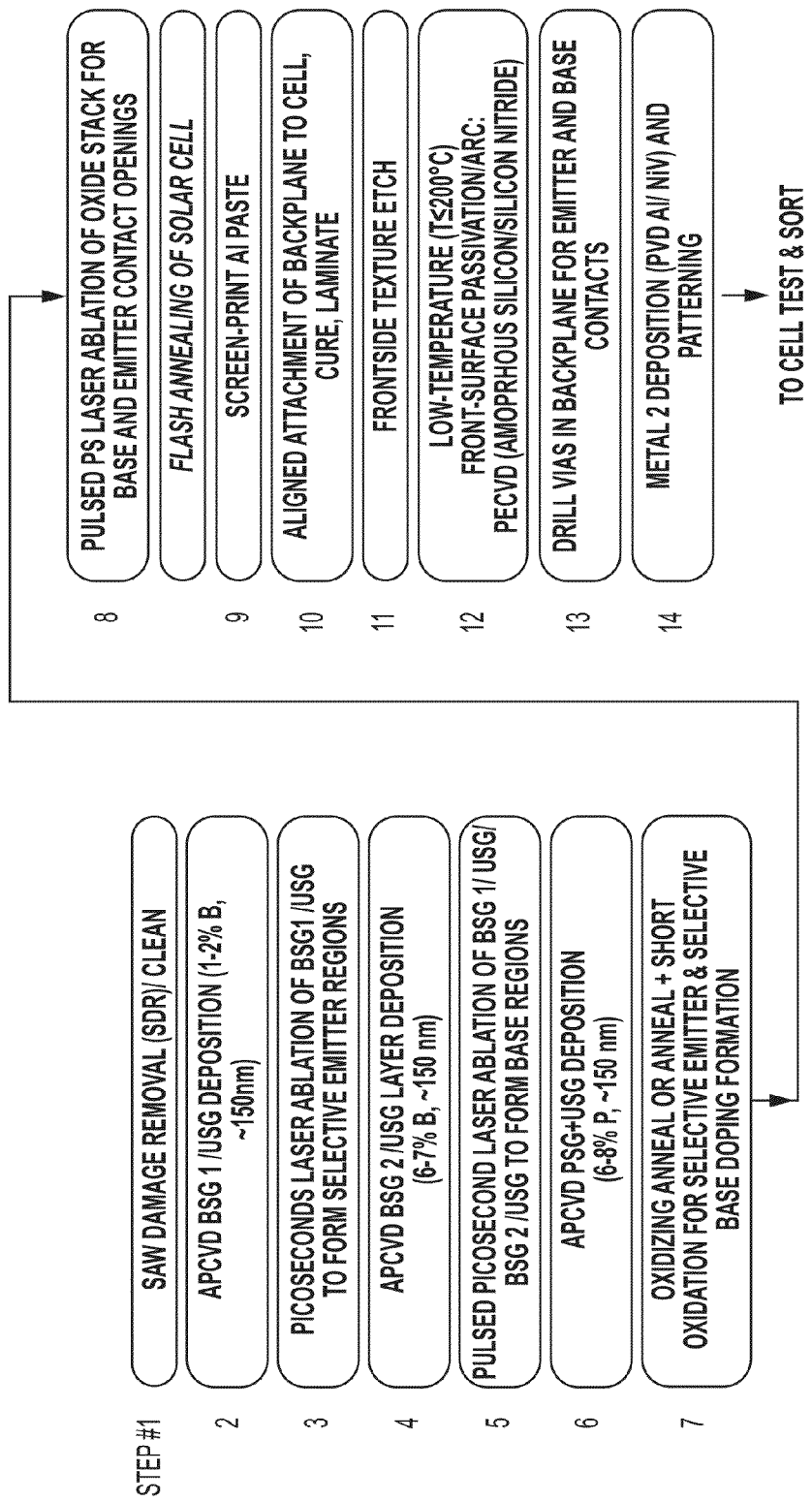
FIG. 56 is a process flow for the formation of a back contact back junction solar cell using flash annealing.

In another embodiment, the wafer may be flash heated for annealing post ablation. Thin layers of amorphous silicon (and/or nanocrystalline silicon) on top of mono-crystalline silicon have been found to melt at lower temperature and then solidify into mono-crystalline layers by liquid-phase epitaxy (or convert into mono-crystalline layers by solid-phase epitaxy) on a mono-crystalline substrate. Thus, flash annealing of the whole wafer after ablation to a temperature above the melting of amorphous silicon (or above the threshold temperature required for solid phase epitaxy) and lower than the melting of crystalline silicon may produce surface layers that would be well passivated and have reduced defects. Further, at even lower temperatures (e.g., below the melting point of damaged silicon) the amorphous and/or nanocrystalline silicon may become mono-crystalline by solid phase epitaxy. Again, for this application lamps producing radiation in the green to UV wavelength may be used. Ideally, this flash annealing may be carried out in a separate station in a multi-station system, such as those depicted in FIGS. 49 and 50. And with a suitable hardware modification the annealing may be performed in the same station as the laser ablation without any loss of wafer throughput. FIG. 56 is a process flow for the formation of a back contact back junction solar cell using flash annealing (shown after step 8 in FIG. 56) of a solar cell as described above.

Importantly, the annealing processes disclosed herein may be sub-melt annealing—in other words annealing below the semiconductor substrate boiling point. The selective laser ablation of transparent films (e.g., silicon oxide or aluminum oxide) using laser ablation for use in manufacturing back junction, back contact cells, is provided above. Further, the use of supplementary/auxiliary heating of silicon substrates after or during this laser ablation to reduce or eliminate the effects of laser ablation damage are also provided. Heating the wafer during laser ablation presents advantages that significantly reduce laser damage to the wafer (e.g., silicon substrate). The nature of supplementary/auxiliary heating suitable for annealing out the laser damage from ablation processes such that the minority carrier lifetime is maximized leading to a high efficiency of solar cell are further detailed herein. And the advantages of sub-melt annealing (i.e., annealing below the melting point for bulk silicon) are highlighted.

Embodiments, including high-throughput and inexpensive hardware configurations and the integration of annealing steps outlined in exemplary process flows, for annealing laser during or after the ablation are described in FIGS. 40A through 56. Below additional laser parameter aspects are considered to maximize the annealing benefits without adverse effects on other properties of the solar cell.

Integration of laser annealing in the fabrication of exemplary back contact back junction solar cells are described with reference to FIGS. 36, 46, 47, 48, 53, 55, and 56. In some instances it is important that the laser anneal be carried out without disturbing, physically or chemically, the various layers which may be present around the ablation spot. For example, too high laser power during annealing can evaporate silicon from contact, redistribute the dopant, and cause additional crystalline defects. Also the dielectric around the ablation could be cracked, wrinkled, and/or lifted up causing a loss of passivation of the silicon/dielectric interface. Further, as shown in the exemplary process flows provided herein, the silicon surface may be covered with a dielectric film that is either boron or phosphorous doped. In some instances, extensive melting or heating of the underlying silicon may result in the undesired doping of the underlying silicon with the dopant of the overlying film which may adversely affect the solar cell performance.

To minimize or prevent adverse effect to the layers surrounding the ablation spot the annealing beam may be highly aligned to the ablation spot and pattern (i.e., not extend beyond the ablation spot). This alignment may be relaxed if the part of the beam falling outside of the ablation spot is of such low intensity that no doping or disturbance of layers takes place. Thus, appropriate laser fluence and the fluence distribution in the laser beam is important.

And as noted previously, a key aspect of laser annealing is the recrystallization of amorphous silicon (in the case of a silicon solar cell wafer) left behind after ultra-short pulse laser ablation. Melting and subsequent crystallization of this amorphous silicon layer forms mono-crystalline silicon that is epitaxially aligned to the mono-crystalline silicon bulk. Thus, there are little or no recombination sites formed and the original high minority carrier lifetime is maintained. However, the thin layers of amorphous silicon present may melt at several hundred degrees lower temperature than the bulk silicon. Therefore using a laser fluence that is below the melting of bulk silicon but melts the amorphous silicon results in the conversion of amorphous silicon into an epitaxial mono-crystalline silicon while the laser fluence is not high enough to cause substantial doping and disturbance of the silicon and the dielectric layers. This sub-melt annealing, below the melting point of the bulk silicon, provides process margin improving the manufacturability of laser annealing.

Back junction back contact solar cells may have alternating or distributed base and emitter regions that may be patterned using laser ablation of transparent and passivating dielectrics such as silicon oxide or aluminum oxide. The use of laser permits the dimensions of the base and emitter regions to be minimized and lead to high cell efficiency. To minimize the damage and heat penetration into the silicon the ablation of transparent films may be performed using ultra-short pulse lasers (e.g., picoseconds or femtoseconds pulse length). The use of shorter wavelength (e.g., UV as compared to IR) further limits the heat affected zone in the silicon substrate however there still may be laser damage such that the minority carrier lifetime is reduced.

The removal of transparent dielectrics by the picoseconds laser beam takes place by the explosive evaporation of silicon, the vapors cracking and dislodging the oxide film. Around the ablated spot, the oxide film is lifted up causing a loss of passivation. Vapors of silicon not able to escape because of low laser power around the edge of the Gaussian beam, may condense back into an amorphous silicon layer further causing a loss of passivation. In some instances, the high laser fluence in the center of a Gaussian beam causes melting and rippling of the silicon layer that is difficult to passivate. These effects may be observed in the photographs of FIGS. 38A to 39D.

FIG. 51 is a schematic diagram of a system for obtaining high laser annealing spot to laser ablation spot alignment. FIGS. 52 and 54 show a laser annealing spot larger than the ablation spot. In cases where the annealing spot is larger than the ablation spot, the annealing laser fluence may be selected to be lower than the fluence that could melt the bulk silicon. In other words, the annealing fluence should be low enough (i.e., sub-melting) so there is no undesired doping of silicon from overlying dielectric and the silicon/passivation layer interface is not degraded. Thus, in some cases sub-melt annealing (and the resulting prevention of adverse effects) may allow for simplified hardware configurations.

The maximum permissible laser fluence for a specific solar cell structure may obtained by scanning with the annealing laser a control solar cell substrate containing all the appropriate device layers but without ablation, and while ensuring there is no loss of minority carrier lifetime or undesired dopant redistribution.

Figure 57:
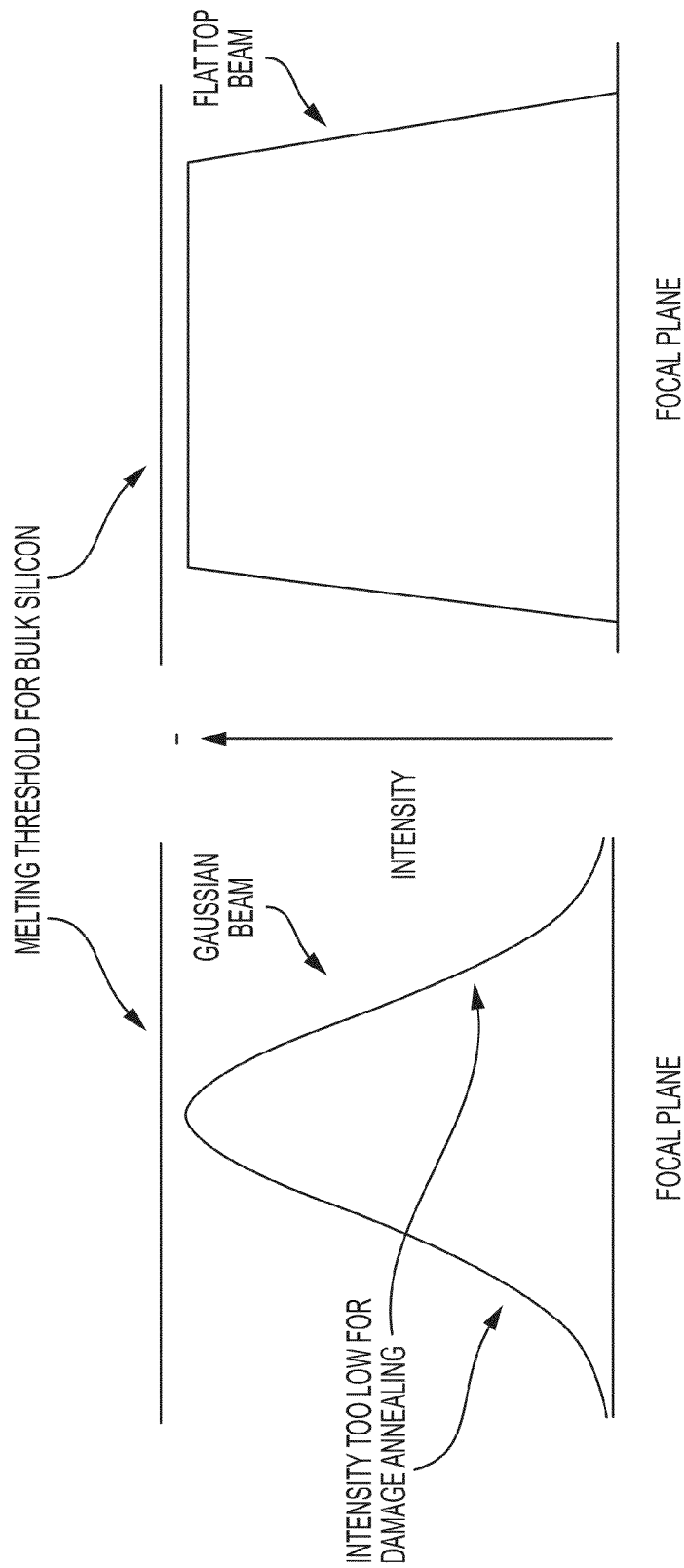
FIG. 57 shows representative/idealized profiles of a Gaussian laser beam and a flat-top (top-hat) laser beam.

As a Gaussian beam has its energy peaks in the center and the fluence decays dramatically towards the beam edge, in some cases and dependent on additional cell considerations it may be difficult to prevent melting of bulk silicon while obtaining the required annealing of silicon using a Gaussian beam. In this case the use of so-called flat top or top-hat beam may be advantageous. FIG. 57 shows representative/idealized profiles of a Gaussian laser beam and a flat-top (top-hat) laser beam. For a flat-top beam the highest energy may be controlled over the whole exposure area to stay below the melting threshold for the underlying semiconductor substrate (e.g., bulk silicon) and still be high enough to anneal and also melt the amorphous silicon if needed.

An advantage of heating the wafer either with an auxiliary source, such as laser, lamps, or other means, is the reduction of ablation threshold for the dielectric film. This reduces the power required for ablation and lowers the damage introduced into silicon. Additionally, for a heated wafer the cool down is slowed even though the ablation laser pulse is ultra-short (e.g., picoseconds)—this allows for the silicon layer that is melted or evaporated to condense back epitaxially into a mono-crystalline silicon film without the generation of recombination sites for minority carrier absorption.

In operation, various embodiments include: the application of annealing laser fluence that is below what is needed to melt the underlying semiconductor substrate (e.g., bulk silicon), referred to as sub-melt annealing, but high enough to anneal the ablation laser damage. In some instances the laser fluence may be high enough to melt the amorphous silicon layer but still not melt the bulk silicon; the application of flat top annealing laser beam profile to maximize laser annealing benefits; the application of heat during laser ablation so the fluence requirements for ablation laser are reduced thereby reducing the damage introduced into silicon; the application of heat during laser ablation so the cooling rates on the silicon surface are reduced and the silicon may condense back into a mono-crystalline silicon structure; and applying auxiliary heating using a laser, lamp, resistance heating, or other known method.

Those with ordinary skill in the art will recognize that the disclosed embodiments have relevance to a wide variety of areas in addition to those specific examples described above. The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

It is intended that all such additional systems, methods, features, and advantages that are included within this description be within the scope of the claims.

What is claimed is:

1. A method for making a patterned electrically insulating layer on a semiconductor substrate, said method comprising:
   providing a semiconductor substrate having n-type doping;
   depositing a first layer of borosilicate glass or a borosilicate/undoped glass stack on said semiconductor substrate;
   selectively ablating said first layer of borosilicate glass or borosilicate/undoped glass stack with a pulsed laser in a first emitter ablation pattern comprising a plurality of first ablation spots;
   annealing said first ablation spots;
   depositing a second layer of borosilicate glass or a borosilicate/undoped glass stack on said first layer of borosilicate glass or a borosilicate/undoped glass stack;
   selectively ablating said second layer of borosilicate glass or borosilicate/undoped glass stack with a pulsed laser in a second base ablation pattern comprising a plurality of second ablation spots; and,
   annealing said second ablation spots.

2. The method of claim 1, wherein said annealing of said first ablation spots and said annealing of said second ablation spots are formed as overlapping ablation spots.

3. The method of claim 1, wherein said annealing of said first ablation spots and said annealing of said second ablation spots are formed as non-overlapping ablation spots.

4. The method of claim 1, wherein said annealing of said first ablation spots and said annealing of said second ablation spots anneals the wafer surface.

5. The method of claim 1, wherein said annealing of said first ablation spots and said annealing of said second ablation spots melts a thickness of the surface of the wafer.

6. The method of claim 1, wherein said annealing of said first ablation spots forms the high-low selective emitter junction.

7. The method of claim 1, wherein said annealing of said second ablation spots forms the high-low selective base junction.

8. The method of claim 1, wherein said ablation is performed using a pulsed picoseconds laser and said annealing is performed using pulsed nanosecond laser.

9. The method of claim 1, wherein said semiconductor substrate is a crystalline silicon substrate.

* * * * *